(12) United States Patent
Sasagawa

(10) Patent No.: US 7,715,085 B2
(45) Date of Patent: May 11, 2010

(54) ELECTROMECHANICAL SYSTEM HAVING A DIELECTRIC MOVABLE MEMBRANE AND A MIRROR

(75) Inventor: Teruo Sasagawa, Los Gatos, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 11/746,513

(22) Filed: May 9, 2007

(65) Prior Publication Data

US 2008/0278788 A1 Nov. 13, 2008

(51) Int. Cl.
*G02B 26/00* (2006.01)
*G02B 26/08* (2006.01)
*G02F 1/29* (2006.01)

(52) U.S. Cl. .................... 359/290; 359/225; 359/318
(58) Field of Classification Search ......... 359/290–292, 359/245, 223–225, 198, 260–263, 298, 301–303, 359/317–318, 295
See application file for complete search history.

(56) References Cited

U.S. PATENT DOCUMENTS

| | | | |
|---|---|---|---|
| 3,728,030 | A | 4/1973 | Hawes |
| 3,955,190 | A | 5/1976 | Teraishi |
| 4,403,248 | A | 9/1983 | te Velde |
| 4,441,791 | A | 4/1984 | Hornbeck |
| 4,786,128 | A | 11/1988 | Birnbach |
| 4,859,060 | A * | 8/1989 | Katagiri et al. .............. 356/454 |
| 4,954,789 | A | 9/1990 | Sampsell |
| 4,956,619 | A | 9/1990 | Hornbeck |
| 4,982,184 | A | 1/1991 | Kirkwood |
| 5,022,745 | A | 6/1991 | Zayhowski et al. |
| 5,028,939 | A | 7/1991 | Hornbeck et al. |
| 5,091,983 | A | 2/1992 | Lukosz |
| 5,096,279 | A | 3/1992 | Hornbeck et al. |
| 5,170,283 | A | 12/1992 | O'Brien et al. |
| 5,315,370 | A | 5/1994 | Bulow |
| 5,381,232 | A | 1/1995 | van Wijk |
| 5,452,138 | A | 9/1995 | Mignardi et al. |
| 5,471,341 | A | 11/1995 | Warde et al. |

(Continued)

FOREIGN PATENT DOCUMENTS

DE 10228946 1/2004

(Continued)

OTHER PUBLICATIONS

Feenstra et al., Electrowetting displays, Liquivista BV, 16 pp., Jan. 2006.

(Continued)

*Primary Examiner*—Scott J Sugarman
*Assistant Examiner*—Dawayne A Pinkney
(74) *Attorney, Agent, or Firm*—Knobbe Martens Olson & Bear LLP

(57) ABSTRACT

A microelectromechanical (MEMS) device includes at least one electrode, a first reflective layer, and a movable reflective element. The movable reflective element includes a flexible dielectric layer and a second reflective layer mechanically coupled to the flexible dielectric layer. The flexible dielectric layer flexes in response to voltages applied to the at least one electrode to move the reflective element in a direction generally perpendicular to the first reflective layer.

28 Claims, 39 Drawing Sheets

U.S. PATENT DOCUMENTS

| | | | |
|---|---|---|---|
| 5,526,172 A | 6/1996 | Kanack | |
| 5,559,358 A | 9/1996 | Burns et al. | |
| 5,636,052 A | 6/1997 | Arney et al. | |
| 5,646,729 A | 7/1997 | Koskinen et al. | |
| 5,646,768 A | 7/1997 | Kaeiyama | |
| 5,661,592 A | 8/1997 | Bornstein et al. | |
| 5,665,997 A | 9/1997 | Weaver et al. | |
| 5,710,656 A | 1/1998 | Goossen | |
| 5,734,177 A | 3/1998 | Sakamoto | |
| 5,786,927 A | 7/1998 | Greywall et al. | |
| 5,808,781 A | 9/1998 | Arney et al. | |
| 5,818,095 A | 10/1998 | Sampsell | |
| 5,825,528 A | 10/1998 | Goossen | |
| 5,835,255 A | 11/1998 | Miles | |
| 5,838,484 A | 11/1998 | Goossen et al. | |
| 5,867,302 A | 2/1999 | Fleming | |
| 5,914,804 A | 6/1999 | Goossen | |
| 5,920,418 A | 7/1999 | Shiono et al. | |
| 6,028,689 A | 2/2000 | Michalicek et al. | |
| 6,040,937 A | 3/2000 | Miles | |
| 6,055,090 A | 4/2000 | Miles | |
| 6,262,697 B1 | 7/2001 | Stephenson | |
| 6,327,071 B1 | 12/2001 | Kimura | |
| 6,356,378 B1 | 3/2002 | Huibers | |
| 6,384,952 B1 | 5/2002 | Clark et al. | |
| 6,433,917 B1 | 8/2002 | Mei et al. | |
| 6,438,282 B1 | 8/2002 | Takeda et al. | |
| 6,452,712 B2 | 9/2002 | Atobe et al. | |
| 6,466,354 B1 | 10/2002 | Gudeman | |
| 6,556,338 B2 | 4/2003 | Han et al. | |
| 6,574,033 B1 | 6/2003 | Chui et al. | |
| 6,597,490 B2 | 7/2003 | Tayebati | |
| 6,608,268 B1 | 8/2003 | Goldsmith | |
| 6,632,698 B2 | 10/2003 | Ives | |
| 6,650,455 B2 | 11/2003 | Miles | |
| 6,657,832 B2 | 12/2003 | Williams et al. | |
| 6,661,561 B2 | 12/2003 | Fitzpatrick et al. | |
| 6,674,562 B1 | 1/2004 | Miles | |
| 6,680,792 B2 | 1/2004 | Miles | |
| 6,698,295 B1 | 3/2004 | Sherrer | |
| 6,710,908 B2 | 3/2004 | Miles et al. | |
| 6,794,119 B2 | 9/2004 | Miles | |
| 6,813,059 B2 | 11/2004 | Hunter et al. | |
| 6,841,081 B2 | 1/2005 | Chang et al. | |
| 6,844,959 B2 | 1/2005 | Huibers et al. | |
| 6,867,896 B2 | 3/2005 | Miles | |
| 6,870,654 B2 | 3/2005 | Lin et al. | |
| 6,882,458 B2 | 4/2005 | Lin et al. | |
| 6,882,461 B1 | 4/2005 | Tsai et al. | |
| 6,912,022 B2 | 6/2005 | Lin et al. | |
| 6,940,630 B2 | 9/2005 | Xie | |
| 6,947,200 B2 | 9/2005 | Huibers | |
| 6,952,303 B2 | 10/2005 | Lin et al. | |
| 6,958,847 B2 | 10/2005 | Lin | |
| 6,980,350 B2 | 12/2005 | Hung et al. | |
| 6,982,820 B2 | 1/2006 | Tsai | |
| 7,006,272 B2 | 2/2006 | Tsai | |
| 7,027,204 B2 | 4/2006 | Trisnadi et al. | |
| 7,034,981 B2 | 4/2006 | Makigaki | |
| 7,046,422 B2 | 5/2006 | Kimura et al. | |
| 7,119,945 B2 | 10/2006 | Kothari et al. | |
| 7,123,216 B1 | 10/2006 | Miles | |
| 7,126,738 B2 | 10/2006 | Miles | |
| 7,130,104 B2 | 10/2006 | Cummings | |
| 7,184,195 B2 | 2/2007 | Yang | |
| 7,184,202 B2 | 2/2007 | Miles et al. | |
| 7,198,973 B2 | 4/2007 | Lin et al. | |
| 7,221,495 B2 | 5/2007 | Miles et al. | |
| 7,236,284 B2 | 6/2007 | Miles | |
| 7,321,457 B2 | 1/2008 | Heald | |
| 7,372,613 B2 | 5/2008 | Chui et al. | |
| 7,372,619 B2 | 5/2008 | Miles | |
| 7,385,744 B2 | 6/2008 | Kogut et al. | |
| 7,385,762 B2 | 6/2008 | Cummings | |
| 7,417,783 B2 | 8/2008 | Chui et al. | |
| 7,527,998 B2 * | 5/2009 | Tung et al. | 438/53 |
| 2001/0003487 A1 | 6/2001 | Miles | |
| 2001/0028503 A1 | 10/2001 | Flanders et al. | |
| 2001/0043171 A1 | 11/2001 | Van Gorkom et al. | |
| 2002/0015215 A1 | 2/2002 | Miles | |
| 2002/0024711 A1 | 2/2002 | Miles | |
| 2002/0054424 A1 | 5/2002 | Miles | |
| 2002/0070931 A1 | 6/2002 | Ishikawa | |
| 2002/0075555 A1 | 6/2002 | Miles | |
| 2002/0126364 A1 | 9/2002 | Miles | |
| 2002/0146200 A1 | 10/2002 | Kurdle et al. | |
| 2002/0149828 A1 | 10/2002 | Miles | |
| 2003/0016428 A1 | 1/2003 | Kato et al. | |
| 2003/0035196 A1 | 2/2003 | Walker | |
| 2003/0043157 A1 | 3/2003 | Miles | |
| 2003/0053078 A1 | 3/2003 | Missey et al. | |
| 2003/0072070 A1 | 4/2003 | Miles | |
| 2003/0202265 A1 | 10/2003 | Reboa et al. | |
| 2003/0202266 A1 | 10/2003 | Ring et al. | |
| 2004/0008396 A1 | 1/2004 | Stappaerts | |
| 2004/0008438 A1 | 1/2004 | Sato | |
| 2004/0027671 A1 | 2/2004 | Wu et al. | |
| 2004/0027701 A1 | 2/2004 | Ishikawa | |
| 2004/0043552 A1 | 3/2004 | Strumpell et al. | |
| 2004/0051929 A1 | 3/2004 | Sampsell et al. | |
| 2004/0058532 A1 | 3/2004 | Miles et al. | |
| 2004/0075967 A1 | 4/2004 | Lynch et al. | |
| 2004/0076802 A1 | 4/2004 | Tompkin et al. | |
| 2004/0080035 A1 | 4/2004 | Delapierre | |
| 2004/0100594 A1 | 5/2004 | Huibers et al. | |
| 2004/0100677 A1 | 5/2004 | Huibers et al. | |
| 2004/0125281 A1 | 7/2004 | Lin et al. | |
| 2004/0125282 A1 | 7/2004 | Lin et al. | |
| 2004/0145811 A1 | 7/2004 | Lin et al. | |
| 2004/0147198 A1 | 7/2004 | Lin et al. | |
| 2004/0175577 A1 | 9/2004 | Lin et al. | |
| 2004/0184134 A1 | 9/2004 | Makigaki | |
| 2004/0207897 A1 | 10/2004 | Lin | |
| 2004/0209195 A1 | 10/2004 | Lin | |
| 2004/0217919 A1 | 11/2004 | Pichi et al. | |
| 2004/0218251 A1 | 11/2004 | Piehl et al. | |
| 2004/0240032 A1 | 12/2004 | Miles | |
| 2005/0002082 A1 | 1/2005 | Miles | |
| 2005/0003667 A1 | 1/2005 | Lin et al. | |
| 2005/0024557 A1 | 2/2005 | Lin | |
| 2005/0035699 A1 | 2/2005 | Tsai | |
| 2005/0036095 A1 | 2/2005 | Yeh et al. | |
| 2005/0046919 A1 | 3/2005 | Taguchi et al. | |
| 2005/0046922 A1 | 3/2005 | Lin et al. | |
| 2005/0046948 A1 | 3/2005 | Lin | |
| 2005/0068627 A1 | 3/2005 | Nakamura et al. | |
| 2005/0078348 A1 | 4/2005 | Lin | |
| 2005/0168849 A1 | 8/2005 | Lin | |
| 2005/0179378 A1 | 8/2005 | Oooka et al. | |
| 2005/0195462 A1 | 9/2005 | Lin | |
| 2005/0249966 A1 | 11/2005 | Tung et al. | |
| 2006/0007517 A1 | 1/2006 | Tsai | |
| 2006/0017379 A1 | 1/2006 | Su et al. | |
| 2006/0017689 A1 | 1/2006 | Faase et al. | |
| 2006/0024880 A1 | 2/2006 | Chui et al. | |
| 2006/0065940 A1 | 3/2006 | Kothari | |
| 2006/0066599 A1 | 3/2006 | Chui | |
| 2006/0066640 A1 | 3/2006 | Kothari et al. | |
| 2006/0066641 A1 | 3/2006 | Gally et al. | |
| 2006/0066926 A1 | 3/2006 | Kwak et al. | |
| 2006/0066935 A1 | 3/2006 | Cummings et al. | |
| 2006/0066936 A1 * | 3/2006 | Chui et al. | 359/291 |
| 2006/0067643 A1 | 3/2006 | Chui | |
| 2006/0067649 A1 | 3/2006 | Tung et al. | |

| | | |
|---|---|---|
| 2006/0067651 A1 | 3/2006 | Chui |
| 2006/0077152 A1 | 4/2006 | Chui et al. |
| 2006/0077155 A1 | 4/2006 | Chui et al. |
| 2006/0077156 A1 | 4/2006 | Chui et al. |
| 2006/0077507 A1 | 4/2006 | Chui et al. |
| 2006/0077508 A1 | 4/2006 | Chui et al. |
| 2006/0077515 A1 | 4/2006 | Cummings |
| 2006/0077516 A1 | 4/2006 | Kothari |
| 2006/0077518 A1 | 4/2006 | Chui et al. |
| 2006/0079048 A1 | 4/2006 | Sampsell |
| 2006/0220160 A1 | 10/2006 | Miles |
| 2006/0262380 A1 | 11/2006 | Miles |
| 2006/0268388 A1 | 11/2006 | Miles |
| 2006/0274074 A1 | 12/2006 | Miles |
| 2006/0274398 A1 | 12/2006 | Chou |
| 2007/0020948 A1 | 1/2007 | Piehl et al. |
| 2007/0040777 A1 | 2/2007 | Cummings |
| 2007/0077525 A1 | 4/2007 | Davis et al. |
| 2007/0086078 A1 | 4/2007 | Hagood et al. |
| 2007/0121118 A1 | 5/2007 | Gally et al. |
| 2007/0177247 A1 | 8/2007 | Miles |
| 2007/0194630 A1 | 8/2007 | Mingard et al. |
| 2007/0216987 A1 | 9/2007 | Hagood et al. |
| 2007/0279729 A1 | 12/2007 | Kothari et al. |
| 2007/0285761 A1 | 12/2007 | Zhong et al. |
| 2008/0003710 A1 | 1/2008 | Kogut et al. |
| 2008/0013144 A1 | 1/2008 | Chui et al. |
| 2008/0013145 A1 | 1/2008 | Chui et al. |
| 2008/0013154 A1 | 1/2008 | Chui |
| 2008/0037093 A1 | 2/2008 | Miles |
| 2008/0055705 A1 | 3/2008 | Kothari |
| 2008/0055706 A1 | 3/2008 | Chui et al. |
| 2008/0055707 A1 | 3/2008 | Kogut et al. |
| 2008/0080043 A1 | 4/2008 | Chui et al. |
| 2008/0088904 A1 | 4/2008 | Miles |
| 2008/0088910 A1 | 4/2008 | Miles |
| 2008/0088911 A1 | 4/2008 | Miles |
| 2008/0088912 A1 | 4/2008 | Miles |
| 2008/0094690 A1* | 4/2008 | Luo et al. .................. 359/318 |
| 2008/0106782 A1 | 5/2008 | Miles |
| 2008/0110855 A1 | 5/2008 | Cummings |
| 2008/0112035 A1 | 5/2008 | Cummings |
| 2008/0112036 A1 | 5/2008 | Cummings |
| 2008/0186581 A1 | 8/2008 | Bita et al. |
| 2008/0239455 A1 | 10/2008 | Kogut et al. |
| 2008/0247028 A1 | 10/2008 | Chui et al. |
| 2009/0068781 A1 | 3/2009 | Tung et al. |
| 2009/0080060 A1 | 3/2009 | Sampsell et al. |
| 2009/0135465 A1 | 5/2009 | Chui |
| 2009/0201566 A1 | 8/2009 | Kothari |
| 2009/0213450 A1 | 8/2009 | Sampsell |
| 2009/0213451 A1 | 8/2009 | Tung et al. |
| 2009/0273823 A1 | 11/2009 | Tung et al. |
| 2009/0279162 A1 | 11/2009 | Chui |

FOREIGN PATENT DOCUMENTS

| | | |
|---|---|---|
| EP | 0 668 490 | 8/1995 |
| EP | 1 122 577 | 8/2001 |
| EP | 1 227 346 | 7/2002 |
| EP | 1 275 997 | 1/2003 |
| EP | 1 473 581 | 11/2004 |
| JP | 5-49238 | 2/1993 |
| JP | 5-281479 | 10/1993 |
| JP | 11211999 | 8/1999 |
| JP | 2002-062490 | 2/2000 |
| JP | 2001-221913 | 8/2001 |
| JP | 2002-221678 | 8/2002 |
| JP | 2003-340795 | 2/2003 |
| JP | 2004-012642 | 1/2004 |
| JP | 2004-212638 | 7/2004 |
| JP | 2004-212680 | 7/2004 |
| JP | 2005 279831 | 10/2005 |
| WO | WO 99/52006 | 10/1999 |
| WO | WO 02/086582 | 10/2002 |
| WO | WO 2007/053438 | 5/2007 |
| WO | WO 2007/072998 | 6/2007 |

OTHER PUBLICATIONS

Lezec, Submicrometer dimple array based interference color field displays and sensors, Nano Lett. 7(2):329-333, Dec. 23, 2006.

Conner, "Hybrid Color Display Using Optical Interference Filter Array," SID Digest, pp. 577-580 (1993).

Jerman et al., "A Miniature Fabry-Perot Interferometer with a Corrugated Silicon Diaphragm Support", (1988).

Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. CONF. 6, Jun. 24, 1991, pp. 372-375.

Miles, Mark, W., "A New Reflective FPD Technology Using Interferometric Modulation", The Proceedings of the Society for Information Display (May 11-16, 1997).

Taii et al., "A transparent sheet display by plastic MEMS," Journal of the SID 14(8):735-741, 2006.

Office Action for U.S. Appl. No. 11/746,443, dated Mar. 5, 2009.

Kowarz et al., "Conformal grating electromechanical system (GEMS) for high-speed digital light modulation," IEEE, 568-573 (2002).

Miles, "Interferometric modulation: MOEMS as an enabling technology for high performance reflective displays," Proceedings of SPIE, vol. 4985, pp. 131-139, 2003.

Pape et al., "Characteristics of the deformable mirror device for optical information processing," Optical Engineering, 22(6):676-681, Nov.-Dec. 1983.

Longhurst, 1963, Chapter IX: Multiple Beam Interferometry, in Geometrical and Physical Optics, pp. 153-157.

Tolansky, 1948, Chapter II: Multiple-Beam Interference, in Multiple-bean Interferometry of Surfaces and Films, Oxford at the Clarendon Press, pp. 8-11.

Panitz et al., Electrostatic actuated interference filters as optical switches for projection display applications, The 12th International Conference on Solid state Sensors, Actuators and Microsystems, Jun. 8-12, 2003, pp. 580-582.

* cited by examiner

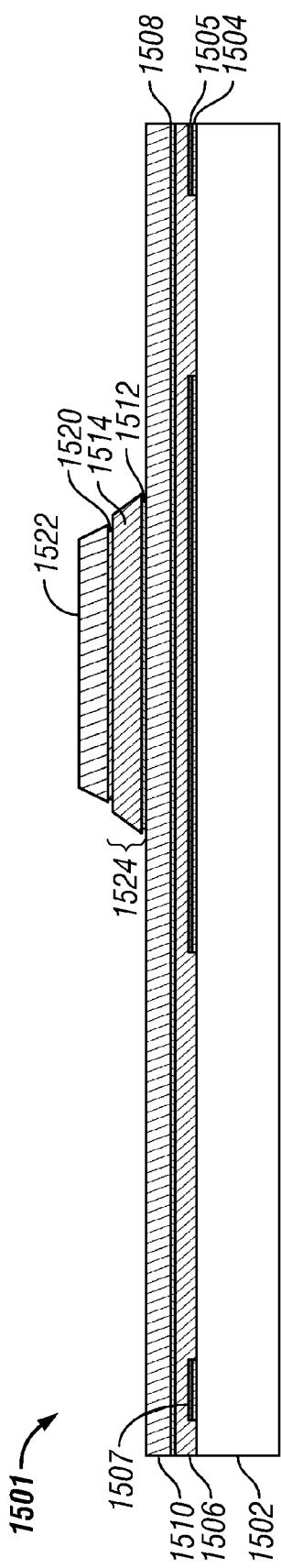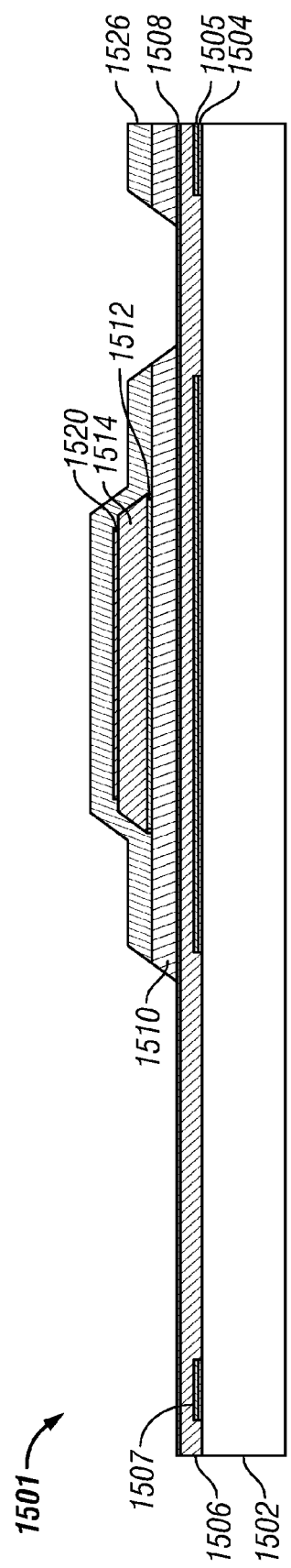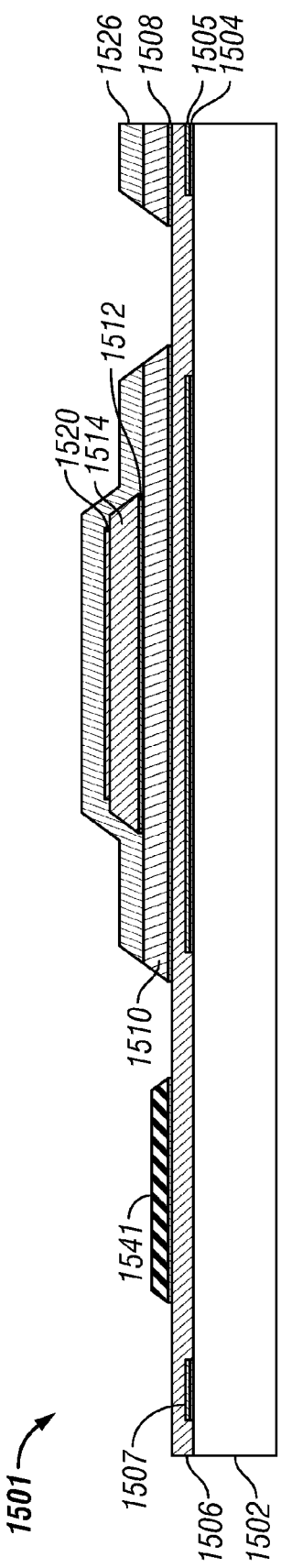

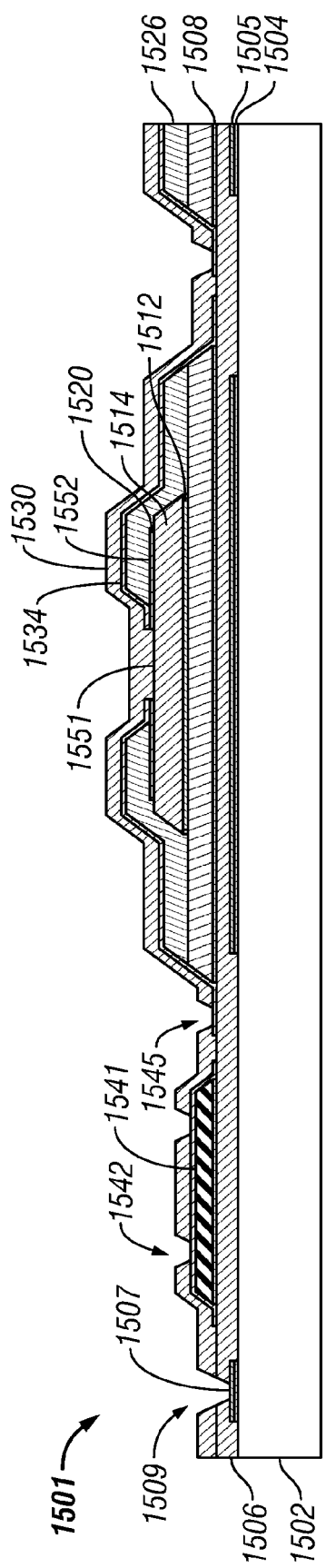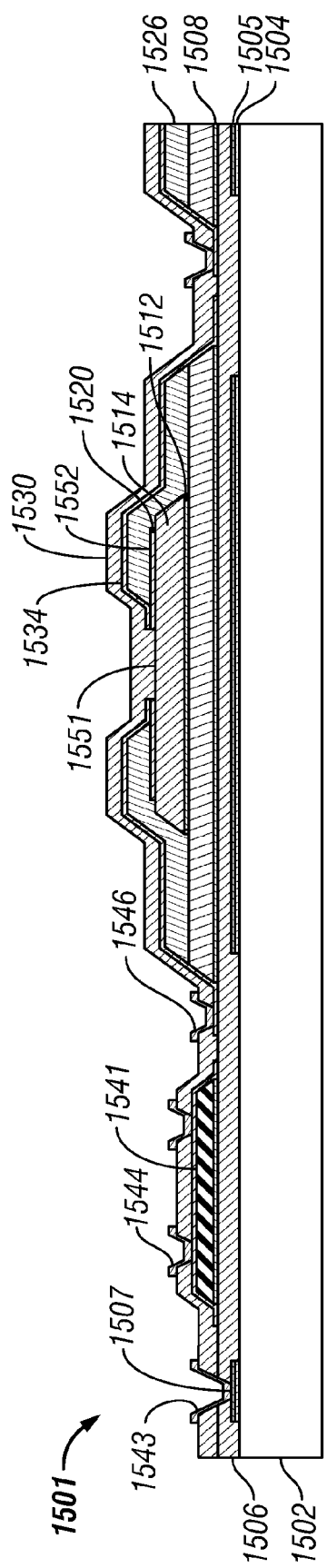
FIG. 15I
FIG. 15J

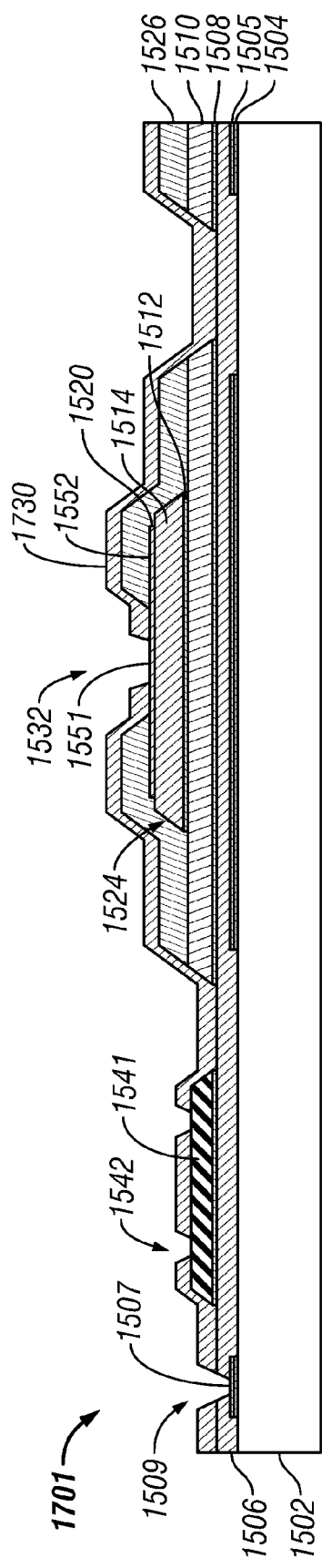
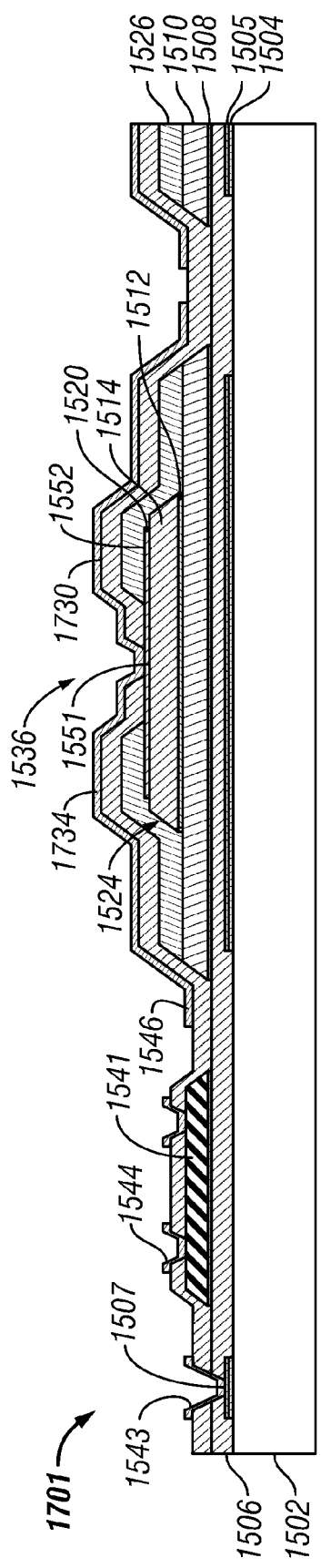
FIG. 17A
FIG. 17B

ELECTROMECHANICAL SYSTEM HAVING A DIELECTRIC MOVABLE MEMBRANE AND A MIRROR

BACKGROUND

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

In certain embodiments, a microelectromechanical (MEMS) device comprises at least one electrode, a first reflective layer, and a movable reflective element. The movable reflective element comprises a flexible dielectric layer and a second reflective layer mechanically coupled to the flexible dielectric layer. The flexible dielectric layer flexes in response to voltages applied to the at least one electrode to move the reflective element in a direction generally perpendicular to the first reflective layer.

In certain embodiments, a microelectromechanical (MEMS) device comprises first means for reflecting and means for moving a portion of the device. The moving means comprises second means for reflecting and means for supporting the second reflecting means. The supporting means is mechanically coupled to the second reflecting means. The supporting means has a flexible dielectric portion. The device further comprises means for actuating the moving means to move the second reflecting means in a direction generally perpendicular to the first reflecting means.

In certain embodiments, a method of manufacturing a microelectromechanical (MEMS) device comprises providing at least one electrode, providing a first reflective layer, forming a sacrificial layer over the first reflective layer, and forming a reflective element over the sacrificial layer. The reflective element is substantially parallel to the first reflective layer. Forming the reflective element comprises forming a second reflective layer over the sacrificial layer and forming a flexible dielectric layer over the second reflective layer. The method further comprises removing the sacrificial layer such that the flexible dielectric layer is responsive to voltages applied to the at least one electrode by flexing to move the reflective element in a direction generally perpendicular to the first reflective layer.

BRIEF DESCRIPTION OF THE DRAWINGS

FIGS. 15A-15K are cross sections of an example embodiment of a method of fabricating an interferometric modulator of the interferometric modulator array of FIG. 14 taken along line 150-150.

FIGS. 17A-17C are cross sections of another example embodiment of a method of fabricating an interferometric modulator of the interferometric modulator array of FIG. 14 taken along line 150-150.

DETAILED DESCRIPTION OF THE PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Deformable layers and reflective elements that can reduce the effects resulting from a portion of a MEMS device comprising a material that has a different coefficient of thermal expansion than the structures to which it is mechanically coupled is provided. A flexible dielectric layer has a coefficient of thermal expansion that is substantially similar to the coefficient of thermal expansion for dielectric substrates and support structures such as posts and rivets. A reflective element comprising a dielectric body portion has a coefficient of thermal expansion that is substantially similar to the coefficient of thermal expansion for a flexible dielectric layer, and provides a stably rigid structure for conductive mechanical layers. The reflective surface of a reflective element comprising a dielectric body portion may be coupled to a routing structure over the edges of the reflective element, through notches in the edges of the reflective element, or through a central portion of the reflective element.

Figure 1:
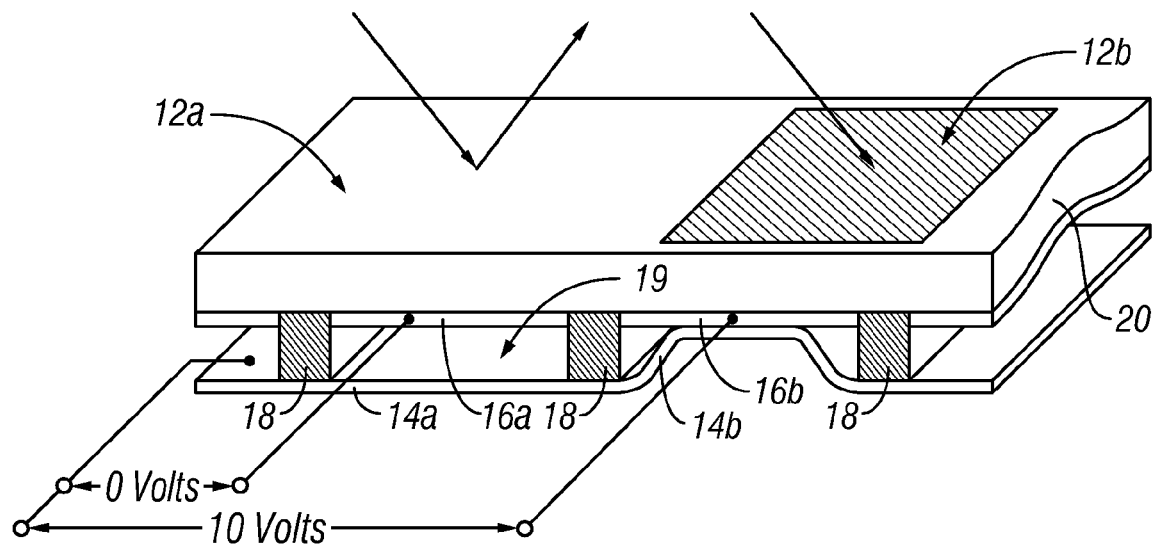
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
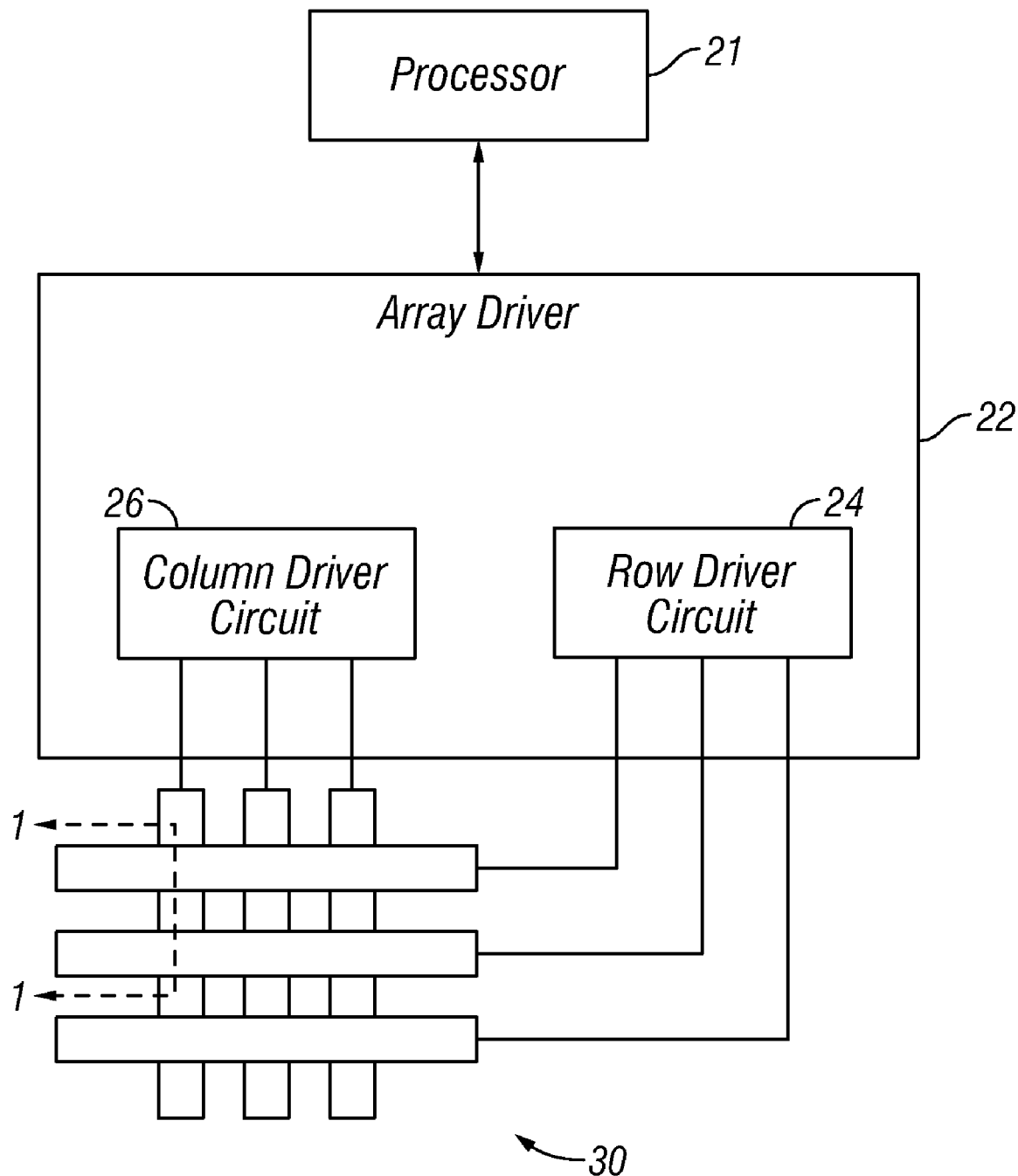
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
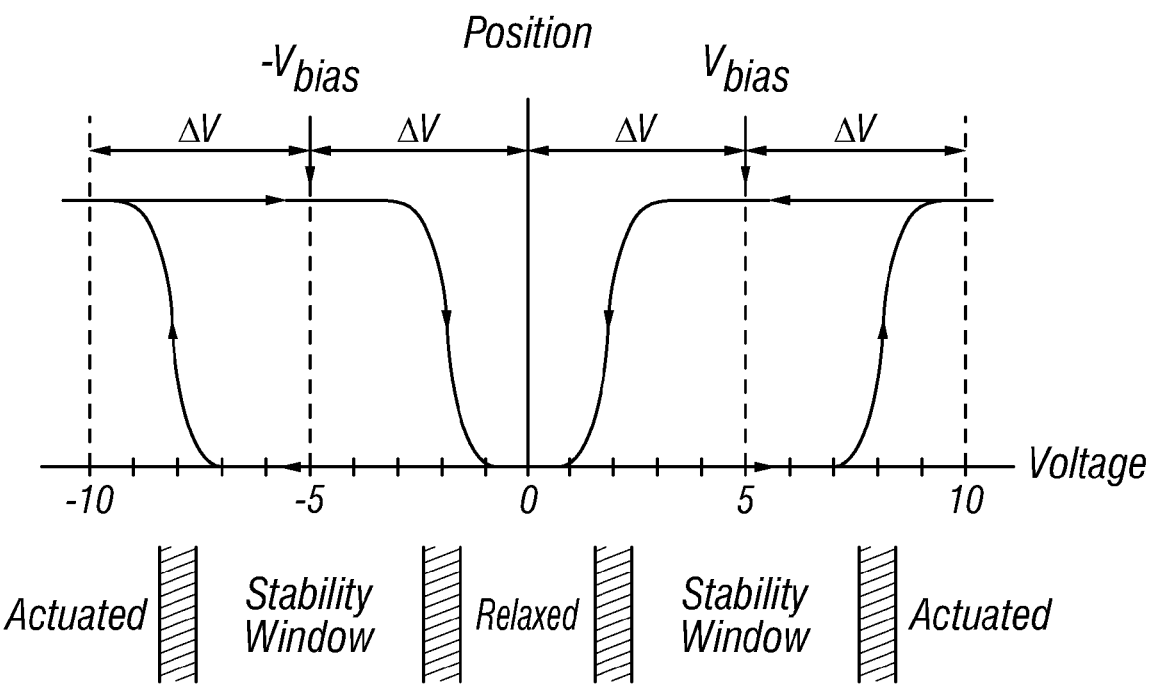
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
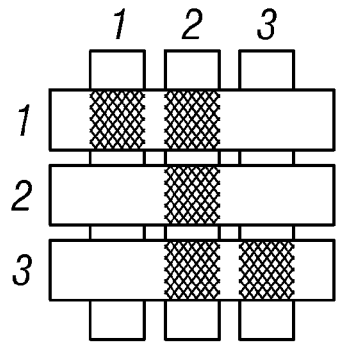
FIG. 5A illustrates one exemplary frame of display data in the 3×3 interferometric modulator display of FIG. 2.
Figure 5B:
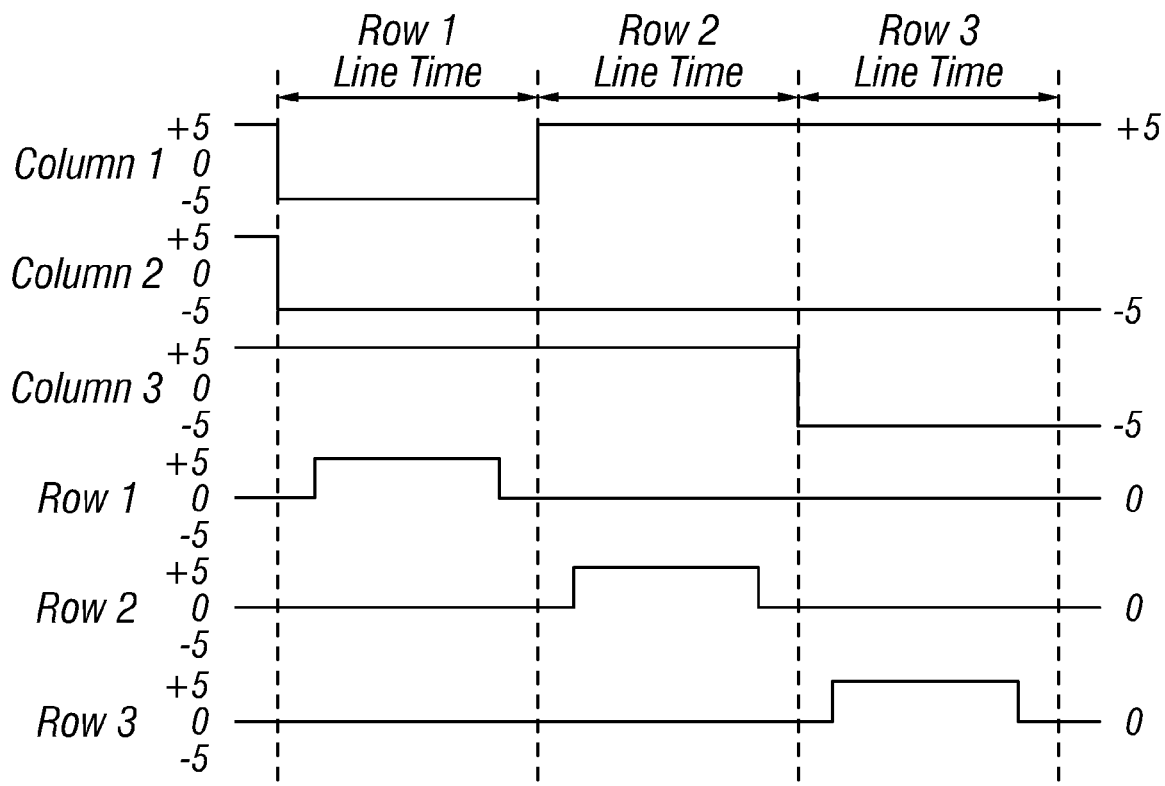
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
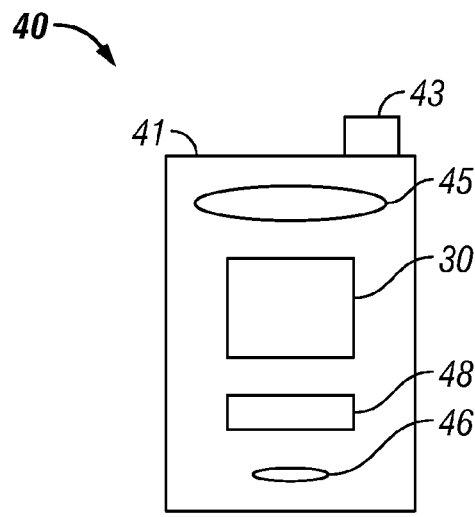
FIGS. 6A and 6B are system block diagrams illustrating an embodiment of a visual display device comprising a plurality of interferometric modulators.
Figure 6B:
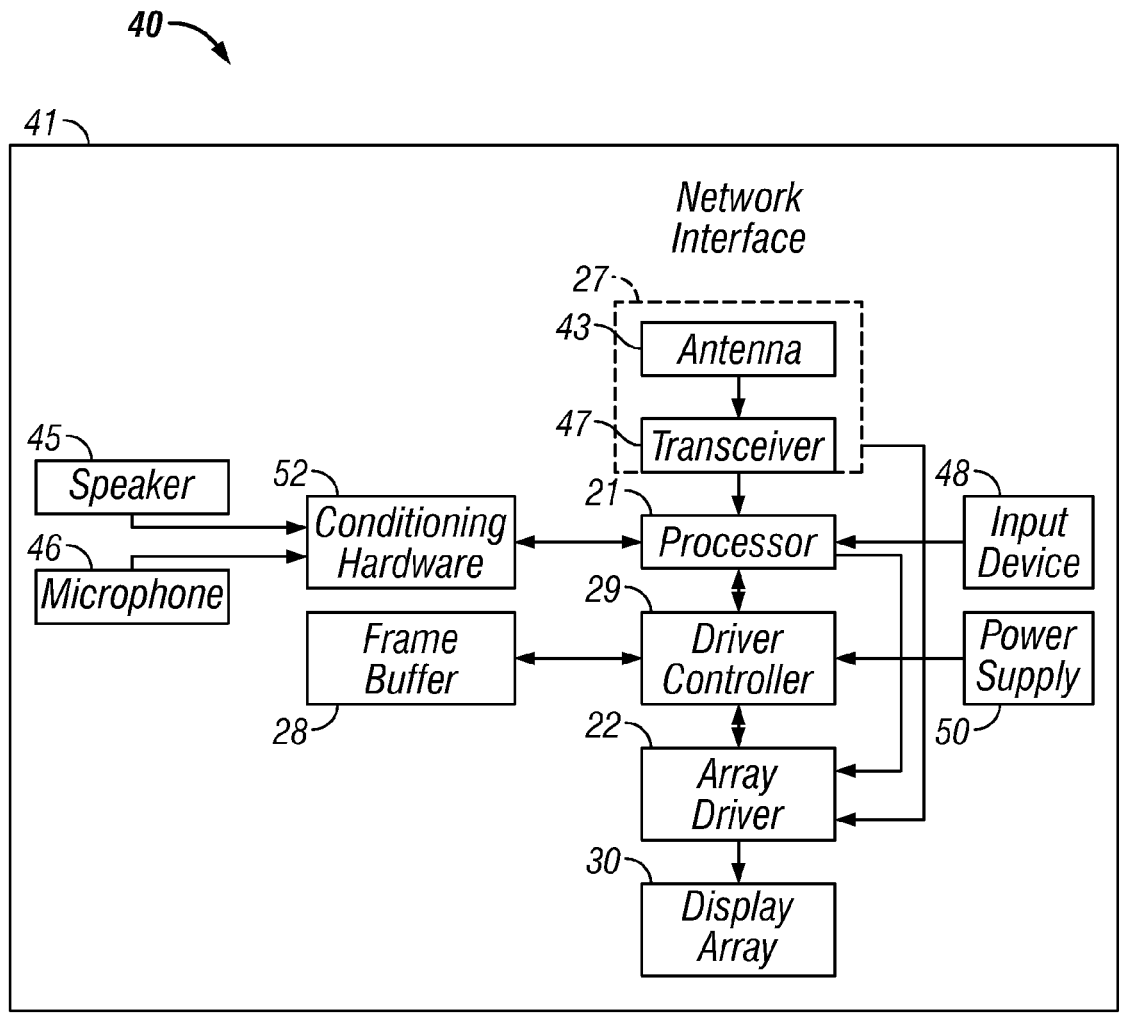

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46.

Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
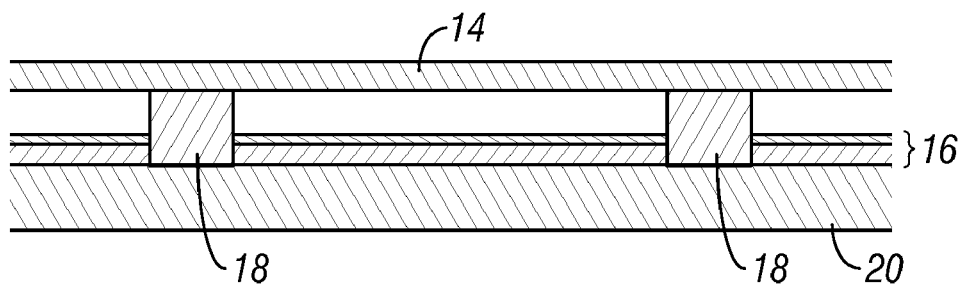
FIG. 7A is a cross section of the device of FIG. 1.
Figure 7B:
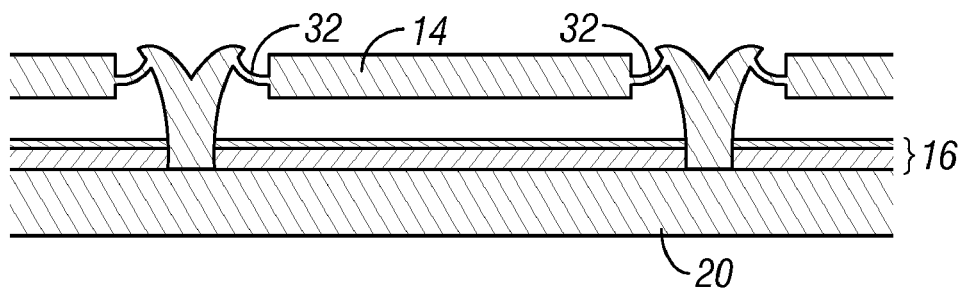
FIG. 7B is a cross section of an alternative embodiment of an interferometric modulator.
Figure 7C:
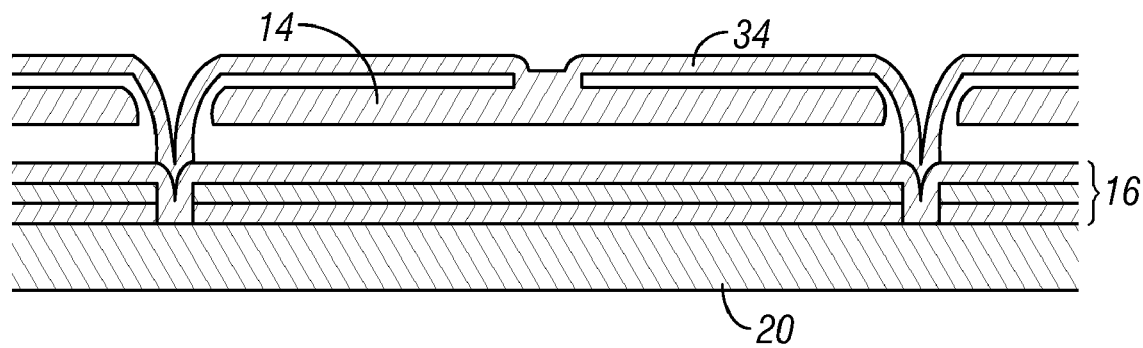
FIG. 7C is a cross section of another alternative embodiment of an interferometric modulator.
Figure 7D:
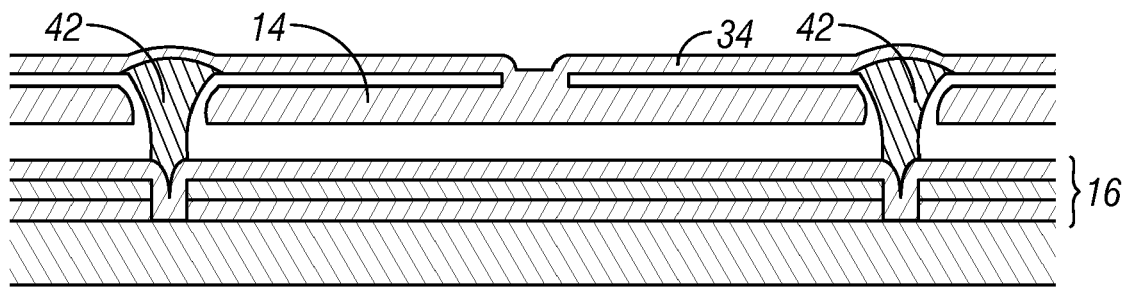
FIG. 7D is a cross section of yet another alternative embodiment of an interferometric modulator.
Figure 7E:
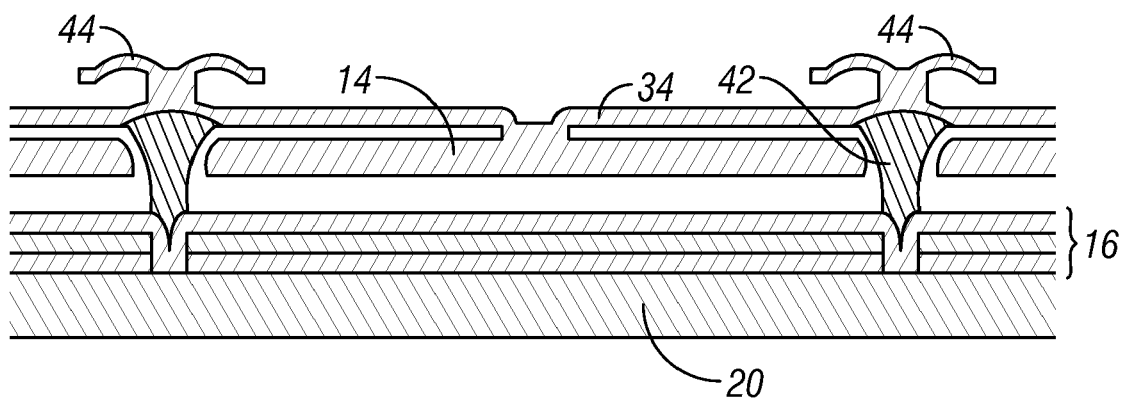
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Optimization of the structural design and materials used for the reflective layer (or "mirror layer") 14 and the deformable layer (or "mechanical layer") 34 may result in different materials being used for the reflective layer 14 and the deformable layer 34. Different materials may have different properties, such as residual stresses, which can cause curvature and/or tilt in the reflective layer 14. For example, crystalline nickel has an intrinsic crystal lattice stress of about 350 megapascals (MPa) and crystalline aluminum has an intrinsic crystal lattice stress of about 50 MPa. Because the residual stresses are different, an interface between nickel and aluminum will have a stress gradient, which will exert tensile or compressive forces, thereby causing curvature and/or tilt (or "launching" and "deflection") of the material that is more pliable or compliant (e.g., aluminum as compared to nickel).

In addition, the interface between different materials with mismatched crystal lattices for the reflective layer 14 and the deformable layer 34, for example aluminum and nickel, respectively, can cause curvature and/or tilt of the reflective layer 14.

Another property that may be different between different materials is coefficient of thermal expansion. When a device comprising different materials for the reflective layer 14 and the deformable layer 34 is heated or cooled, thermal stresses due to different amounts of thermal expansion or contraction between the materials used for the reflective layer 14 and the deformable layer 34 can contribute to the curvature and/or tilt of the reflective layer 14. Thus, the magnitude of curvature and/or tilt in some embodiments is a function of temperature.

Curvature and tilt of the reflective layer 14 may affect the size of the hysteresis window and the optical properties of the reflective layer 14. As described above, the row/actuation protocol may be set according to a hysteresis window, so a change in the hysteresis window may cause the device to function improperly or to fail.

Even if the device works within a given hysteresis window, the changed optical properties may adversely affect performance of a display comprising the device. In some embodiments, the surface of the reflective layer 14 facing the substrate 20 is substantially parallel to the optical stack 16. However, curvature and/or tilt of the reflective layer 14 may cause some or all of the surfaces of the reflective layer 14 facing the substrate 20 to be non-parallel to the optical stack 16. A curved and/or tilted reflective layer 14 may reflect differing amounts of visible light across its area, distorting whether the reflective layer 14 is in the "on" or "off" position and/or distorting the color of the modulator.

The mismatch between the coefficient of thermal expansion of a post 18 (e.g., comprising silicon dioxide ($SiO_2$)) and a deformable layer 34 (e.g., comprising nickel (Ni)) may also cause unstable color at certain operational temperatures. For example, α-$SiO_2$ has a coefficient of thermal expansion of about $2.3 \times 10^{-6}$/K while nickel has a coefficient of thermal expansion of about $13 \times 10^{-6}$/K. When an interferometric modulator is heated or cooled, the stress gradient between the deformable layer 34 and the posts 18 may cause a distance between the movable reflective portion 14 and the optical stack 16 to increase or decrease, thereby leading to unstable color as the temperature varies. Other coefficients of thermal expansion for appropriate materials include, but are not limited to, fused quartz-$SiO_2$ at about $0.5 \times 10^{-6}$/K, glass-$SiO_2$ (e.g., display glass from Corning) at about $3.7 \times 10^{-6}$/K, and silicon nitride ($SiN_x$, $Si_3N_4$, etc.) at about $4 \times 10^{-6}$/K.

Figure 8:
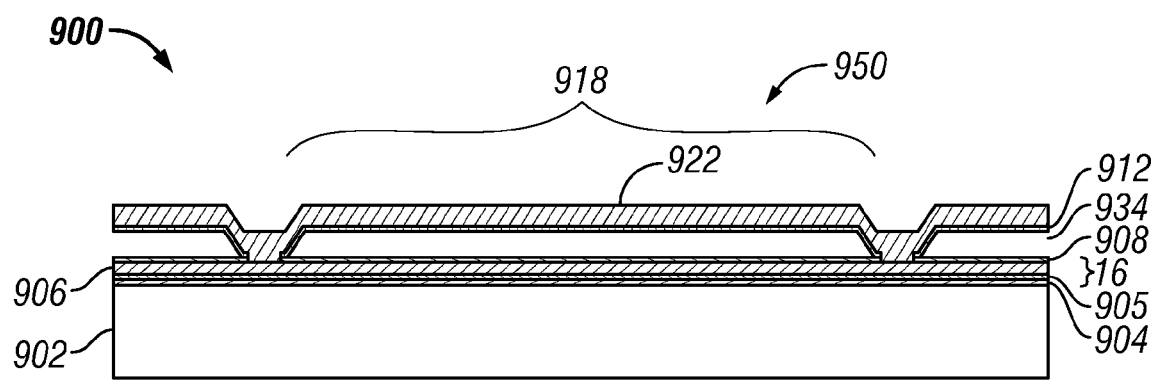
FIG. 8 is a cross section of still another example embodiment of an interferometric modulator.

In certain embodiments, a MEMS device 900 comprises at least one electrode 904, a first reflective layer 905, and a movable functional element 950 (e.g., a reflective element). FIG. 8 schematically illustrates a cross-section of an example MEMS device 900 compatible with certain embodiments described herein. The movable functional element 950 comprises a flexible dielectric layer 922 that is flexed in response to voltages applied to the at least one electrode 904 to move the functional element 950 in a direction generally perpendicular to the first reflective layer 905. The functional element 950 further comprises a second reflective layer 912 mechanically coupled to the flexible dielectric layer 922. It will be appreciated that all of the Figures described in this application are schematic only, and proportions of certain features are not to scale. For example, the thicknesses of the layers within each Figure may not be to scale.

In the embodiment illustrated in FIG. 8, the electrode 904 comprises a conductive material that is integrated with a first reflective layer 905 in an optical stack 16, which is formed on a substrate 20. As described above, in embodiments in which the electrode 904 is in the optical path of light being modulated by the MEMS device 900 (e.g., when a display comprising the MEMS device 900 is viewed through the substrate 902), the electrode 904 may comprise a substantially transparent conductive material (e.g., ITO, indium zinc oxide (IZO), etc.). In certain alternative embodiments, the electrode 904 is not in the optical path of light being modulated by the MEMS device 900, and in such embodiments, the electrode 904 may comprise an opaque conductive material. The optical stack 16 further comprises an oxide layer 908, which may comprise aluminum oxide ($Al_2O_3$).

The first reflective layer 905 is partially reflective and partially transmissive to light being modulated by the MEMS device 900. The first reflective layer 905 of certain embodiments comprises chromium. In certain embodiments, the first reflective layer 905 comprises chromium having a thickness of between about 60 and 80 Å. In certain alternative embodiments, the first reflective layer 905 comprises molybdenum-chromium (MoCr) having a thickness of between about 60 and 80 Å. Other materials and thicknesses are also possible.

In certain embodiments, the second reflective layer 912 is substantially reflective to light being modulated by the MEMS device 900. The second reflective layer 912 of certain embodiments comprises aluminum (Al) and has a thickness between about 300 and 1,000 Å. In certain embodiments, the second reflective layer 912 comprises any suitably reflective material, for example, but not limited to, metals including silver and gold.

The flexible dielectric layer 922 of certain embodiments has similar deformation and restoration properties as a deformable layer comprising aluminum. The thickness and the material of the flexible dielectric layer 922 can be selected to provide desired restoring forces. For example, in certain embodiments, the flexible dielectric layer 922 comprises a $SiO_2$ layer having a thickness between about 500 and 6,000 Å. In certain alternative embodiments, other materials are used (e.g., between about 500 and 6,000 Å of $AlO_x$ such as $Al_2O_3$, between about 500 and 6,000 Å of $SiN_x$ such as $Si_3N_4$, between about 500 and 6,000 Å of silicon oxynitride ($SiO_xN_y$) such as $SiO_xN$). In certain embodiments, a composite of dielectric layers are used, such as (1) between about 80 and 120 Å of $SiO_2$/between about 500 and 10,000 Å of $SiN_x$/between about 80 and 120 Å of $SiO_2$, (2) between about 80 and 120 Å of $AlO_x$/between about 500 and 10,000 Å of $SiN_x$/between about 80 and 120 Å of $AlO_x$, and (3) between about 500 and 10,000 Å of $SiN_x$ at least partially surrounded by between about 60 and 80 Å of Al. When a voltage is applied to the electrode 904 to actuate the MEMS device 900, the second reflective layer 912 is attracted towards the first electrode 904 by electrostatic forces, as described above. Because the flexible dielectric layer 922 is flexible, it acts as the deformable layer 34 described above, providing restoring forces to the second reflective layer 912 when the MEMS device 900 is in the unactuated state (e.g., when a voltage is not applied to the electrode 904).

Figure 9:
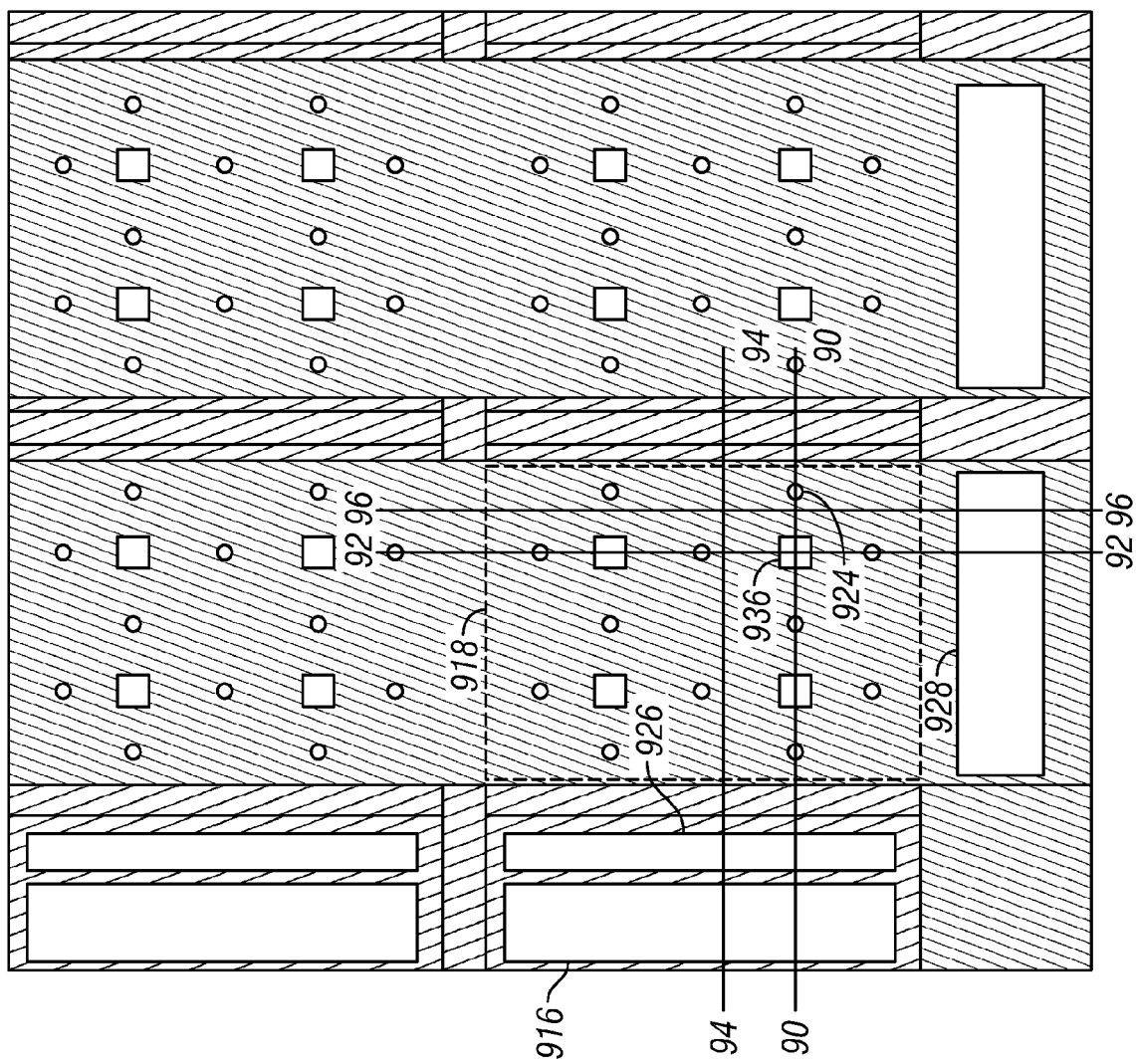
FIG. 9 is a top plan view of an example embodiment of an interferometric modulator array.

FIG. 9 illustrates a top plan view of an example embodiment of an array of MEMS devices 900 in which the MEMS devices are interferometric modulators with a deformable layer 34 that comprises a flexible dielectric layer 922. The array illustrated in FIG. 9 comprises a plurality of supports (or "posts") 936. Such an embodiment may be used for large pixels 918 to reduce the effects of stiction and to control actuation voltages. While several factors including film stress and thickness determine the static and/or dynamic characteristics of components of MEMS devices 900, generally, the greater the density of posts 936, the greater the actuation voltage, and the lower the density of posts 936, the greater the effects of stiction. However, a greater number of posts 936 also decreases the "fill factor" of the pixel 918 because some area that could be used as a reflective surface is used as a post.

In embodiments in which the flexible dielectric layer 922 is disposed on posts 936 comprising $SiO_2$ and in which the flexible dielectric layer 922 comprises $SiO_2$, there is substantially no mismatch in coefficient of thermal expansion between the posts 936 and the flexible dielectric layer 922. As such, the color stability at wide operational temperatures can be increased over embodiments in which the posts 936 comprise dielectric material and the flexible layer comprises a non-dielectric material such as nickel.

The second reflective layer 912 and the flexible dielectric layer 922 of certain embodiments have a mismatch in coefficient of thermal expansion. The effects of such mismatch can be reduced by selecting materials that have similar coefficients of thermal expansion. Additionally, the effects of any mismatch in coefficients of thermal expansion can be decreased by minimizing the thickness of one of the materials such that it does not exert a great amount of stress on the other material. In order to retain the restoring forces of the flexible dielectric layer 922, the thickness of the second reflective layer 912 is reduced or minimized in certain embodiments rather than reducing or minimizing the thickness of the flexible dielectric layer 922. There is a trade-off between maintaining the optical properties, such as reflection of the second reflective layer 912, and minimizing the thickness of the second reflective layer 912 in order to decrease the effects of a mismatched coefficient of thermal expansion with respect to the flexible dielectric layer 922. For example, when the reflective layer 912 comprises aluminum, the optical properties of the reflective layer 912 may begin to degrade at thicknesses under about 300 Å.

Figure 10A:
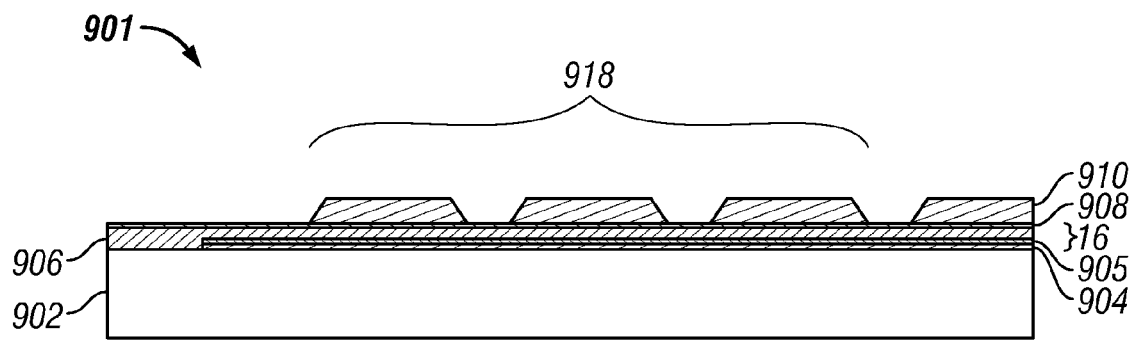
FIGS. 10A-10C are example cross sections of intermediate structures for an example interferometric modulator of the interferometric modulator array of FIG. 9 taken along line 90-90.

FIGS. 10A-10G schematically illustrate manufacturing steps and additional structural details compatible with certain embodiments described herein. FIG. 10A illustrates a structure 901 comprising a substrate 902 (e.g., comprising glass, plastic), an electrode 904 (e.g., comprising ITO), a first reflective layer 905 (e.g., comprising Cr), an insulating layer 906 (e.g., comprising $SiO_2$), an oxide layer 908 (e.g., comprising $Al_2O_3$), and a sacrificial layer 910 (e.g., comprising molybdenum). The electrode 904, first reflective layer 905, insulating layer 906, and oxide layer 908 may be referred to as the "optical stack" 16. In some embodiments, the first reflective layer 905 is separate from the electrode 904, as described above. In certain other embodiments, the first reflective layer 905 is adjacent to the electrode 904 as schematically illustrated in FIG. 10A. The sacrificial layer 910 is patterned in order to form a cavity 934 between the second reflective layer 912 and the optical stack 16, as described more fully below. In certain embodiments, a pixel 918 comprises two or more adjacent MEMS devices 900.

Figure 10B:
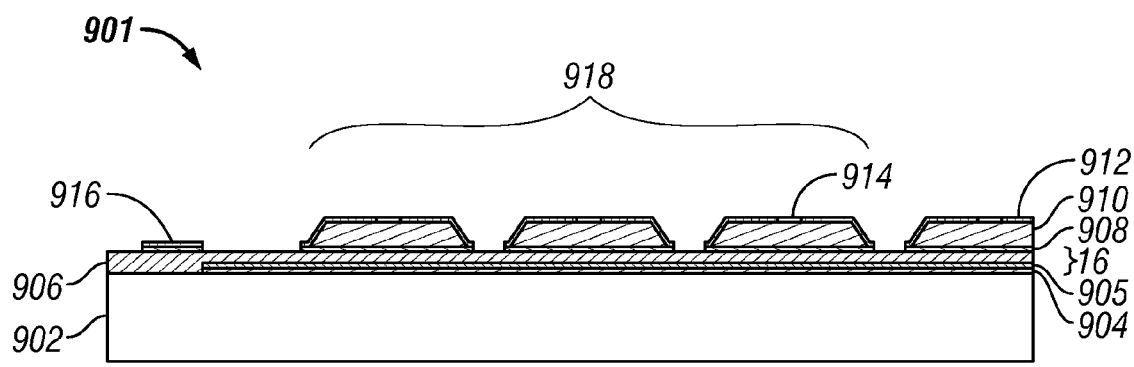

FIG. 10B shows the structure 901 after a second reflective layer 912 (e.g., comprising aluminum) has been formed over the sacrificial layer 910. The second reflective layer 912 overlaps the edges of the sacrificial layer 910 and contacts the oxide layer 908. In some embodiments, formation of the second reflective layer 912 also forms a pad 916 that may provide electrical communication between the second reflective layer 912 and row drivers. The second reflective layer 912 may comprise a release hole 914 (e.g., as illustrated in FIG. 10B) in order to allow for easier etching of the sacrificial layer 910 in subsequent processing steps.

Figure 10C:
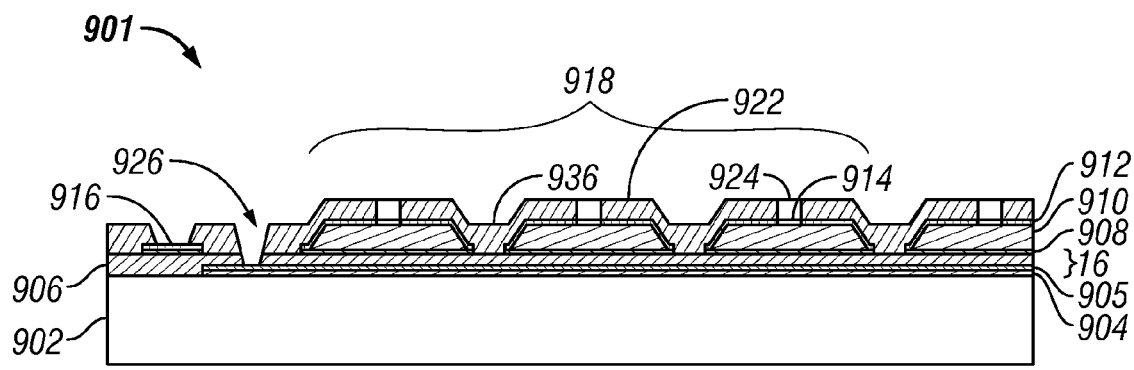

FIG. 10C shows the structure 901 after a flexible dielectric layer 922 (e.g., comprising $SiO_2$, $AlO_x$, $SiN_x$, $SiO_xN_y$, a composite) has been formed over the second reflective layer 912. In certain embodiments, formation of the flexible dielectric layer 922 also forms posts (or "supports") 936 within a MEMS device 900 of the pixel 918 and between the pixels 918. In such embodiments, the flexible dielectric layer 922 may contact the insulating layer 906 at each post 936 through the second reflective layer 912. In certain embodiments, forming a plurality of supports 936 within the MEMS device 900 comprises forming a plurality of apertures through the sacrificial layer 910 and forming a dielectric structure in the apertures. Forming the dielectric structures in the apertures may be performed while forming the flexible dielectric layer 922 over the sacrificial layer 910, or may be performed separately. The flexible dielectric layer 922 may comprise release holes 924 in fluid communication with the release holes 914 in the second reflective layer 912 (e.g., as shown in FIG. 10C) in order to allow easier etching of the sacrificial layer 910 at subsequent processing steps. However, the sacrificial layer 910 in some embodiments is etched at least in part via other fluid conduits (e.g., between certain portions of the MEMS device 900 and/or between the pixels 918). For example, FIG. 9 illustrates that portions of the MEMS device 900 are in fluid communication with one another around the posts 936.

The flexible dielectric layer 922 in certain embodiments requires minimal patterning in the area of the pixels 918, for example because the flexible dielectric layer 922 does not conduct electricity between adjacent pixels 918 (e.g., the pixel 918 is not electrically connected to the partial pixel depicted to the right in FIG. 10C). In some embodiments, the flexible dielectric layer 922 is patterned to create an opening to the pad 916 and to create a via 926 to the electrode 904 (e.g., by also removing portions of the insulator 906). The opening to the pad 916 and the via 926 to the electrode 904 can provide a path for electrical routing in order to selectively actuate one or more of the MEMS devices 900. In certain embodiments, patterning of the flexible dielectric layer 922 comprises a dry etch or a wet etch (e.g., using 777, available from Fuji Arch of Norwalk, Conn.).

Figure 10D:
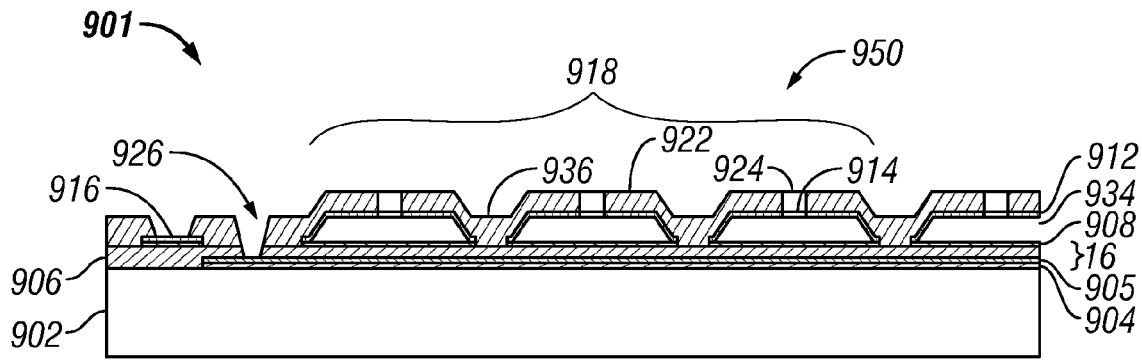
FIG. 10D is a cross section of an example interferometric modulator formed from the intermediate structures of FIGS. 10A-10C taken along line 90-90 of FIG. 9.

FIG. 10D illustrates the structure 901 of FIG. 10C after the sacrificial layer 910 has been removed (e.g., by etching with xenon difluoride ($XeF_2$) in embodiments in which the sacrificial layer 910 comprises molybdenum), thereby creating one or more cavities 934 between the second reflective layer 912 and the optical stack 16. The flexible dielectric layer 922 is capable of deforming when voltages applied across the electrode 904 and the movable reflective element 950 electrostatically attract the movable reflective element 950 towards the electrode 904. When the reflective element 950 is actuated (e.g., in a first position relative to the first reflective layer 905), a first portion and a second portion of the second reflective layer 912 each contact the oxide layer 908. When the reflective element 950 is unactuated (e.g., in a second position relative to the first reflective layer 905), the first portion has moved such that it does not contact the oxide layer 908, but the second portion remains in contact with the oxide layer 908. For example, in some embodiments, the first portion comprises the portion of the second reflective layer 912 that is generally parallel to the optical stack 16 and the second portion comprises the portion of the reflective layer 912 that connects the first portion to the oxide layer 908.

Figure 10E:
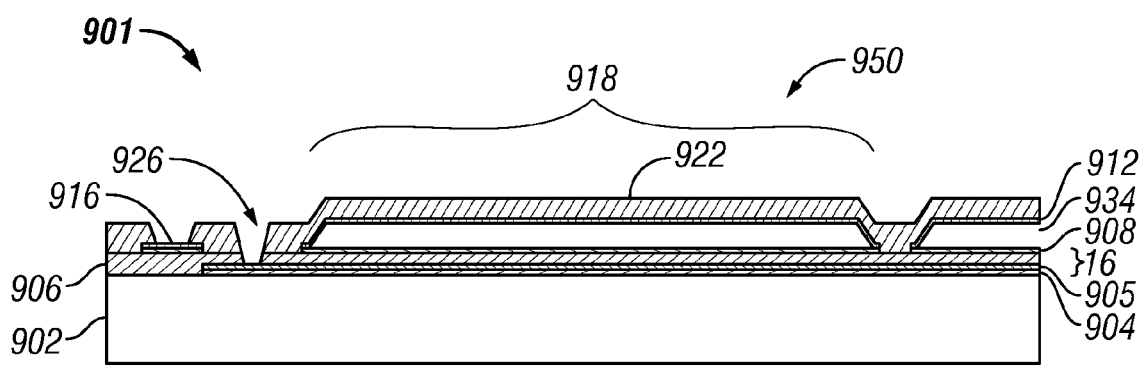
FIG. 10E is a cross section of the example interferometric modulator of FIG. 10D taken along line 94-94 of FIG. 9.

FIG. 10E illustrates a cross-section of the display device of FIG. 9 taken along line 94-94 at the same point of manufacture as FIG. 10D. FIG. 10E illustrates that the second reflective layer 912 spans the length of the MEMS device 900 of the pixel 918 in the row direction.

Figure 10F:
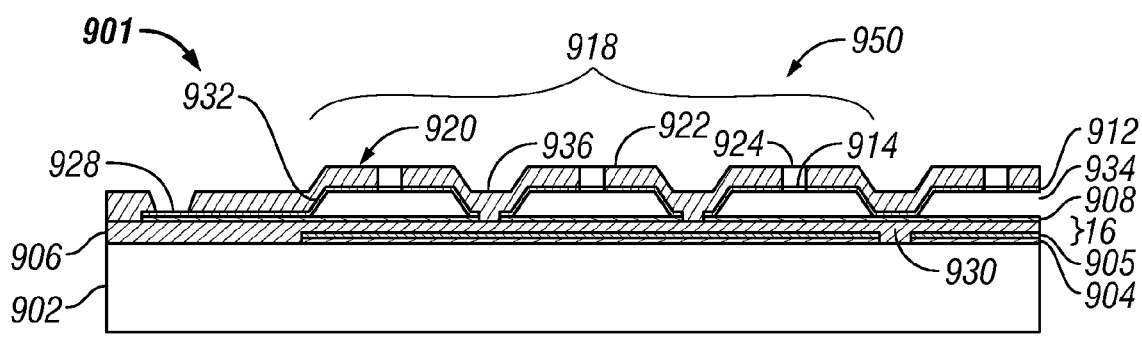
FIG. 10F is a cross section of the example interferometric modulator of FIG. 10D taken along line 92-92 of FIG. 9.
Figure 10G:
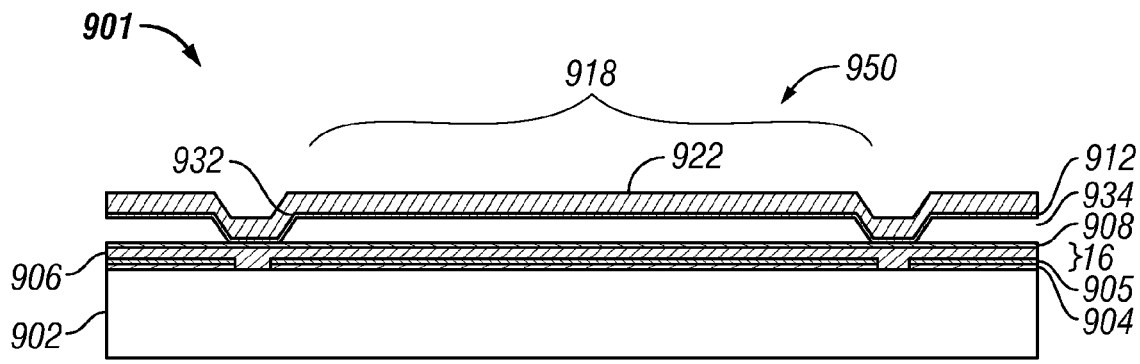
FIG. 10G is a cross section of the example interferometric modulator of FIG. 10D taken along line 96-96 of FIG. 9.

FIG. 10F illustrates a cross section of the display device of FIG. 9 taken along line 92-92 at the same point of manufacture as FIG. 10D. FIG. 10F illustrates that the electrode 904 may span a single pixel 918 along each column so as to permit, in conjunction with the second reflective layer 912, selective actuation of individual pixels 918. FIG. 10F also illustrates that the second reflective layer 912 is in electrical communication with the pad 928. The MEMS device 900 of the pixel 918 is in electrical communication with the MEMS devices 900 of adjacent pixels 918. FIG. 10G illustrates a cross-section of the display device of FIG. 9 taken along line 96-96 at the same point of manufacture as FIG. 10F. FIG. 10G illustrates that the second reflective layer 912 spans the length of the MEMS device 900 of the pixel 918 in the column direction.

Figure 10H:
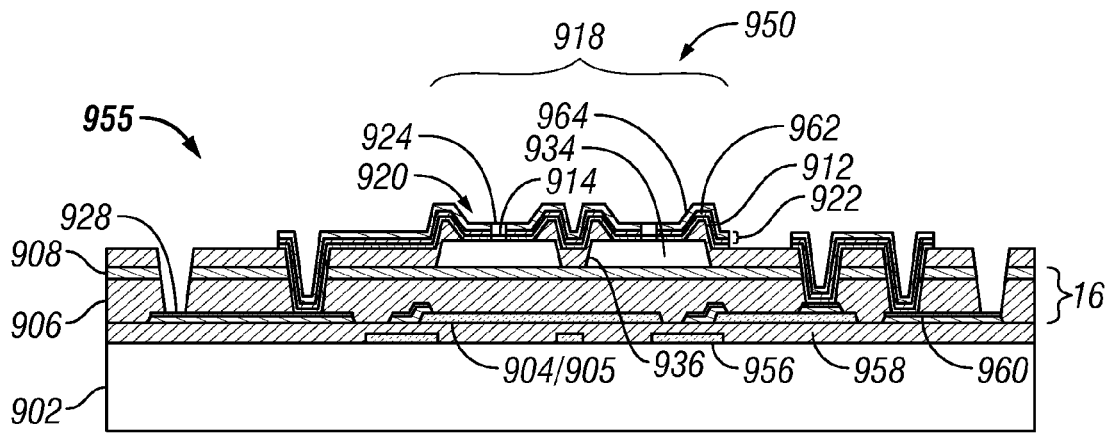
FIG. 10H is a cross section of another example interferometric modulator.

FIG. 10H illustrates a cross-section of another example embodiment of a display device comprising a MEMS device 955. Features similar to those in the display device of FIG. 10F share common reference numerals. Rather than having a bilayer of, for example, ITO and chromium, as illustrated in FIG. 10F, the display device illustrated in FIG. 10H comprises an actuation electrode and first reflective layer that are a single layer 904/905. In certain embodiments, the layer 904/905 comprises a partially reflective, partially transparent, and conductive material (e.g., comprising between about 60 and 80 Å of molybdenum-chromium (MoCr)). Additionally, rather than using the material of the actuation electrode 904 for routing of electrical signals to the actuation electrode 904 as illustrated in FIG. 10F, a bilayer 960 (e.g., comprising aluminum-nickel and nickel) is used for routing in areas of the display device that are not operationally viewed by a user (e.g., under the posts 936). In certain embodiments, a series of etches comprising etchants selective to nickel and/or nickel-aluminum are used to form such structures. In certain alternative embodiments, the nickel and aluminum-nickel are etched using an etchant that is not selective to either material (e.g., comprising nitric acid ($HNO_3$) or dilute nitric acid such as $HNO_3$:DI 1:9).

FIG. 10H also illustrates a black matrix structure 956 formed between the substrate 902 and the optical stack 16. The black matrix structure 956 comprises a layer of partially reflective and partially transparent material (e.g., comprising between about 60 and 80 Å of MoCr). A layer of a dielectric material 958 (e.g., comprising $SiO_2$) insulates the black matrix structure 956 from the actuation electrode 904/905 and the routing bilayer 960. In some embodiments, the black matrix structure 956 and the dielectric layer 958 is formed over the substrate 902 prior to formation of the layer 904/905.

FIG. 10H further depicts a post 936 that is below the second reflective layer 912. The material for the post 936 (e.g., comprising between about 4,000 and 6,000 Å of $SiO_2$, such as about 5,000 Å of $SiO_2$) is deposited over the sacrificial layer (shown removed to create the cavity 934) and the oxide layer 908. In some embodiments, the additional height provided to the MEMS device 950 by the post 936 being beneath the second reflective layer 912 may influence the function of the MEMS device 950 (e.g., a color reflected from an interferometric modulator).

FIG. 10H also shows a flexible dielectric layer 922 comprising a composite of a first layer 962 and a second layer 964. In certain embodiments, the first layer 962 comprises between about 500 and 3,000 Å of $SiN_x$ or $SiO_xN_y$ and the second layer 964 comprises between about 80 and 120 Å of $SiO_2$. In certain embodiments, the layers 962, 964 may be etched together. For example, in embodiments in which the first layer 962 comprises $SiN_x$ and the second layer 964 comprises $SiO_2$, both layers may be etched by carbon tetrafluoride ($CF_4$) plus oxygen ($O_2$) (together ($CF_4/O_2$)). The second reflective layer 912 beneath the flexible dielectric layer 922 may be patterned, for example, using a wet etch comprising phosphoric acid ($H_3PO_4$). The composite flexible dielectric layer 922 is illustrated as a two layers, but three layers, four layers, etc. are also possible.

The components of the display devices of FIGS. 10F and 10H are examples only, and it will be appreciated that certain components may be used in multiple embodiments. For example, the display device of FIG. 10F may comprise a black matrix structure 956 between the substrate 902 and the optical stack 16, as illustrated in FIG. 10H. For another example, the display device of FIG. 10H may comprise a unitary (non-composite or single layer) flexible dielectric layer 922. Other combinations and permutations are also possible, including with other structures, display devices, MEMS devices, and interferometric modulators described herein.

FIGS. 11A-11D illustrate a structure 1000 in which the areas of the posts 936 are further supported by a plurality of support structures 1002, 1004. Prior to patterning the flexible dielectric layer 922 in FIG. 10C, the support structures 1002, 1004 are formed in the areas of the posts 936 and/or between adjacent pixels 918. The support structures 1004 between adjacent pixels 918 may extend the length and/or width of the pixels 918 such that they may be called "rails." In certain such embodiments, the rails provide fluid isolation of the pixels 918 from one another. The flexible dielectric layer 922 is not patterned prior to support structure formation in certain embodiments because the etchants used to pattern the material for the support structures 1002 may also undesirably etch the sacrificial layer 910. The support structures 1002 may comprise a material that may be selectively etched in relation to the flexible dielectric later 922. For example, when the flexible dielectric layer 922 comprises $SiO_2$, the support structures 1002 may comprise aluminum, nickel, chromium, etc. In such embodiments, forming the plurality of support structures 1002, 1004 may comprise forming a conductive layer over the plurality of supports 936 and patterning the conductive layer. In certain alternative embodiments, forming the plurality of support structures 1002 comprises forming a plurality of layers, for example forming a conductive layer (e.g., comprising aluminum, nickel, chromium, etc.) over the plurality of supports 936, depositing a dielectric layer (e.g., comprising $SiO_2$, $AlO_x$, $SiN_x$, $SiO_xN_y$, a composite) over the conductive layer, patterning the dielectric layer, and patterning the conductive layer using the patterned dielectric layer as a mask. In such an embodiment, the dielectric layer of the support structures 1002, 1004 may provide stiffness to the posts 936 while the conductive layer of the support structures 1002, 1004 enables the design of etch schemes that are selective to the flexible dielectric layer 922. The support structures 1002, 1004 may be between about 1,000 Å and 1 µm thick in order to provide stiffness to the posts 936 in some embodiments.

Figure 11A:
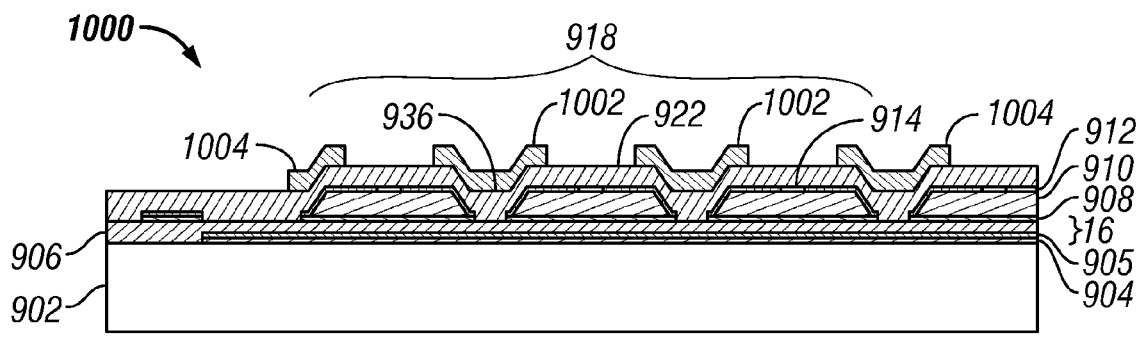
FIGS. 11A-11B are example cross sections of intermediate structures for another example interferometric modulator of the interferometric modulator array of FIG. 9 taken along line 90-90.
Figure 11B:
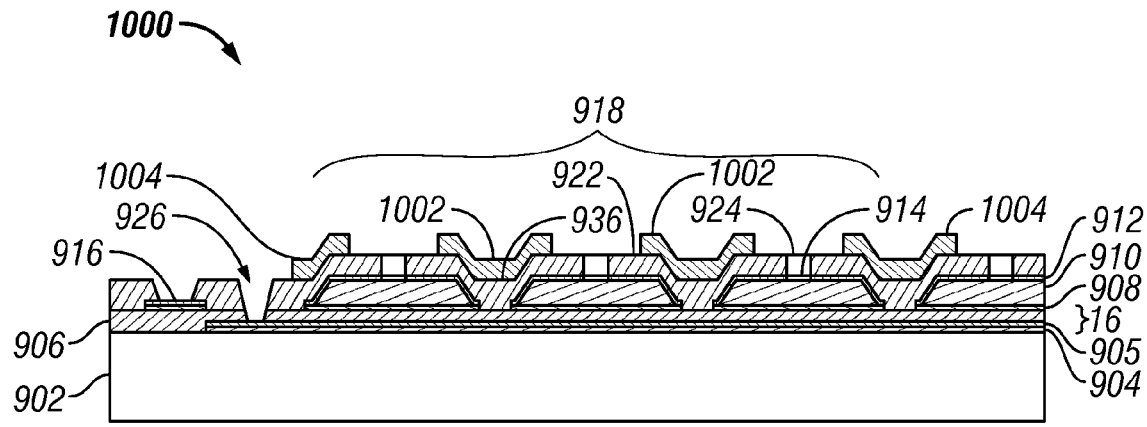
Figure 11C:
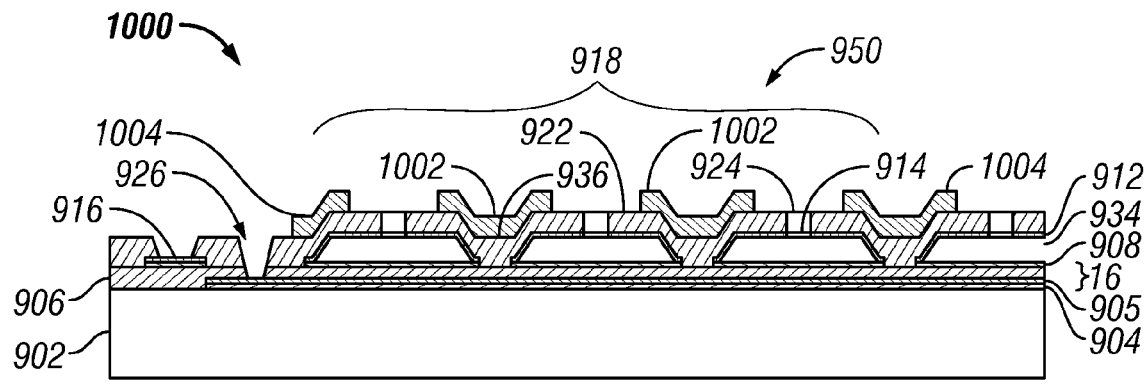
FIG. 11C is a cross section of an example interferometric modulator formed from the intermediate structures of FIGS. 11A-11B taken along line 90-90 of FIG. 9.

FIG. 11B illustrates the structure 1000 after patterning the flexible dielectric layer 922. As described above, the flexible dielectric layer 922 may comprises release holes 924, as well as openings for electrical connection of the pad 916 and the electrode 904. FIG. 11C illustrates the structure 1000 of FIG. 11B after the sacrificial layer 910 has been removed (e.g., by etching), thereby creating cavities 934 between the second reflective layer 912 and the optical stack 16. The flexible dielectric layer 922 is capable of deforming when voltages applied across the electrode 904 and the movable reflective element 950 electrostatically attract the movable reflective element 950 towards the electrode 904. The support structures 1002, 1004 provide increased rigidity in the areas of the posts 936 such that the restoring forces allow the structure 1000 to provide a more uniform color in the relaxed state.

Figure 11D:
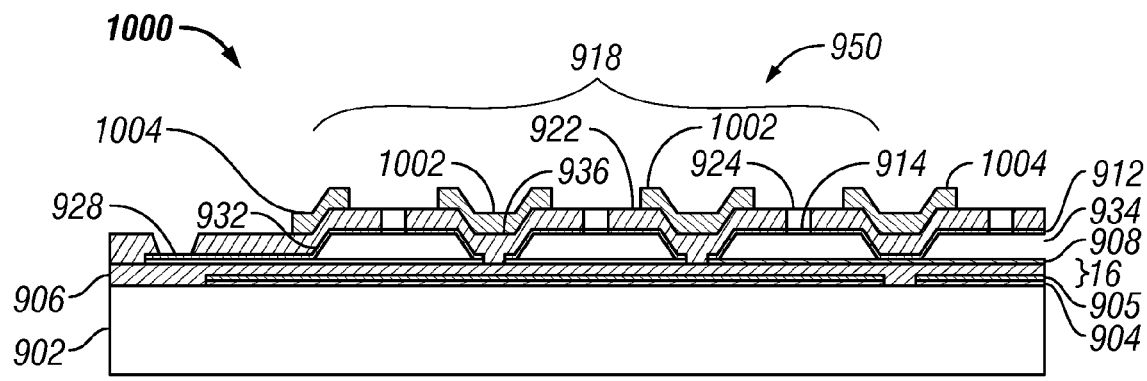
FIG. 11D is a cross section of the example interferometric modulator of FIG. 11C taken along line 92-92 of FIG. 9.

While FIGS. 11A-11C illustrate a cross section of the structure 1000 along a row direction, FIG. 11D illustrates a cross section of the structure 1000 along a column direction generally perpendicular to the row direction. FIG. 11D illustrates that the support structures 1002, 1004 may be similarly formed along the column direction.

Figure 12A:
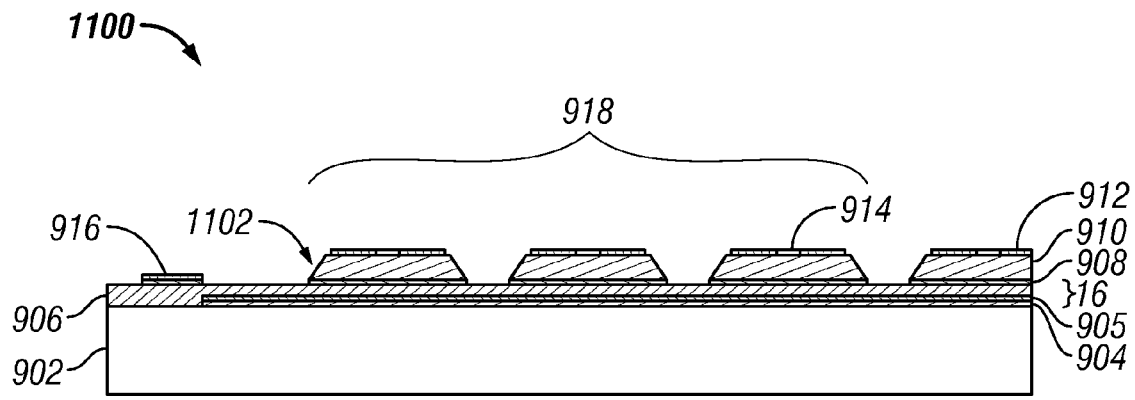
FIGS. 12A-12B are example cross sections of intermediate structures for yet another example interferometric modulator of the interferometric modulator array of FIG. 9 taken along line 90-90.
Figure 12B:
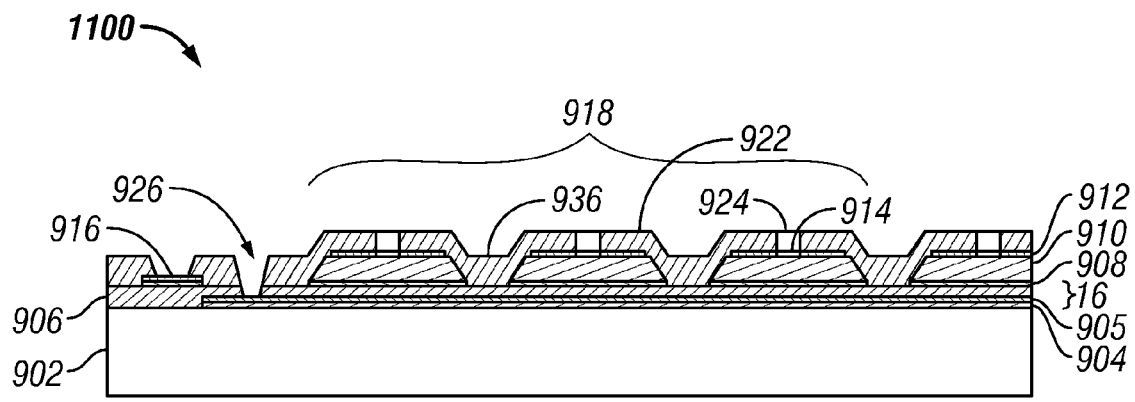
Figure 12C:
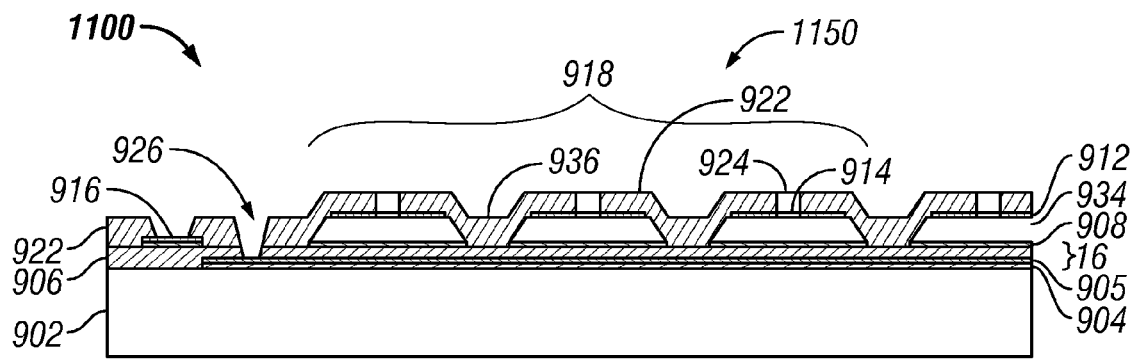
FIG. 12C is a cross section of an example interferometric modulator formed from the intermediate structures of FIGS. 12A-12B taken along line 90-90 of FIG. 9.

FIGS. 12A-12C illustrate yet another embodiment of a structure 1100 including one or more movable reflective elements 1150 comprising a flexible dielectric layer 922. The sacrificial layer 910 is patterned similarly to the method described above for FIG. 10A. However, as illustrated in FIG. 12A, the second reflective layer 912 is patterned such that the second reflective layer 912 does not contact the oxide layer 908. For example, at the edges 1102 of the sacrificial layer 910, there is substantially no second reflective layer material. Because the patterned material that protects the oxide layer 908 from the etchant in FIG. 10B does not overlap the edges of the sacrificial layer 910, the portions of the oxide layer 908 not covered by the sacrificial layer 910 are removed when the second reflective layer 912 is patterned (e.g., using an etchant that is not selective between aluminum and $Al_2O_3$).

In embodiments in which the sacrificial layer 910 comprises molybdenum and is etched with $XeF_2$, any $SiO_2$ that is exposed to the $XeF_2$ may also be etched. For example, an insulating layer 906 comprising $SiO_2$ may be etched by about 50-100 Å depending on process parameters (e.g., selectivity to the sacrificial layers, process time, pressure, temperature, etc.). This etching may be problematic when the etched $SiO_2$ is within the optical path (e.g., by causing uneven color due in the black state due to uneven thickness). In the embodiment illustrated in FIGS. 10A-10G, the oxide layer 908, which is resistant to $XeF_2$ etch when it comprises $Al_2O_3$, protects the insulating layer 906 from being etched. In embodiments in which the posts 936 comprise $SiO_2$ (e.g., in embodiments in which the flexible dielectric layer 922 also comprises $SiO_2$), the posts 936 may also be vulnerable to etching by $XeF_2$. In the embodiment illustrated in FIGS. 10A-10G, the second reflective layer 912 protects the sides of the posts 936 from being etched by $XeF_2$ by connecting to the oxide layer 908. However, having a portion of the second reflective layer 912 fixed in close proximity to the first reflective layer 905 and the electrode 904 may lead to short circuits (e.g., due to current leakage from the second reflective layer 912 to the electrode 904). Thus, in the embodiment illustrated in FIGS. 12A-12C, the posts 936 are left unprotected to reduce the risk of short circuits. Some etching of the posts 936 does not appreciably change their structure. Other options for reducing the risk of short circuits and/or protecting the posts 936 are also possible.

FIG. 12B illustrates that the flexible dielectric layer 922 may be patterned similarly to the flexible dielectric layer 922 of FIG. 10C, including release holes 924, opening to the pad 916, and via 926 to the electrode 904. FIG. 12C illustrates the structure 1100 after the sacrificial layer 910 has been removed (e.g., by etching molybdenum with $XeF_2$), thereby creating one or more cavities 934 between the second reflective layer 912 and the optical stack 16. The flexible dielectric layer 922 is capable of deforming when voltages applied across the electrode 904 and the movable reflective element 1150 electrostatically attract the movable reflective element 1150 towards the electrode 904. The second reflective layer 912 contacts the oxide layer 908 when the movable reflective element 1150 is in a first position relative to the first reflective layer 904 (e.g., in an actuated state). However, the second reflective layer 912 does not contact the oxide layer 908 when the movable reflective element 1150 is in a second position relative to the first reflective layer 904 (e.g., in an unactuated state). The column cross section taken along line 92-92 of FIG. 9 would look substantially similar to the structure 901 of FIG. 10F, except that the second reflective layer 912 would not be connected to the oxide layer 908.

Figure 12D:
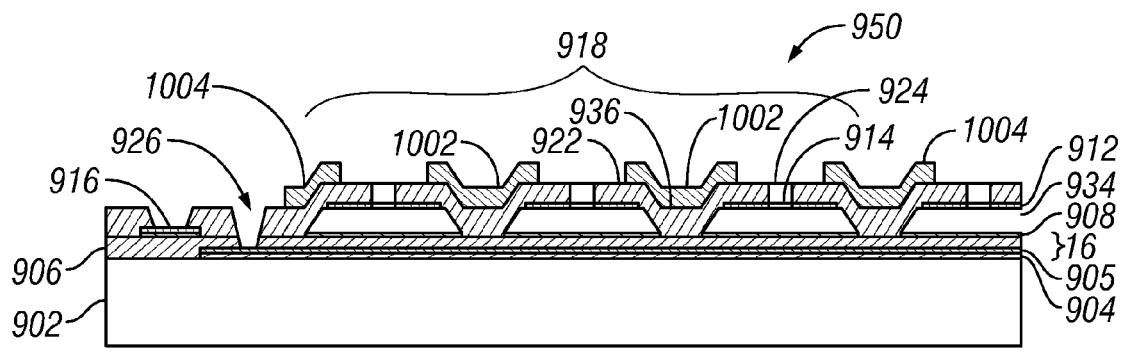
FIG. 12D is a cross section of another example interferometric modulator formed from the intermediate structures of FIGS. 12A-12B taken along line 90-90 of FIG. 9.

FIG. 12D illustrates an embodiment similar to FIG. 12C in which the first reflective layer 912 does not contact the oxide layer 908 in the row direction, as well as comprising the support structures 1002, 1004 described above with respect to FIGS. 11A-11D. In certain embodiments, the column cross section (not shown) of the structure shown in FIG. 12D taken along line 92-92 of FIG. 9 is substantially similar to the structure 1000 of FIG. 11D, except that the second reflective layer 912 is not connected to the oxide layer 908.

Figure 13A:
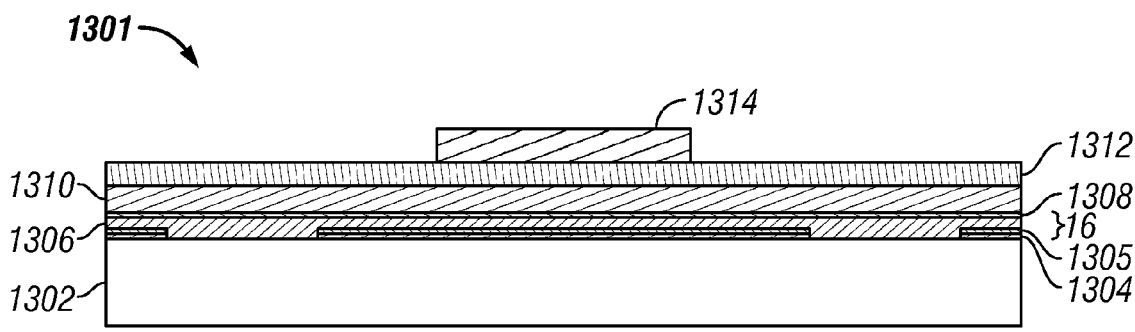
FIGS. 13A-13E are example cross sections of intermediate structures for still another example interferometric modulator.
Figure 13B:
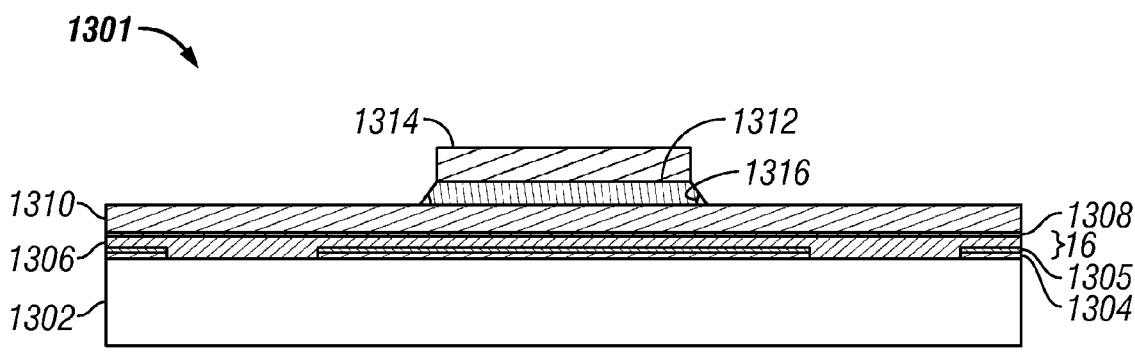
Figure 13C:
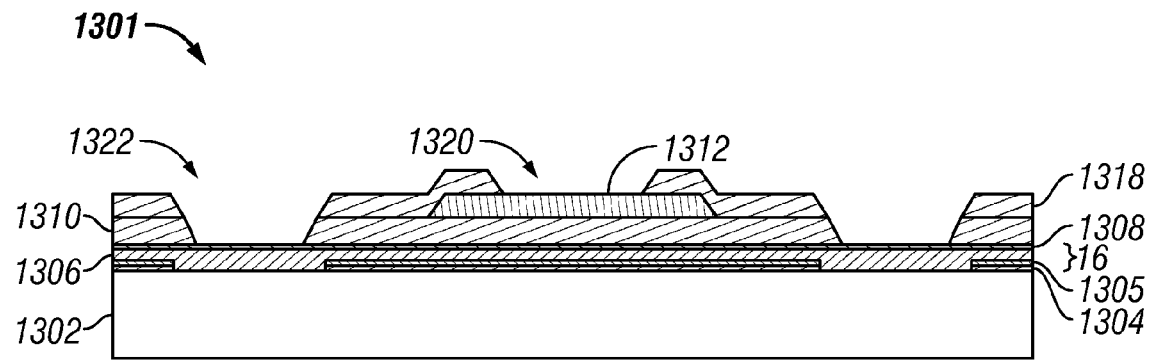
Figure 13D:
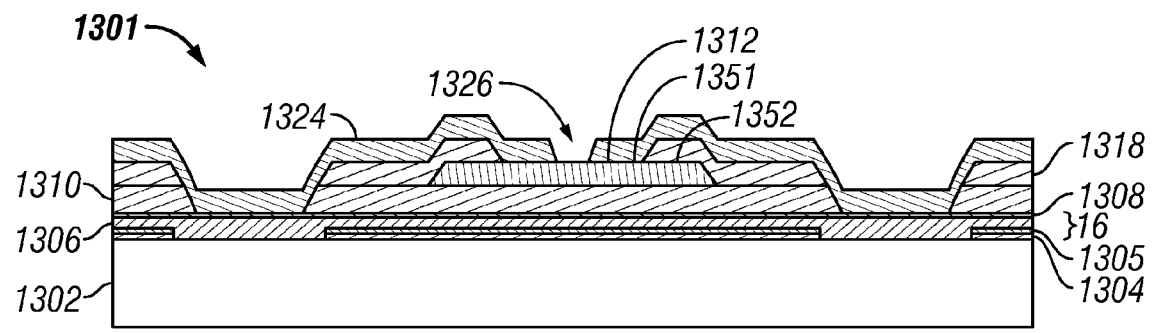
Figure 13E:
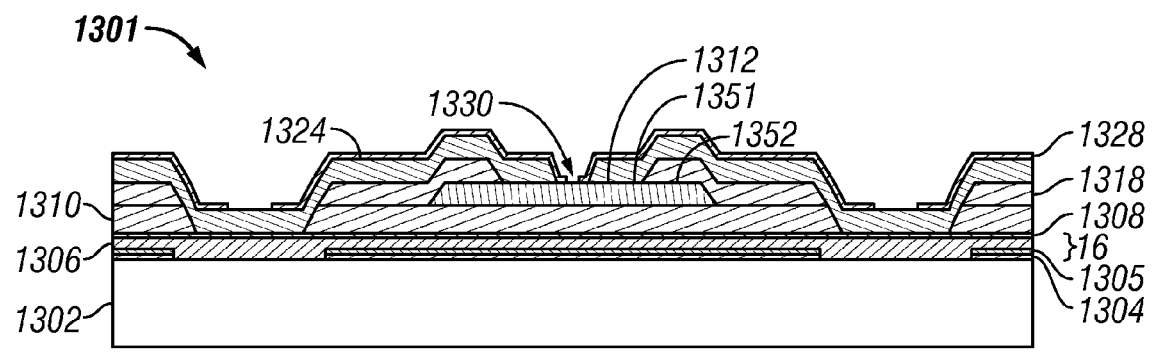
Figure 13F:
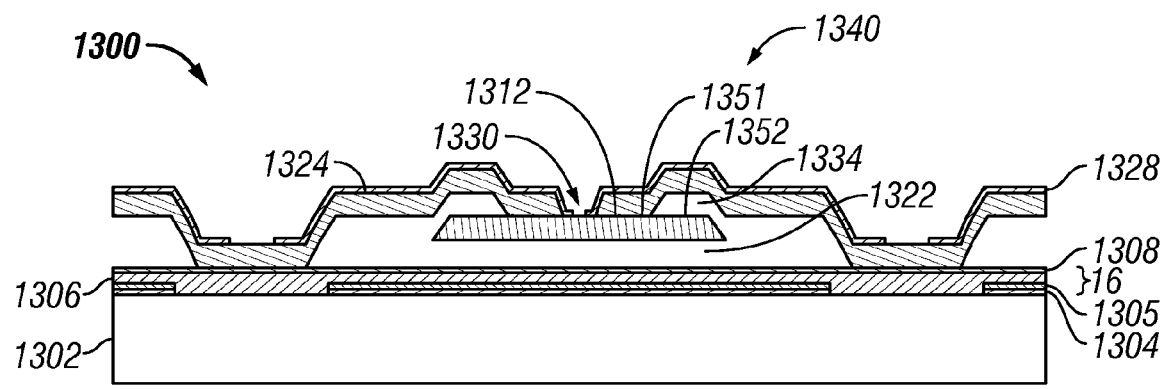
FIG. 13F is a cross section of an example interferometric modulator formed from the intermediate structures of FIGS. 13A-13E.
Figure 14A:
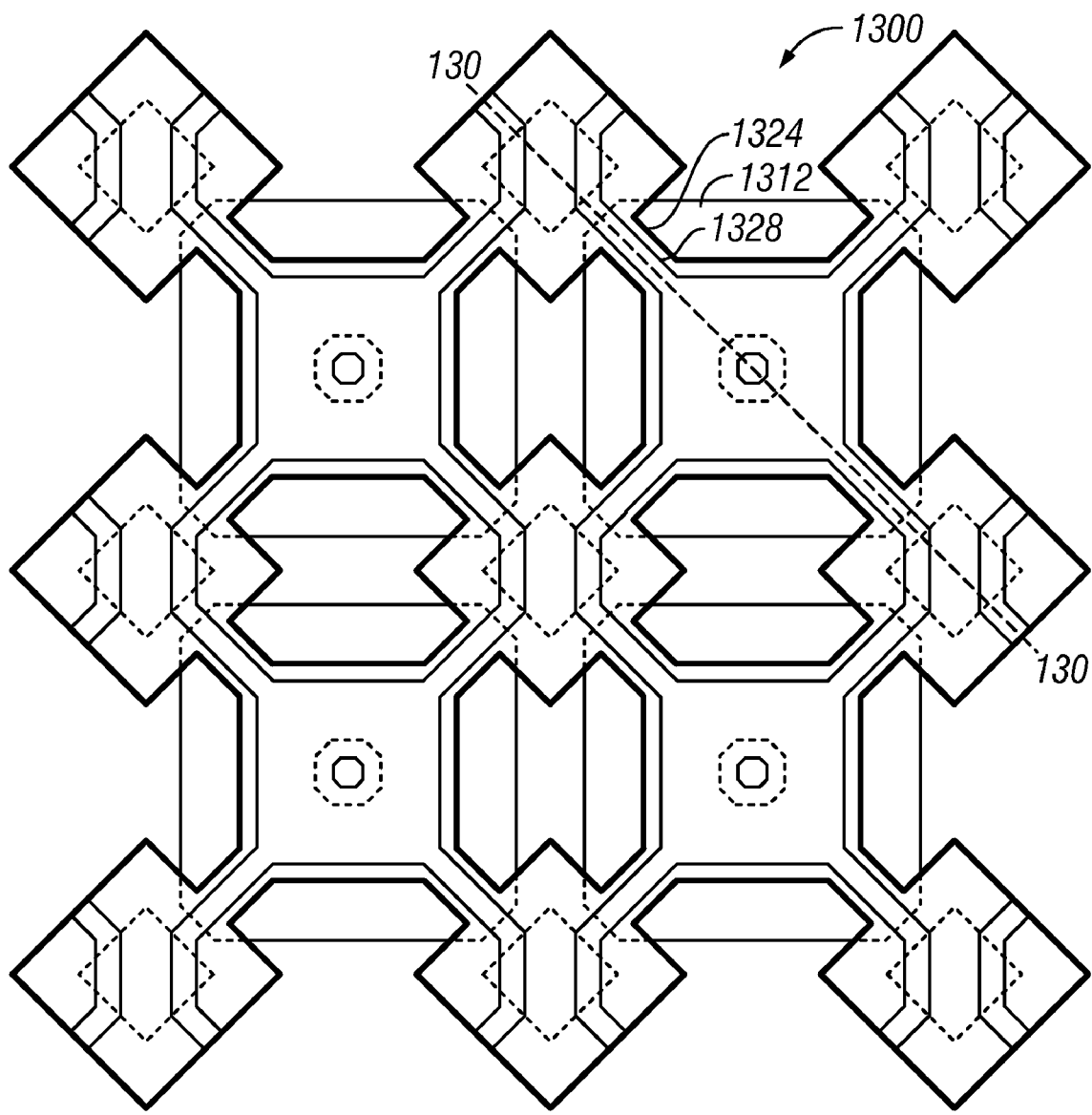
FIG. 14A is a top plan view of another example embodiment of an interferometric modulator array.

FIGS. 13A-13F schematically illustrate an example embodiment of a method of manufacturing a MEMS device 1300. As depicted in FIG. 13F, the MEMS device 1300 comprises at least one electrode 1304, a first reflective layer 1305, and a movable functional element 1340 comprising a flexible dielectric layer 1324 and a reflective element 1312. The at least one electrode 1304 may comprise a transparent conductive material (e.g., ITO, IZO). The first reflective layer 1305 may comprise a partially reflective material (e.g., chromium). The flexible dielectric layer 1324 may comprise $SiO_2$. In certain alternative embodiments, other materials (e.g., $SiN_x$, $SiO_xN_y$, or a composite of dielectric layers such as $AlO_x$, $SiO_2/SiN_x/SiO_2$, $AlO_x/SiN_x/AlO_x$, and $SiN_x$ at least partially surrounded by Al) are used. The reflective element 1312 may comprise a layer of conductive material (e.g., aluminum). The reflective element 1312 has a first portion 1351 mechanically coupled to the flexible dielectric layer 1324 and a second portion 1352 spaced from the flexible dielectric layer 1324 and defining a gap 1334 therebetween. As shown in FIG. 13F, the first portion 1351 of the reflective element 1312 comprises a single central portion of the reflective element 1312, but, in certain embodiments, the first portion 1351 may comprise a plurality of portions, portions along the edges of the reflective element 1312, or other structures. The flexible dielectric layer 1324 flexes in response to voltages applied to the at least one electrode 1304 to move the movable functional element 1340 in a direction generally perpendicular to the first reflective layer 1305. FIG. 14A illustrates a top plan view of an example embodiment of an array of MEMS devices 1300 in which FIG. 13F is a cross section taken along the line 130-130.

FIG. 13A illustrates a structure 1301 comprising a substrate 1302 (e.g., comprising glass, plastic), an electrode 1304 (e.g., comprising ITO), a first reflective layer 1305 (e.g., comprising chromium), an insulating layer 1306 (e.g., comprising $SiO_2$), an oxide layer 1308 (e.g., comprising $Al_2O_3$), a first sacrificial layer 1310 (e.g., comprising molybdenum), and a reflective element 1312 (e.g., comprising between about 2,000 and 20,000 Å of a reflective material such as aluminum, aluminum alloy, silver, silver alloy, etc.). A mask 1314 (e.g., comprising photoresist) for patterning the reflective element 1312 is formed over the reflective element 1312.

In FIG. 13B, the reflective element 1312 has been patterned by etching. As an example, when the reflective element 1312 comprises aluminum or aluminum alloys, $H_3PO_4$ plus acetic acid ($C_2H_4O_2$) (together "PA"), tetramethyl ammonium hydroxide (TMAH), potassium hydroxide (KOH), sodium hydroxide (NaOH), etc. may be used to selectively etch the reflective element 1312 comprising aluminum, but to selectively not etch the first sacrificial layer 1310 comprising molybdenum.

As illustrated in FIG. 13B, etching the reflective element 1312 creates an edge of the reflective element 1312. In certain embodiments, a taper angle 1316 is created between the bottom of the reflective element 1312 and the etched side of the reflective element 1312. In some embodiments, control of this taper angle 1316 aids in correct formation of the device 1300. The taper angle 1316 is between about 30° and 65° relative to the substrate 1302 in some embodiments. Higher angles may be used, for example between 70° and 90°, but may result in poor step coverage for ensuing processes. Lower angles may be used, for example less than about 30°, but may result in small critical dimensions of the reflective element 1312, which may be disadvantageous for embodiments in which the area of the reflective element 1312 is large in order to increase fill factor. Other taper angles 1316 may be suitable for certain processes (e.g., higher angles may be used for processes in which a subsequently deposited layer achieves good step coverage despite a high taper angle 1316). In embodiments in which a wet etch is used to pattern the reflective element 1312, the edge may be curved (e.g., shaped like the edge of a wineglass). Moreover, a wet etch will typically undercut the mask 1314. By contrast, a dry etch generally results in straight tapered edges without an undercut of the mask 1314 (e.g., as illustrated in FIG. 13B).

In certain embodiments, the deposition conditions of the reflective element 1312 may be modified such that multiple layers with different properties are deposited. Such an embodiment may enable control of the taper angle 1316 of the reflective element 1312, for example providing different etch rates throughout its thickness (e.g., slow etch rates at the top of the reflective element 1312 then faster etch rates at the bottom of the reflective element 1312). Alternatively, the etch conditions may be modified during etching in order to change the profile of the edge of the reflective element 1312 or to create a predetermined taper angle 1316. In certain embodiments, both the deposition conditions and the etch conditions are modified. Other embodiments are also possible.

After forming the reflective element 1312, the mask 1314 is removed (e.g., by ashing or chemical strip in embodiments in which the mask 1314 comprises photoresist). A second sacrificial layer 1318 is then deposited. The second sacrificial layer 1318 may comprise the same material as the first sacrificial material 1310 or a different material than the first sacrificial material 1310. For example, in some embodiments, the first and second sacrificial materials 1310, 1318 both comprise molybdenum. As illustrated in FIG. 13C, the first sacrificial layer 1310 and the second sacrificial layer 1318 are then patterned. Patterning of the second sacrificial layer 1318 defines an aperture 1320 through which the reflective element 1312 may be mechanically coupled to the flexible dielectric layer 1324. As described above, the aperture 1320 may comprise a plurality of apertures and may be located, for example, along an edge of the reflective element 1312. In certain embodiments, the patterning of the first sacrificial layer 1310 and the second sacrificial layer 1318 are performed independently, although simultaneous patterning is may be performed. For example, in embodiments in which the first sacrificial layer 1310 and the second sacrificial layer 1318 both comprise molybdenum, an etch using sulfur hexafluoride ($SF_6$) plus oxygen ($O_2$), which is selective to aluminum and $Al_2O_3$, may be used. Other etchants comprising fluorine are also possible, but it will be appreciated that etchants such as $CF_4$ generally react slowly with molybdenum. Etchants comprising chlorine may be used but such etchants may not be sufficiently selective to aluminum and $Al_2O_3$. Alternatively, the second sacrificial layer 1318 and the first sacrificial layer 1310 may be patterned in series using different etchants, a series of different patterning masks, etc.

FIG. 13D illustrates the structure 1301 after a flexible dielectric layer 1324 has been formed over the second sacrificial layer 1318. The flexible dielectric layer 1324 is mechanically coupled to the reflective element 1312 at a first portion 1351 and is spaced from the reflective element 1312 at a second portion 1352. The flexible dielectric layer 1324 also has one or more apertures 1326 to enable electrical connection of the reflective element 1312 to other components.

FIG. 13E illustrates the structure 1301 after a conductive layer 1328 has been formed over the flexible dielectric layer 1324. In a connection area 1330, the conductive layer 1328 may be electrically connected to the reflective element 1312 through the aperture 1326 in the flexible dielectric layer 1324. Although illustrated in FIG. 13E as being in a middle portion of the reflective element 1312, the connection area 1330 may be anywhere along the first portion 1351 (i.e., where the reflective element 1312 is mechanically coupled to the flexible dielectric layer 1324). Etching of the conductive layer 1328 in the connection area 1330 can reduce the area of contact between the flexible dielectric layer 1324 and the reflective element 1312 (i.e., the first portion 1351), thereby decreasing certain effects caused by the difference in the coefficients of thermal expansion of the flexible dielectric layer 1324 and the reflective element 1312.

The conductive layer 1328 may comprise any conductive material, for example, but not limited to, aluminum, aluminum alloy, nickel, chromium, ITO, zinc oxide, combinations thereof, and the like, regardless of their mechanical or optical properties. In embodiments in which the conductive layer 1328 comprises aluminum or aluminum alloy, it may be patterned using a wet etch comprising, for example and without limitation, $H_3PO_4$, PA, KOH, NaOH, or TMAH. In embodiments in which the conductive layer 1328 comprises nickel, the conductive layer 1328 may be patterned using a wet etch comprising dilute $HNO_3$. In embodiments in which the conductive layer 1328 comprises chromium, the conductive layer 1328 may be patterned using a wet etch comprising Cr-14 (available from Cyantek, Inc. of Fremont, Calif.). In embodiments in which the conductive layer 1328 comprises ITO or zinc oxide, the conductive layer 1328 may be patterned using a wet etch comprising hydrochloric acid (HCl), hydrobromic acid (HBr), or ferric chloride ($FeCl_3$) plus HCl plus $HNO_3$. Other etchants are also possible. The conductive layer 1328 may comprise the same material as the reflective element 1312 or a different material than the reflective element 1312. In embodiments in which the conductive layer 1328 is patterned in the connection area 1330, the conductive layer 1328 can be selectively etched with respect to the reflective element 1312 so as to minimize damage to the reflective element 1312. For example, in embodiments in which the conductive layer 1328 comprises ITO and the second sacrificial layer 1318 comprises molybdenum, the etchant may comprise HCl or HBr, and may or may not include $FeCl_3$ or $HNO_3$. Alternatively, in embodiments in which the conductive layer 1328 is not patterned in the connection area 1330, the conductive layer 1328 can be non-selectively etched with respect to the reflective element 1312 but the conductive layer 1328 can be selectively etched with respect to the second sacrificial layer 1318 and/or the flexible dielectric layer 1324. Patterning in the connection area 1330 may be used when the flexible dielectric layer 1324 and reflective element 1312 have a large mismatch in coefficient of thermal expansion (e.g., in embodiments in which the flexible dielectric layer 1324 comprises $SiO_2$ and the reflective element 1312 comprises nickel) to decrease the area of the first portion 1351 of the reflective element 1312 that is mechanically coupled to the flexible dielectric layer 1324. In certain alternative embodiments, additional mask steps may be employed to etch the structures rather than, or in addition to, the use of etch selectivity. For example, in embodiments in which the conductive layer 1328 comprises chromium or ITO and the second sacrificial layer 1318 comprises molybdenum, the aperture 1326, but no other features of the flexible dielectric layer 1324, may be etched, followed by deposition and non-selective patterning of the conductive layer 1328, followed by patterning of the flexible dielectric layer 1324 (e.g., using the conductive layer 1328 as a mask).

FIG. 13F, described above in detail, illustrates the MEMS device 1300 after the first sacrificial layer 1310 and the second sacrificial layer 1318 have been removed (e.g., by etching with $XeF_2$ in embodiments in which the first and second sacrificial layers 1310, 1318 comprise molybdenum) from the structure 1301 of FIG. 13E. The reflective element 1312 is spaced from the oxide layer 1308 by a cavity 1322 where the first sacrificial layer 1310 used to reside, and the second portion 1352 of the reflective element 1312 is spaced from the flexible dielectric layer 1324 by a gap 1334 where the second sacrificial layer 1318 used to reside.

Figure 13G:
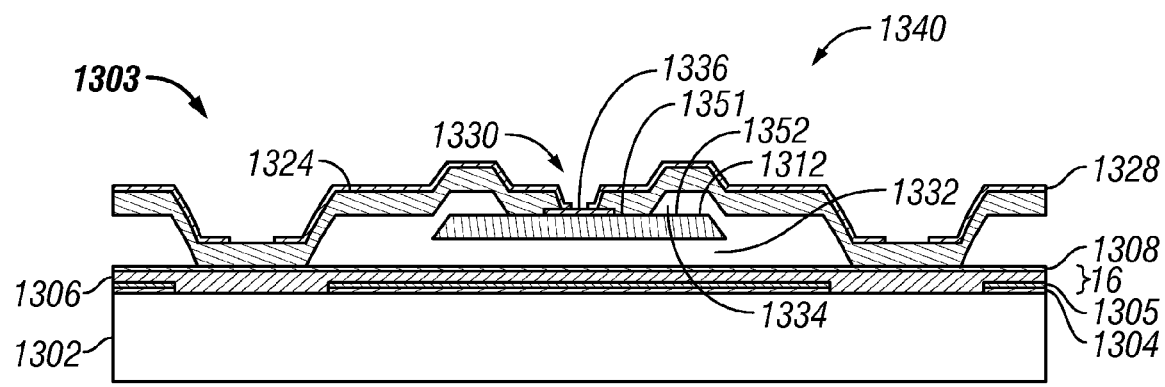
FIG. 13G is a cross section of another example interferometric modulator formed from the intermediate structures of FIGS. 13A-13E.

FIG. 13G illustrates an embodiment in which the MEMS device 1303 comprising an etch stop layer 1336 (e.g., comprising about 100 Å of nickel) formed above the reflective element 1312. In certain such embodiments, the reflective element 1312 comprises a layer of a reflective material (e.g., between about 2,000 and 20,000 Å of aluminum) that acts as a reflective surface.

The etchant for patterning the flexible dielectric layer 1324, which is deposited over the structure 1301 depicted in FIG. 13C, is may be selective such that it does not etch the reflective element 1312. For example, when the flexible dielectric layer 1324 comprises $SiO_2$, the etchant may be a wet etch comprising, for example and without limitation, a buffered oxide etch (BOE), or a dry etch comprising fluorine. In embodiments in which a wet etch is used to pattern the flexible dielectric layer 1324, a wet etch comprising BOE can etch aluminum but may not appreciably etch nickel. Thus, the nickel etch stop layer 1336 protects the aluminum of the reflective element 1312 during patterning of the flexible dielectric layer 1324 (e.g., through the opening 1326). A possible advantage is that the etch stop layer 1336 may also protect the reflective element 1312 in embodiments in which the conductive layer 1328 is patterned in the connection area 1330 and in which the conductive layer 1328 and the reflective element 1312 comprise materials that are not selectively etched. Dry etchants may be selective between dielectrics and aluminum such that the nickel etch stop layer 1336 is not needed to protect the aluminum of the reflective element 1312 during patterning of the flexible dielectric layer 1324.

As described above, the mismatch between the coefficient of thermal expansion of a post (e.g., comprising $SiO_2$) and a deformable layer (e.g., comprising nickel) may cause unstable color at certain operational temperatures. Additionally, the mismatch between the coefficient of thermal expansion of a flexible dielectric layer (e.g., comprising $SiO_2$) and a reflective element (e.g., comprising aluminum) may cause unstable color at certain operational temperatures. For example, $\alpha$-$SiO_2$ has a coefficient of thermal expansion of $2.3 \times 10^{-6}$/K while aluminum has a coefficient of thermal expansion of about $25 \times 10^{-6}$/K. When such a device is heated or cooled, the stress gradient between the flexible dielectric layer and the reflective element may cause a distance between the reflective element and the optical stack to increase or decrease, thereby leading to unstable color as the temperature varies. The effects of such mismatch can be reduced by selecting materials for the bulk of the features that have somewhat similar coefficients of thermal expansion. For example, in embodiments in which the flexible dielectric layer comprises $SiO_2$, the bulk of the reflective element (i.e., the "body portion") can also comprise $SiO_2$ (e.g., as illustrated in FIGS. 15K, 16K, 17C, and 18). However, undoped dielectric materials are generally non-conductive, and thus cannot be attracted by electrostatic forces. Thus, reflective elements comprising a dielectric body portion also comprise a conductive portion.

Figure 15A:
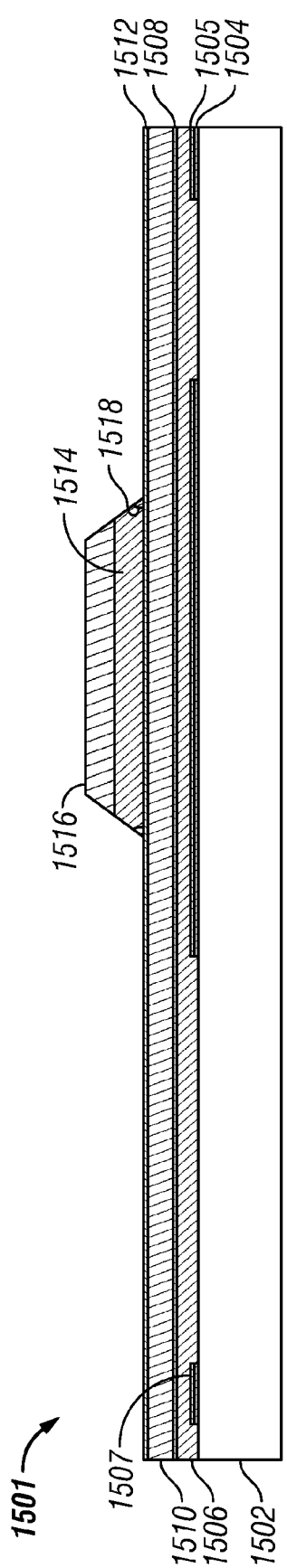
Figure 15B:
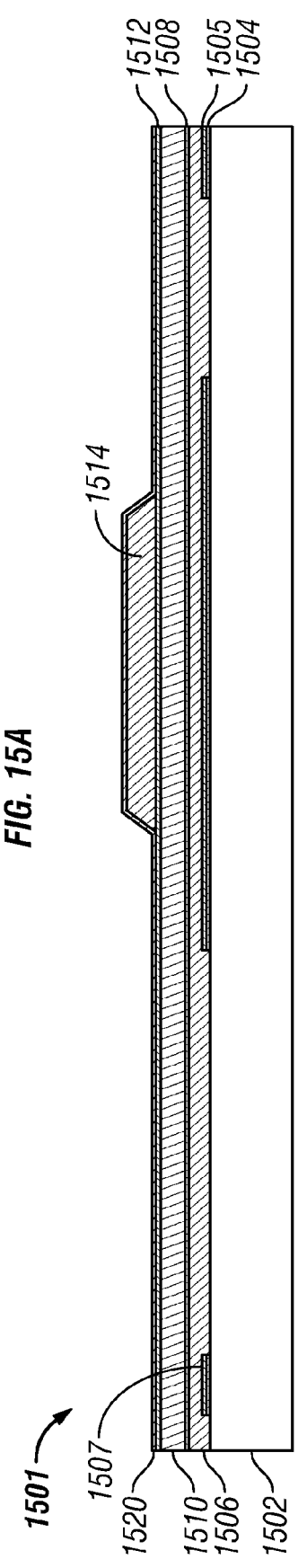
Figure 15C:
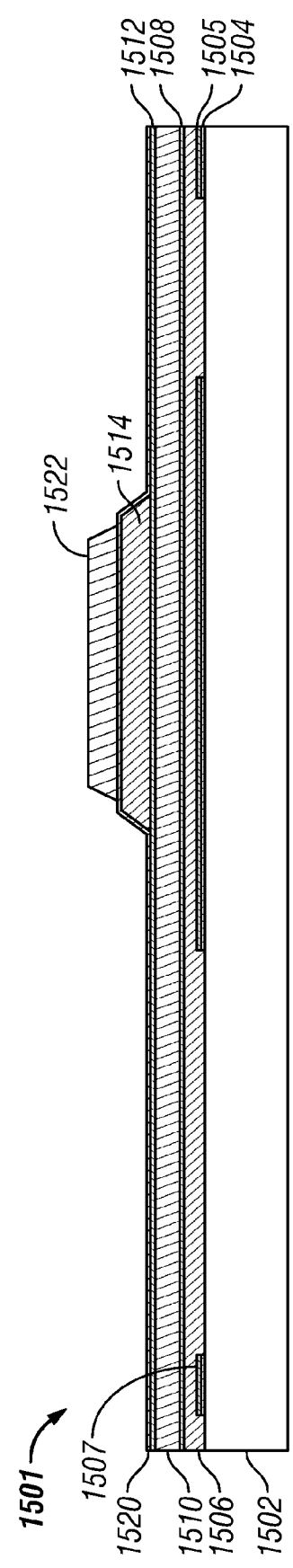
Figure 15G:
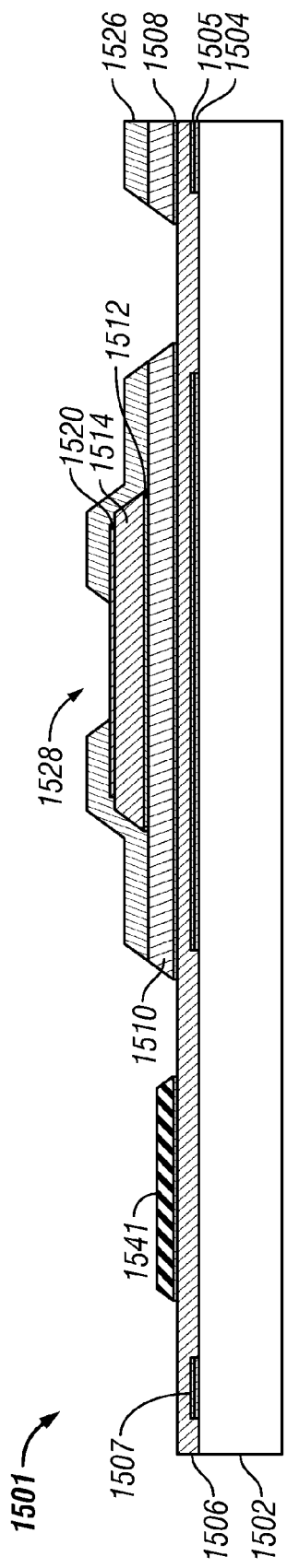
Figure 15H:
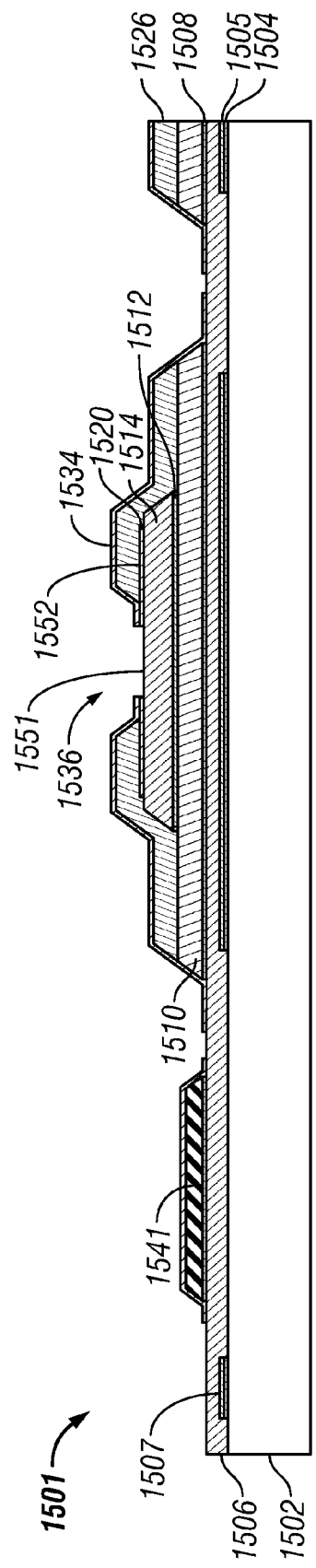
Figure 15K:
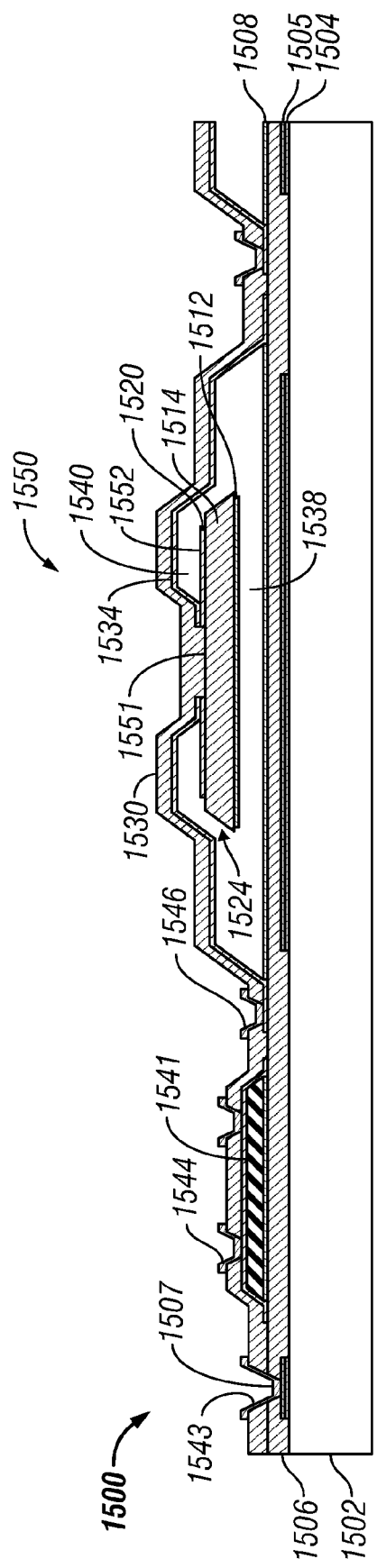

FIGS. 15A-15K schematically illustrate a cross-sectional view of an example embodiment of a method of manufacturing a MEMS device 1500. As depicted in FIG. 15K, the MEMS device 1500 comprises at least one electrode 1504, a first reflective layer 1505, and a movable functional element 1550 comprising a flexible dielectric layer 1530 and a reflective element 1524. The at least one electrode 1504 may comprise a transparent conductive material (e.g., ITO, IZO). The first reflective layer 1505 may comprise a partially reflective material (e.g., chromium). The flexible dielectric layer 1530 may comprise $SiO_2$. In certain alternative embodiments, other materials (e.g., $SiN_x$, $SiO_xN_y$, or a composite of dielectric layers such as $AlO_x$, $SiO_2/SiN_x/SiO_2$, $AlO_x/SiN_x/AlO_x$, and $SiN_x$ at least partially surrounded by Al) may be used.

The reflective element 1524 comprises a second reflective layer 1512 (e.g., comprising aluminum), a dielectric body portion 1514 (e.g., comprising $SiO_2$), and a conductive layer 1520 (e.g., comprising aluminum). When the reflective element 1512 comprises a dielectric body portion 1514, it may be less likely to have curvature and/or tilt when mechanically coupled to a flexible dielectric layer 1530. As described above, embodiments in which the flexible dielectric layer 1530 and the bulk of the reflective element 1524 comprise materials with substantially similar coefficients of thermal expansion may be advantageous for reducing color variability at differing temperatures. The reflective element 1524 has a first portion 1551 mechanically coupled to the flexible dielectric layer 1530 and a second portion 1552 spaced from the flexible dielectric layer 1530 and defining a gap 1540 therebetween. The first portion 1551 of the reflective element 1524 that is mechanically coupled to the flexible dielectric layer 1530 is illustrated in FIG. 15K as a single central portion of the reflective element 1524, but the first portion 1551 may comprise a plurality of portions, portions along the edges of the reflective element 1524, or other configurations. The flexible dielectric layer 1530 flexes in response to voltages applied to the at least one electrode 1504 to move the movable functional element 1550 in a direction generally perpendicular to the first reflective layer 1505.

FIGS. 15A-15K also illustrate an example embodiment of forming routing traces using a conductive layer in conjunction with forming the MEMS device 1500. However, independent formation of the MEMS structure 1500 and signal routing structures is also possible.

FIG. 15A illustrates a structure 1501 comprising a substrate 1502 (e.g., comprising glass, plastic), an electrode 1504 (e.g., comprising ITO, IZO), a first reflective layer (e.g., comprising chromium), an insulating layer 1506 (e.g., comprising $SiO_2$), an oxide layer 1508 (e.g., comprising $Al_2O_3$), a first sacrificial layer 1510 (e.g., comprising molybdenum), a second reflective layer 1512 (e.g., comprising between about 250 and 1,000 Å of aluminum), and a patterned dielectric body portion 1514 (e.g., comprising between about 2,000 Å and 2 µm of $SiO_2$, or between about 5,000 Å and 1 µm of $SiO_2$).

In certain other embodiments, the second reflective layer 1512 comprises any suitably reflective material, for example, but not limited to, metals including aluminum alloy, silver, silver alloy, and gold. There is a trade-off between maintaining the optical properties, such as reflection of the second reflective layer 1512, and minimizing the thickness of the second reflective layer 1512 in order to decrease effects of a mismatched coefficient of thermal expansion with respect to the dielectric body portion 1514. For example, when the reflective layer 1512 comprises aluminum, the optical properties of the reflective layer 1512 may begin to degrade at thicknesses under about 300 Å. About 100 Å of nickel between the second reflective layer 1512 and the dielectric body portion 1514 may be used to act as an etch stop layer (not shown). A mask 1516 (e.g., comprising photoresist) for patterning the dielectric body portion 1514 is formed over the dielectric body portion 1514.

As illustrated in FIG. 15B, etching the dielectric body portion layer 1514 creates an edge of the dielectric body portion 1514. In certain embodiments, a taper angle 1518 is created between the bottom of the dielectric body portion 1514 and the etched side of the dielectric body portion 1514. In some embodiments, control of this taper angle 1518 may aid in correct formation of the device 1500. The taper angle 1518 may be between about 30° and 65° in some embodiments. Higher angles may be used, for example between 70° and 90°, but may result in poor step coverage for ensuing processes. Lower angles may be used, for example less than about 30°, but may result in small critical dimensions of the second reflective layer 1512 in some embodiments, which may be disadvantageous for embodiments in which the area of the second reflective layer 1512 is large in order to increase fill factor. Other taper angles 1518 are suitable for certain processes (e.g., higher angles may be used for processes in which a subsequently deposited layer achieves good step coverage despite a high taper angle 1518, lower angles may be used when critical dimensions are not large, and the like).

The etchant for patterning the dielectric body portion 1514 may be selective such that it does not etch the second reflective layer 1512. For example, when the dielectric body portion 1514 comprises $SiO_2$, the etchant may be a wet etch comprising, for example and without limitation, a BOE, or a dry etch comprising fluorine, for example and without limitation, $SF_6$ plus $O_2$, $CF_4$ plus $O_2$, or carbon triflouride ($CHE_3$) plus $O_2$. In embodiments in which a wet etch is used to pattern the dielectric body portion 1514, the taper of the edge may be curved (e.g., shaped like the edge of a wineglass). Moreover, a wet etch will typically undercut the mask 1516. Furthermore, a wet etch comprising BOE may etch aluminum but may not appreciably etch nickel. Thus, a nickel etch stop layer, for example similar to the etch stop layer 1336 described above, can optionally be used to protect the aluminum of the second reflective layer 1524 during patterning of the dielectric body portion 1514. In certain embodiments, the portions of the second reflective layer 1512 etched by a BOE are subsequently removed (e.g., as described below with respect to FIG. 15D). A dry etch may result in straight tapered edges without an undercut of the mask 1516 (e.g., as illustrated in FIG. 15A). Dry etchants may be selective between dielectrics and aluminum such that a nickel etch stop layer is not needed to protect the aluminum of the second reflective layer 1524 during patterning of the dielectric body portion 1514. As described above, modification of deposition and/or etch parameters may create other profiles of the edge of the dielectric body portion 1514.

After forming the dielectric body portion 1514, the mask 1516 is removed (e.g., by ashing or chemical strip in embodiments in which the mask 1516 comprises photoresist). A conductive layer 1520 (e.g., comprising between about 250 and 1,000 Å of aluminum) is then deposited. While the optical properties of the conductive layer 1520 do not affect the functionality of the MEMS device 1500, the conductive layer 1520 may be conductive and does not exert a large amount of stress on the dielectric body portion 1514. The conductive layer 1520 may comprise the same material as the second reflective layer 1512 or a different material than the second reflective layer 1512. The conductive layer 1520 may comprise the same thickness as the second reflective layer 1512 or a different thickness than the second reflective layer 1512. For example, in some embodiments, the conductive layer 1520 and the second reflective layer 1512 both comprise about 300 Å of aluminum. FIG. 15B illustrates the structure 1501 after the mask layer 1516 has been removed and after a conductive layer 1520 has been deposited.

As described above, the dielectric body portion 1514 may have a different coefficient of thermal expansion than both the second reflective layer 1512 and the conductive layer 1520 because the dielectric body portion 1514 comprises a different material. The thicknesses of the second reflective layer 1512 and the conductive layer 1520 may be thin in comparison to the thickness of the dielectric body portion 1514 such that the forces due to mismatched materials do not substantially affect the shape of the dielectric body portion 1514, and the shape (e.g., planarity) of the second reflective layer 1512. In certain embodiments, the stresses applied to the top of the dielectric body portion 1514 by the conductive layer 1520 and the stresses applied to the bottom of the dielectric body portion 1514 by the second reflective layer 1512 are substantially equal. For example, a material having a particular thickness (e.g., 300 Å of aluminum) will apply a given amount of stress. The thickness of the conductive layer 1520 does not affect the mechanical or optical properties of the device because the conductive layer 1520 does not act as a reflective layer or a restoring layer, but the conductive layer 1520 may be thick enough to conduct an electric current to the second reflective layer 1512.

Figure 14B:
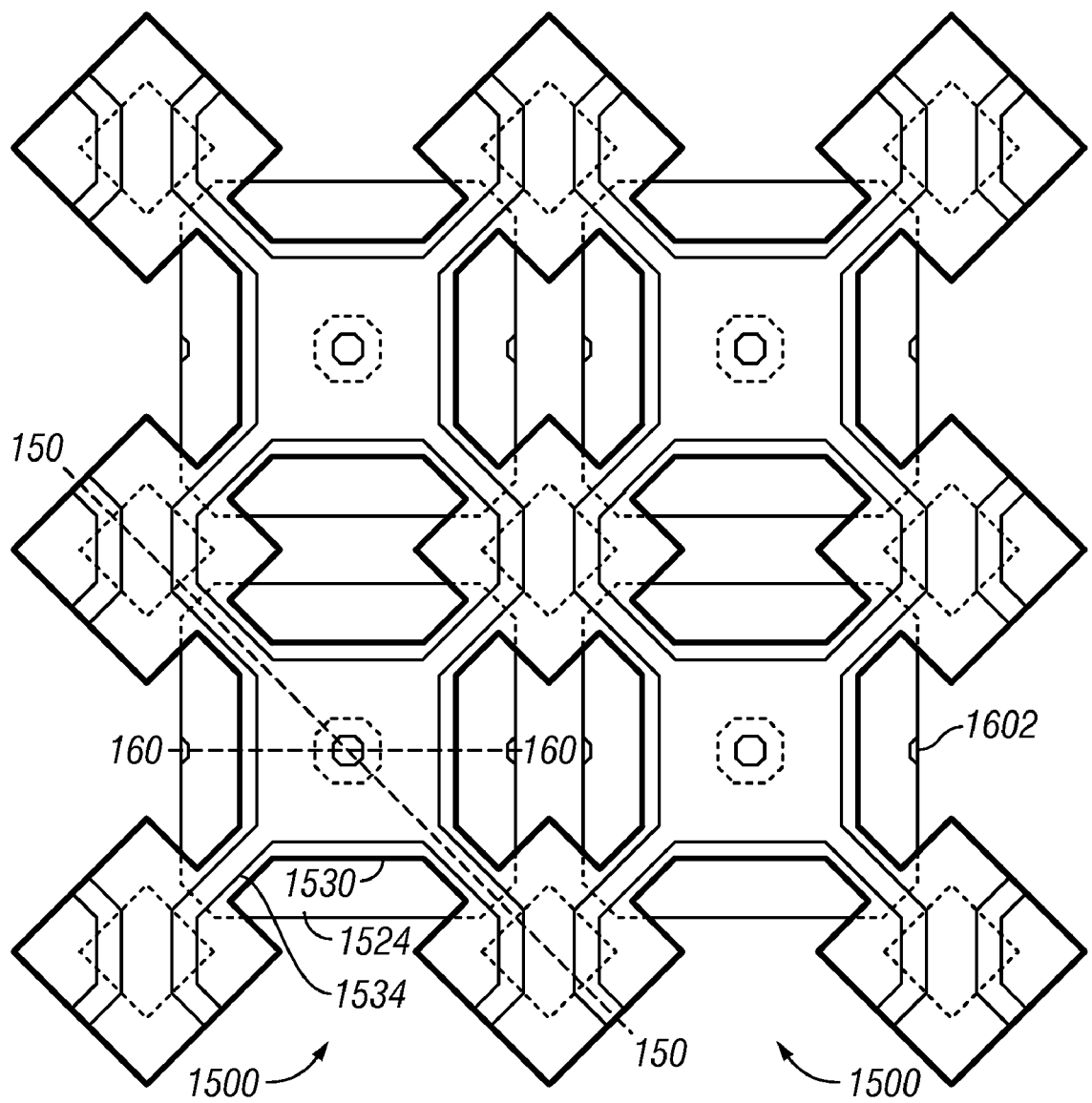
FIG. 14B is a top plan view of yet another example embodiment of an interferometric modulator array.

FIG. 15C illustrates a mask 1522 (e.g., comprising photoresist) formed over the conductive layer 1520 in order to pattern the conductive layer 1520. As shown in FIG. 15D, in certain embodiments, an etch that patterns the conductive layer 1520 may potentially advantageously also be used to pattern the second reflective layer 1512, for example because they comprise the same or similar materials. Some wet etchants (e.g., $HNO_3$ then $H_3PO_4$ at about 40° C.) can etch both nickel and aluminum such that a nickel etch stop layer (not shown) may also be patterned. Although $H_3PO_4$ does not appreciably etch molybdenum or nickel, the $HNO_3$ concentration may be less than about 10% to provide selectivity to a first sacrificial layer 1510 comprising molybdenum. The mask 1522, as well as the dielectric body portion 1514, may be undercut when the etch comprises a wet etch, as illustrated by the gaps at the edges of the conductive layer 1520 and the second reflective layer 1512 in FIG. 15D. In certain alternative embodiments, the conductive layer 1520 and the second reflective layer 1512 are patterned separately (e.g., by patterning the second reflective layer 1512 before depositing the conductive layer 1520). After patterning the conductive layer 1520 and the second reflective layer 1512, the reflective element 1524 has been formed and comprises the second reflective layer 1512, the dielectric body portion 1514, and the conductive layer 1520. In the cross section taken along the line 150-150 of FIG. 14B, the conductive layer 1520 and the second reflective layer 1512 are not in electrical communication.

After forming the reflective element 1524, the mask 1522 is removed (e.g., by ashing or chemical strip in embodiments in which the mask 1522 comprises photoresist). A second sacrificial layer 1526 is then deposited. The second sacrificial layer 1526 may comprise the same material as the first sacrificial material 1510 or a different material than the first sacrificial material 1510. For example, in some embodiments, the first and second sacrificial materials 1510, 1526 both comprise molybdenum. As illustrated in FIG. 15E, the first sacrificial layer 1510 and the second sacrificial layer 1526 are then patterned. In certain embodiments, the patterning of the first sacrificial layer 1510 and the second sacrificial layer 1526 are performed independently, although simultaneous patterning may be used. For example, in embodiments in which the first sacrificial layer 1510 and the second sacrificial layer 1526 both comprise molybdenum, an etch using $SF_6$ plus $O_2$, which is selective to aluminum and $Al_2O_3$, may be used. Other etchants comprising fluorine are also possible, but it will be appreciated that etchants such as $CF_4$ may react slowly with molybdenum. Etchants comprising chlorine may be used, but such etchants may not be sufficiently selective to aluminum and $Al_2O_3$. Alternatively, the second sacrificial layer 1526 and the first sacrificial layer 1510 may be patterned in series using different etchants, a series of different patterning masks, etc.

In some embodiments, the second sacrificial layer 1526 is partially patterned (e.g., as illustrated in FIG. 1SE). FIG. 15F illustrates the formation of a routing structure 1541 after partially patterning the second sacrificial layer 1526. Formation of the routing structure 1541 comprises deposition of routing structure material (e.g., comprising aluminum or aluminum alloy), forming a mask over portions of the routing structure material, and etching the portions of the routing structure material not covered by the mask (e.g., using $H_3PO_4$ or PA in embodiments in which the routing structure material comprises aluminum). FIG. 15G illustrates additional patterning of the second sacrificial layer 1526 to define an aperture 1528 through which the reflective element 1524 is mechanically coupled to the flexible dielectric layer 1530, as described more fully below. In embodiments in which the routing structure 1541 and the conductive layer 1520 comprise the same material, patterning of the routing structure 1541 may damage the conductive layer 1520 if the aperture 1528 has been formed (e.g., because the etchant of the routing structure material may access the conductive layer 1520 through the aperture 1528). Thus, partial patterning of the second sacrificial layer 1526 covers the conductive layer 1520, which protects the conductive layer 1520 during etching of the routing structure material. Other methods of manufacturing that protect the conductive layer 1520 during patterning of the routing structure 1541 are also possible. For example, in some embodiments, an etch stop layer (e.g., comprising nickel) over the conductive layer 1520 may cover the conductive layer 1520 and protect the conductive layer 1520 during etching of the routing structure material. For another example, in certain embodiments, the signal routing structure 1541 is not formed after patterning of the second sacrificial layer 1526 (e.g., by being patterned after formation of the MEMS device 1500). In certain such embodiments, a single patterning of the second sacrificial layer 1526 defines the aperture 1528 through which the reflective element 1524 may be mechanically coupled to the flexible dielectric layer 1530. However, the second sacrificial layer 1526 may be selectively etched with respect to the conductive layer 1520 so as to decrease potential damage to the reflective element 1524.

As illustrated in FIG. 15G, after forming the routing structure 1541, the second sacrificial layer 1526 is patterned to define an aperture 1528 through which the reflective element 1524 may be mechanically coupled to the flexible dielectric layer 1530. The aperture 1528 may comprise a plurality of apertures and may be located, for example along an edge of the reflective element 1524.

FIG. 15H illustrates the structure 1501 after a conductive layer 1534 has been formed over the second sacrificial layer 1526. In a connection area 1536, the conductive layer 1534 is electrically connected to the reflective element 1524 through the aperture 1528 in the second sacrificial layer 1526. Although illustrated as being in a middle portion of the reflective element 1524, the connection area 1536 may be anywhere along the first portion 1551 (i.e., where the reflective element 1524 is mechanically coupled to the flexible dielectric layer 1530). Etching of the conductive layer 1534 in the connection area 1536 may be used, for example to reduce stresses and/or to allow mechanical coupling of the flexible dielectric layer 1530 with the dielectric body portion 1514.

The conductive layer 1534 may comprise any conductive material, for example, but not limited to, aluminum, aluminum alloy, nickel, chromium, ITO, zinc oxide, combinations thereof, and the like, regardless of their mechanical or optical properties. In embodiments in which the conductive layer 1534 comprises aluminum or aluminum alloy, the conductive layer 1534 may be patterned using a wet etch comprising, for example and without limitation, $H_3PO_4$, PA, KOH, NaOH, or TMAH. In embodiments in which the conductive layer 1534 comprises nickel, the conductive layer 1534 may be patterned using a wet etch comprising dilute $HNO_3$. In embodiments in which the conductive layer 1534 comprises chromium, the conductive layer 1534 may be patterned using a wet etch comprising Cr-14. An etch comprising Cr-14 can etch molybdenum, so in embodiments in which the conductive layer 1534 comprises chromium, the sacrificial layer 1526 may comprise a material that is resistant to etching by Cr-14 (e.g., amorphous silicon). In embodiments in which the conductive layer 1534 comprises ITO or zinc oxide, the conductive layer 1534 may be patterned using a wet etch comprising HCl, HBr, or $FeCl_3$ plus HCl plus $HNO_3$. An etch comprising $FeCl_3$ plus HCl plus $HNO_3$ can etch molybdenum, so in embodiments in which the conductive layer 1534 comprises ITO or zinc oxide, the sacrificial layer 1526 may comprise a material that is resistant to etching by $FeCl_3$ plus HCl plus $HNO_3$ (e.g., amorphous silicon). Other etchants that are selective to the first and second sacrificial layers 1510, 1526 are also possible. The conductive layer 1534 may comprise the same material as the conductive layer 1520 or a different material than the conductive layer 1520. However, the conductive layer 1534 may be selectively etched with respect to the conductive layer 1520 so as to decrease damage to the reflective element 1524. Alternatively, the conductive layer 1534 can be non-selectively etched with respect to the conductive layer 1520 such that the conductive layer 1520 is etched during the conductive layer 1534 patterning process. In either embodiment, the conductive layer 1534 may be selectively etched with respect to the first sacrificial layer 1510 and the second sacrificial layer 1526.

FIG. 15I illustrates the structure 1501 after a flexible dielectric layer 1530 has been formed over the conductive layer 1534. The flexible dielectric layer 1530 is mechanically coupled to the reflective element 1524 at a first portion 1551 and is spaced from the reflective element 1524 at a second portion 1552.

In certain embodiments, the flexible dielectric layer 1530 electrically insulates the routing structure 1541. Patterning of the flexible dielectric layer 1530 is performed in certain embodiments to form apertures 1542 to expose the routing structure 1541, an aperture 1509 (also through the insulator 1506) to expose a routing pad 1507, and an aperture 1545 to expose the conductive layer 1534. FIG. 15J illustrates structure 1501 after the formation of bus lines 1543, 1544, 1546 in the apertures 1509, 1542, 1545, respectively.

FIG. 15K, described above in detail, illustrates the MEMS device 1500 after the first sacrificial layer 1510 and the second sacrificial layer 1526 have been removed (e.g., by etching with $XeF_2$ in embodiments in which the first and second sacrificial layers 1510, 1526 comprise molybdenum) from the structure 1501 of FIG. 15J. In embodiments in which the sacrificial layers 1510, 1526 comprise molybdenum and are etched with $XeF_2$, any $SiO_2$ that is exposed to the $XeF_2$ may also be slightly etched. When the flexible dielectric layer 1530 comprises $SiO_2$, it may be etched by the $XeF_2$ by about 50-100 Å during the etching of the first and second sacrificial layers 1510, 1526, depending on process parameters (e.g., selectivity to the sacrificial layers, process time, pressure, temperature, etc.). When the flexible dielectric layer 1530 comprises about 3,000 Å of $SiO_2$, for example, such etching may affect the mechanical properties of the flexible dielectric layer 1530. Other examples of flexible dielectric layers 1530 in which the mechanical properties may be affected by such etching include, but are not limited to, (1) about 3,000 Å of $AlO_x$, (2) about 100 Å of $SiO_2$/between about 1,000 and 10,000 Å of $SiN_x$/about 100 Å of $SiO_2$, (3) about 100 Å of $AlO_x$/between about 1,000 and 10,000 Å of $SiN_x$/about 100 Å of $AlO_x$, and (4) about 100 Å of Al/between about 1,000 and 10,000 Å of $SiN_x$/about 100 Å of Al. In certain such embodiments, some of the $SiO_2$ may be consumed by being etched by the $XeF_2$, and the $SiO_2$ layer may take such etching into account (e.g., by being thicker). Silicon nitrides are very etchable by $XeF_2$, so flexible dielectric layers 1530 comprising $SiN_x$ may be protected by thin layers of a material such as Al, $AlO_x$, $SiO_2$, and the like. In the embodiment illustrated in FIGS. 15A-15K, the conductive layer 1534, which is resistant to $XeF_2$ etch when it comprises aluminum, advantageously protects the flexible dielectric layer 1530 from being etched such that the mechanical properties of the flexible dielectric layer 1530 are not affected. The reflective element 1524 is spaced from the oxide layer 1508 by a cavity 1538 where the first sacrificial layer 1510 used to reside, and the second portion 1552 of the reflective element 1524 is spaced from the flexible dielectric layer 1530 (and the conductive layer 1534) by a gap 1540 where the second sacrificial layer 1526 used to reside.

Figure 16A:
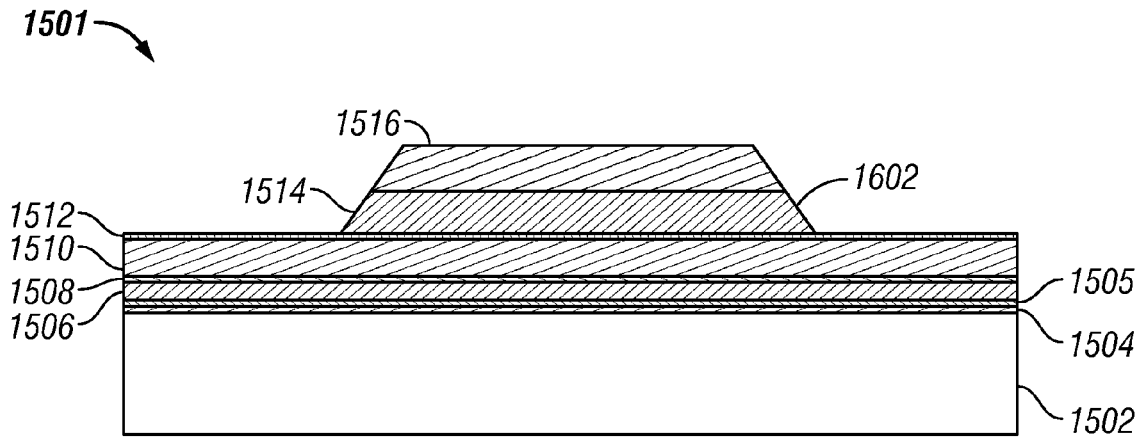
FIGS. 16A-16K are cross sections of the example embodiment of the method of fabricating the interferometric modulator of FIGS. 15A-15K taken along line 160-160 of FIG. 14.
Figure 16B:
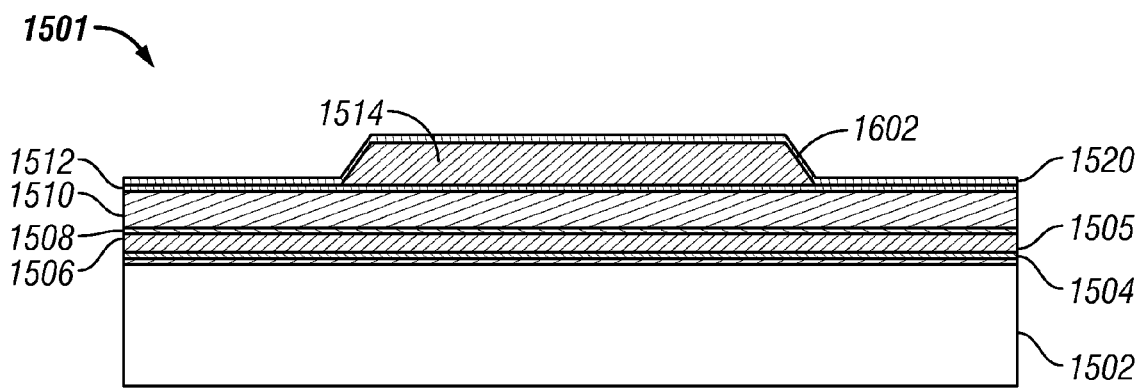
Figure 16C:
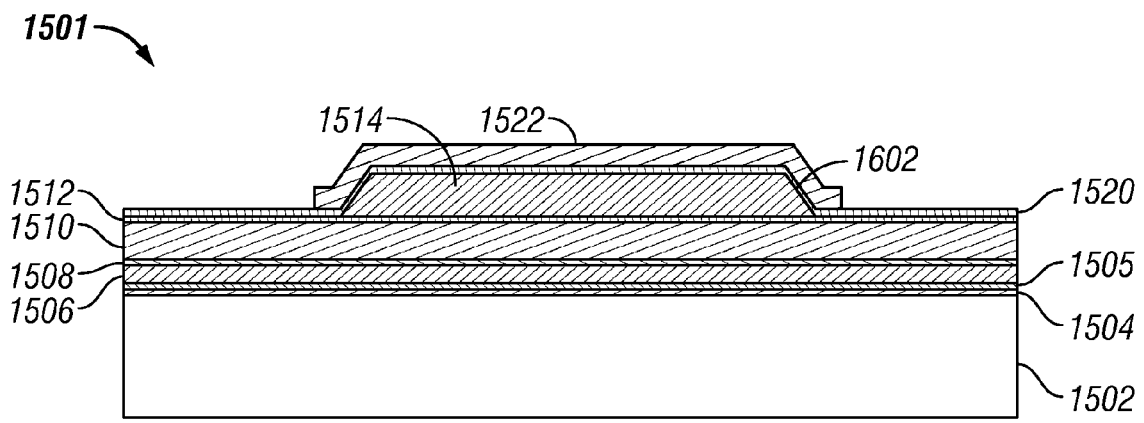
Figure 16D:
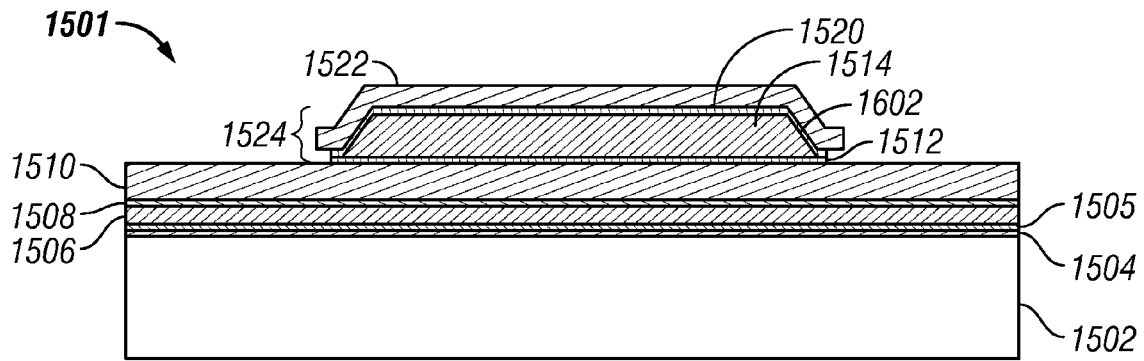
Figure 16E:
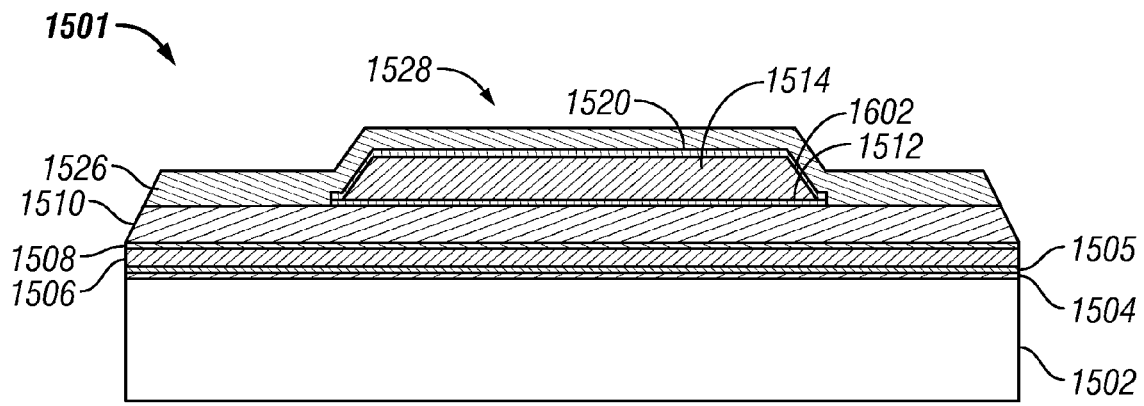
Figure 16F:
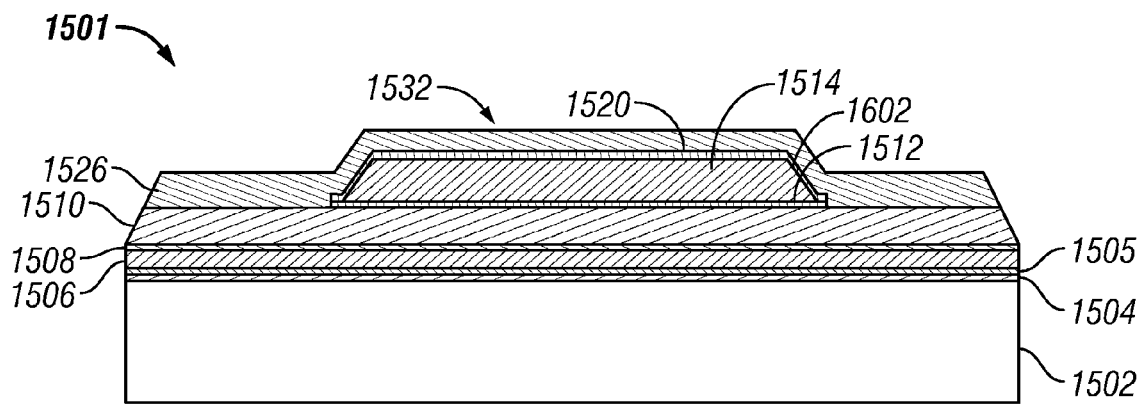
Figure 16G:
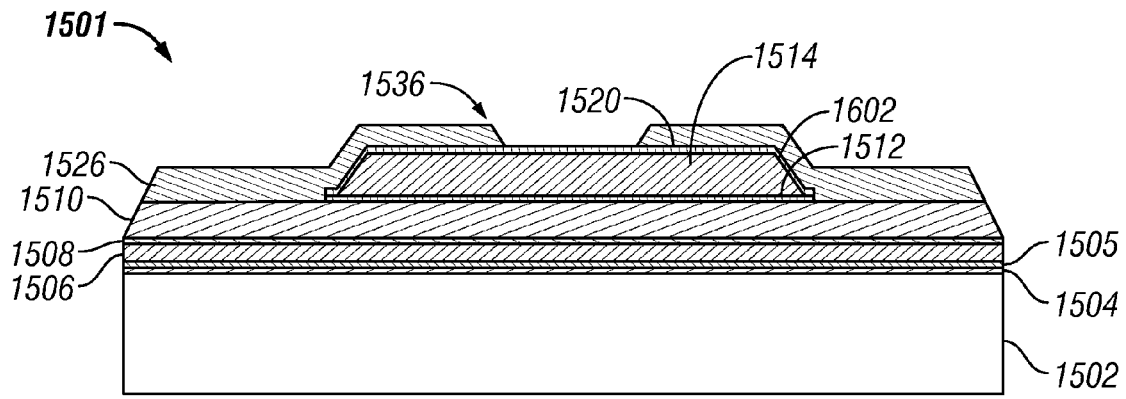
Figure 16H:
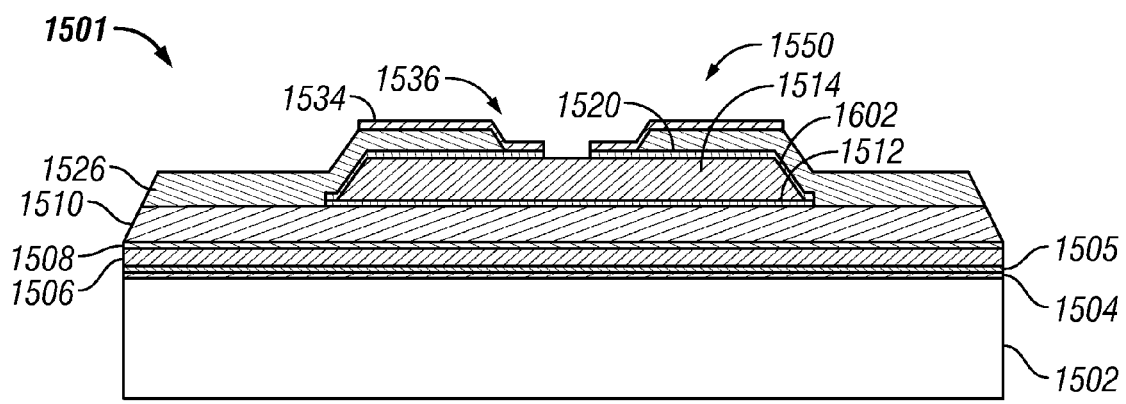
Figure 16I:
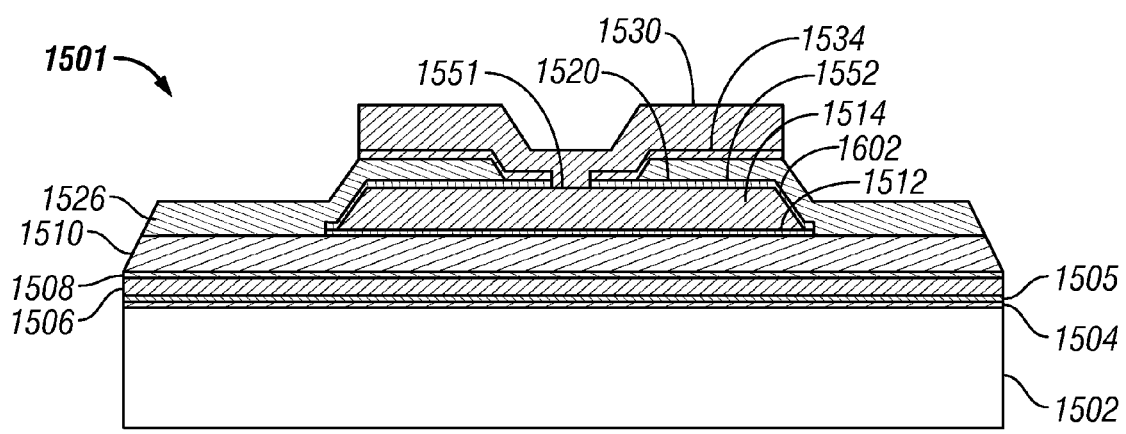
Figure 16J:
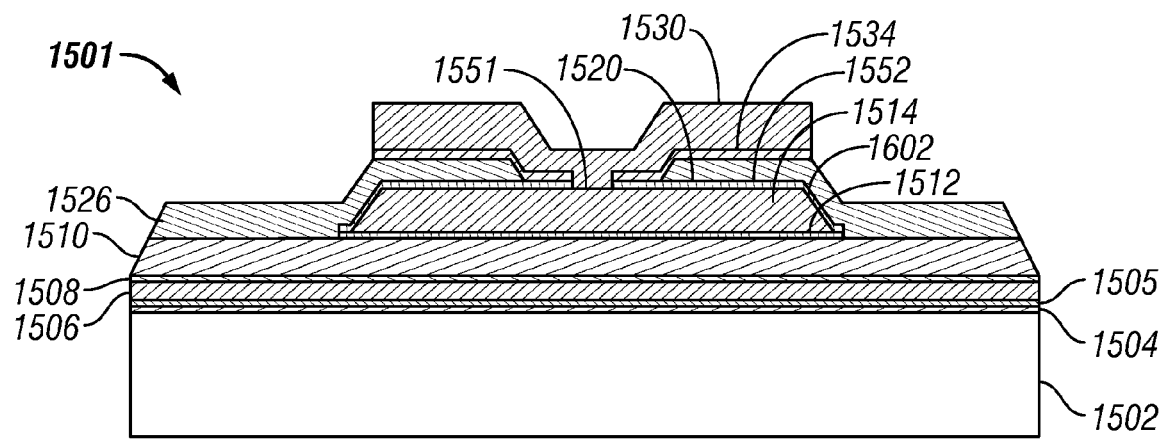
Figure 16K:
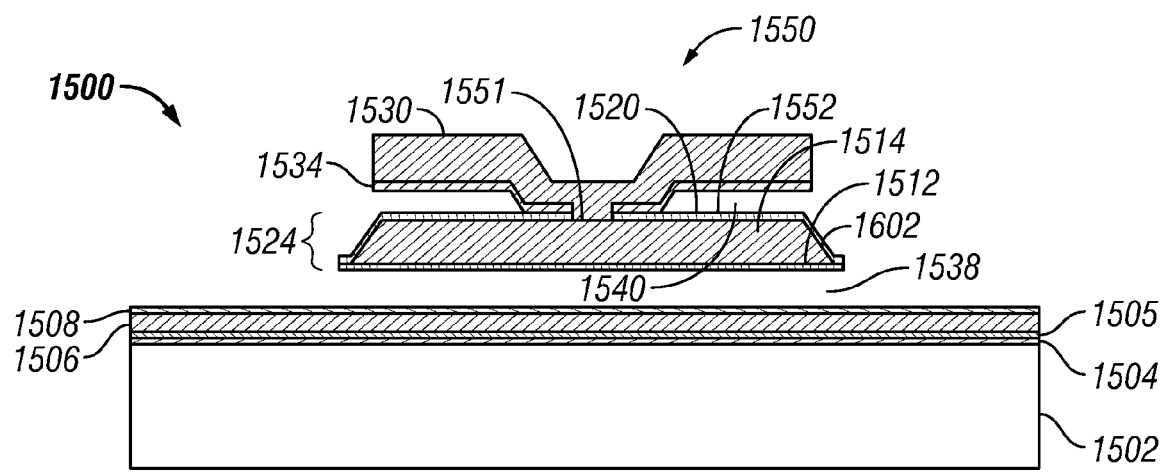

FIGS. 16A-16K schematically illustrate a cross-sectional view of an example embodiment of a method of manufacturing a MEMS device 1500 taken along the line 160-160 in FIG. 14B. For simplicity, FIGS. 16A-16K illustrate only certain steps in which the processing of the 160-160 cross section substantially differs (e.g., when a cross section of a patterning mask has a different shape) from the processing of the 150-150 cross section, described above for FIGS. 15A-15K. The relative widths of the reflective element 1524 in FIGS. 15K and 16K are not illustrated to scale. For example, referring again to FIG. 14B, the width of the reflective element 1524 taken along a diagonal line (e.g., the line 150-150) would be wider than the width of the reflective element 1524 taken along a horizontal line (e.g., the line 160-160).

In certain embodiments, the conductive layer 1520 is in electrical communication with the second reflective layer 1512 via a communication path. In the embodiment illustrated of the MEMS devices 1500 of FIGS. 14 and 16K, the communication path is within a pair of features (or "notches") 1602 in an edge of the dielectric body portion 1514 (illustrated as the lateral edges of the dielectric body portion 1514 in FIGS. 16A-16K). In certain embodiments, only one edge of the dielectric body portion 1514 comprises a notch 1602. In embodiments in which a plurality of edges of the dielectric body portion 1514 comprise a notch 1602 or a plurality of notches, the notches may be substantially equal in size and on opposite sides of the reflective element 1524 (i.e., are mirror images of one another) so as to balance the weight of the reflective element 1524. Additional embodiments of the electrical communication path between the conductive layer 1520 and the second reflective layer 1512 are described below with respect to FIGS. 20A-21B, but any combination of deformable layers and reflective elements are possible.

The flexible dielectric layer 1530 is not shown to be directly contacting the optical stack 16 in the cross sectional view of FIGS. 16A-16G because, as illustrated in FIG. 14B, the flexible dielectric layer 1530 instead contacts the optical stack 16 in the corners of the MEMS device 1500 along the line 150-150. However, in different embodiments, the flexible dielectric layer 1530 contacts the optical stack 16 on two sides of the reflective element 1524, on a plurality of sides of the reflective element 1524, or on all sides of the reflective element 1524.

Referring now to FIG. 16C, the mask layer 1522 that is used to pattern the second reflective layer 1512 and the conductive layer 1520 overlaps the edges of the dielectric body portion 1514 in the notches 1602. The overlap of the dielectric body portion 1514 by the mask layer 1522 is such that etching of the unexposed portions of the conductive layer 1520 may leave portions of the conductive layer 1520 connected to the second reflective layer 1512. However, in embodiments in which the layers 1512, 1520 are relatively thin (e.g., together about 600 Å, as described above), the overlap of the conductive layer 1520 by the mask layer 1522 being too large may cause fraying to occur at the edges of the second reflective layer 1512. Fraying can result in undesirable colors or reflection at the lateral edges of the reflective element 1524. However, too little overlap may result in a lack of electrical communication between the second reflective layer 1512 and the conductive layer 1520. Similar to the undercut of the conductive layer 1520 in FIG. 15D, the mask layer 1522 may be undercut (e.g., as depicted in FIG. 16D), which may exacerbate the effects of too little overlap or too much etch resulting in excess undercut. The patterning of the conductive layer 1534 and the flexible dielectric layer 1530 in FIGS. 16H and 16I, respectively, may have different cross-sectional structures than the conductive layer 1534 and the flexible dielectric layer 1530 illustrated in FIGS. 15H and 15I because the masks for patterning the conductive layer 1534 and the flexible dielectric layer 1530 have correspondingly different cross-sections. The structures illustrated in FIGS. 16G-16K can also refer to similar structures in certain embodiments other Figures described herein.

Figure 17C:
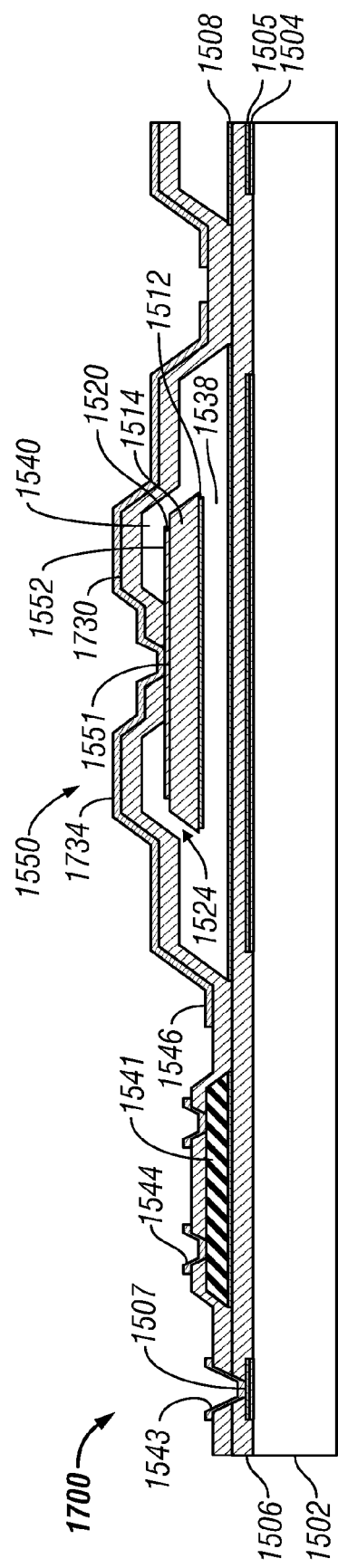

FIG. 17C illustrates a cross-section of another example embodiment of an interferometric modulator 1700 of the interferometric modulator array of FIG. 14B taken along the line 150-150. The MEMS device 1700 comprises an electrode 1504, a first reflective layer 1505, and a movable functional element 1550. The movable functional element 1550 comprises a flexible dielectric layer 1730 and a reflective element 1524 having a first portion 1551 mechanically coupled to the flexible dielectric layer 1730 and a second portion 1552 spaced from the flexible dielectric layer 1730 and defining a gap 1540 therebetween. The flexible dielectric layer 1730 flexes in response to voltages applied to the electrode 1504 (i.e., due to electrostatic attraction of the reflective element 1524) to move the functional element 1550 in a direction generally perpendicular to a first reflective layer 1505.

The reflective element 1524 comprises a second reflective layer 1512, a dielectric body portion 1514, and a conductive layer 1520. When the reflective layer 1512 comprises a dielectric body portion 1514, it may be less likely to have curvature and/or tilt when mechanically coupled to a flexible dielectric layer 1730. As described above, embodiments in which the flexible dielectric layer 1730 and the bulk of the reflective element 1524 comprise materials with substantially similar coefficient thermal expansion may be advantageous for reducing color variability at differing temperatures.

FIG. 17A-17C illustrate an example embodiment of a method of manufacturing the MEMS device 1700 of FIG. 17C beginning with the structure 1501 of FIG. 15G. Thus, the structure 1701 comprises the substrate 1502, the optical stack 16, the sacrificial layers 1510, 1526, the routing structures 1507, 1541, and the reflective element 1524. However, as depicted at FIG. 17A, rather than forming a conductive layer 1534 over the second sacrificial layer 1526, a flexible dielectric layer 1730 is formed over the second sacrificial layer 1526. The flexible dielectric layer 1730 is mechanically coupled to the reflective element 1524 at a first portion 1551 and is spaced from the reflective element 1524 at a second portion 1552. The flexible dielectric layer 1730 has an aperture 1532 to enable electrical connection of the reflective element 1524 to other components. Similar to FIG. 15I, patterning of the flexible dielectric layer 1730 is performed in certain embodiments to form apertures 1542 to expose the routing structure 1541 and an aperture 1509 (also through the insulator 1506) to expose the routing pad 1507, but no aperture 1545 because the conductive layer 1734 will be formed over the flexible dielectric layer 1730.

FIG. 17B illustrates the structure 1701 after a conductive layer 1734 has been formed over the flexible dielectric layer 1730. In a connection area 1536, the conductive layer 1734 is electrically connected to the reflective element 1524 through the aperture 1532 in the flexible dielectric layer 1730. Although illustrated in a middle portion of the reflective element 1524, the connection area 1536 may be anywhere along the first portion 1551 (i.e., where the reflective element 1524 is mechanically coupled to the flexible dielectric layer 1730). Etching of the conductive layer 1734 in the connection area 1536 may be performed, for example, to reduce stress, but is optional. In the embodiment illustrated in FIG. 17B, the conductive layer 1734 is not etched in the central area 1536.

The materials and etchants for forming the flexible dielectric layer 1730 and the conductive layer 1734 may be similar to those described for the flexible dielectric layer 1530 and the conductive layer 1534 described above, respectively (e.g., comprising HCl, HBr, or $FeCl_3$ plus HCl plus $HNO_3$ for the flexible dielectric layer 1730 and comprising $H_3PO_4$, PA, KOH, NaOH, or TMAH for the conductive layer 1734). In FIG. 17B, rather than performing an additional step to form the bus lines 1543, 1544, 1546, as illustrated in FIG. 15J, the conductive layer 1734 may be used to form the bus lines 1543, 1544, 1546. Thus, the method illustrated in FIGS. 15A-15G and 17A-17C may potentially advantageously reduce the number of mask layers used to fabricate the MEMS device 1700 versus the number of mask layers used to fabricate the MEMS device 1500.

FIG. 17C illustrates the structure 1701 after the first sacrificial layer 1510 and the second sacrificial layer 1526 have been removed (e.g., by etching with $XeF_2$ in embodiments in which the first and second sacrificial layers 1510, 1526 comprise molybdenum) from the structure 1701 of FIG. 17B, thereby forming the MEMS device 1700. In embodiments in which the sacrificial layers 1510, 1526 comprised molybdenum and are etched with $XeF_2$, any $SiO_2$ that is exposed to the $XeF_2$ may also be slightly etched. Unlike FIG. 15J, where the surface of the flexible dielectric layer 1530 facing the reflective element 1524 is protected by the conductive layer 1534, the flexible dielectric layer 1730 is exposed to such an etch.

Thus, when the flexible dielectric layer 1730 comprises $SiO_2$, it may be etched by the $XeF_2$ by about 50-100 Å during the etching of the first and second sacrificial layers 1510, 1526, depending on process parameters (e.g., selectivity to the sacrificial layers, process time, pressure, temperature, etc.). When the flexible dielectric layer 1730 comprises about 3,000 Å of $SiO_2$, for example, such etching may affect the mechanical properties of the flexible dielectric layer 1730. After etching the first and second sacrificial layers 1510, 1526, the reflective element 1524 is spaced from the oxide layer 1508 by a cavity 1538 where the first sacrificial layer 1510 used to reside, and the second portion 1552 of the reflective element 1524 is spaced from the flexible dielectric layer 1730 by a gap 1540 where the second sacrificial layer 1526 used to reside.

Figure 18:
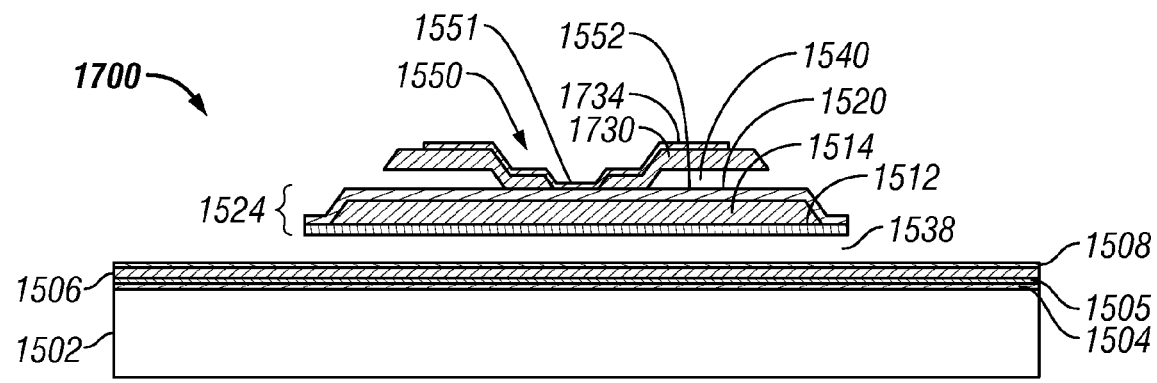
FIG. 18 is a cross section of the example embodiment of the method of fabricating the interferometric modulator of FIGS. 17A-17C taken along line 160-160 of FIG. 14.

FIG. 18 illustrates a cross section of the interferometric modulator 1700 of FIG. 17C taken along the line 160-160 in FIG. 14B. The method of forming the structure 1700 of FIG. 18 will be appreciated by those of skill in the art from the disclosure of FIGS. 17A-17C and FIGS. 16A-16H. As with FIG. 16H, the flexible dielectric layer 1730 is not shown to be directly contacting the optical stack 16 in a cross-sectional view of FIG. 18 because, as illustrated in FIG. 14B, the flexible dielectric layer 1730 instead contacts the optical stack 16 in the corners of the MEMS device 1700 along the line 150-150. However, in different embodiments, the flexible dielectric layer 1730 contacts the optical stack 16 on two sides of the reflective element 1524, on a plurality of sides of the reflective element 1524, or on all sides of the reflective element 1524. Moreover, the patterning concerns described with respect to FIGS. 16A-16H in some embodiments also apply to the processes used to form the MEMS device 1700 illustrated in FIG. 18 (e.g., the dimensions of the mask layer 1522, the etching of the second reflective layer 1512 and the conductive layer 1520, etc.).

Figure 19:
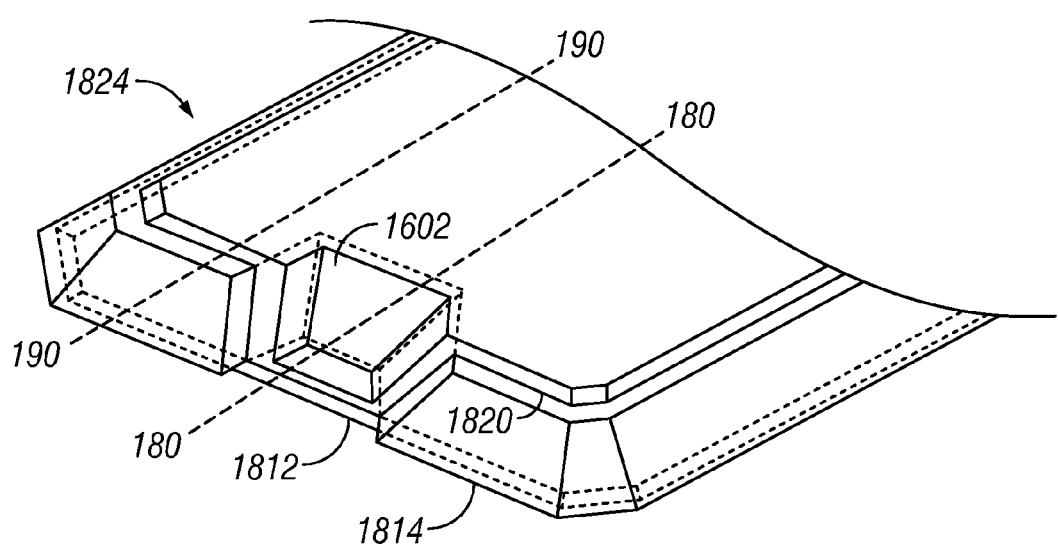
FIG. 19 is a perspective view of a portion of an example embodiment of a reflective element of an interferometric modulator.

FIG. 19 illustrates a perspective view of a portion of an example reflective element 1824 compatible with methods of manufacture described herein (e.g., as illustrated in FIGS. 15A-16K and FIGS. 20A-21I). The conductive layer 1820 above the dielectric body portion 1514 may apply a substantially similar force (e.g., due to different internal stresses or coefficients of thermal expansion) to the dielectric body portion 1814 as does the second reflective layer 1812. Thus, although a strip of conductive material through the notch 1602 in the dielectric body portion 1814 may be sufficient to create electrical communication between the conductive layer 1820 and the second reflective layer 1812, the conductive layer 1820 may cover a large portion of the dielectric body portion 1814 (e.g., most of the upper surface of the dielectric body portion 1814, as illustrated in FIG. 19).

Figure 20A:
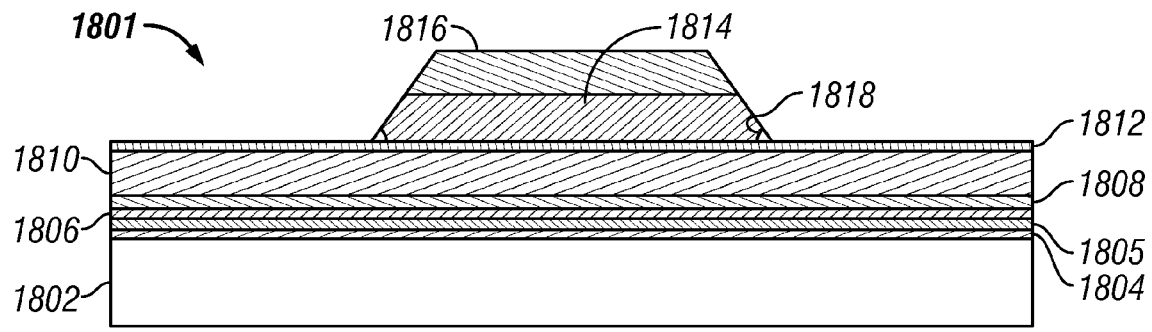
FIGS. 20A-20I are cross sections of an example embodiment of an interferometric modulator comprising the reflective element of FIG. 19 taken along line 180-180.
Figure 20B:
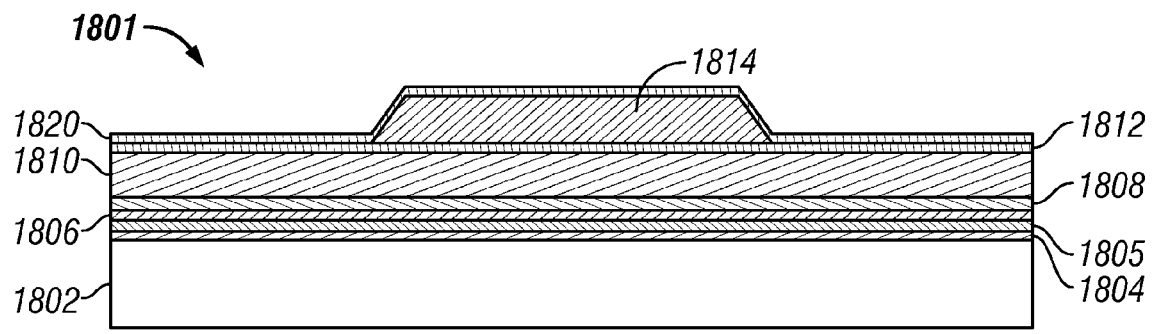
Figure 20C:
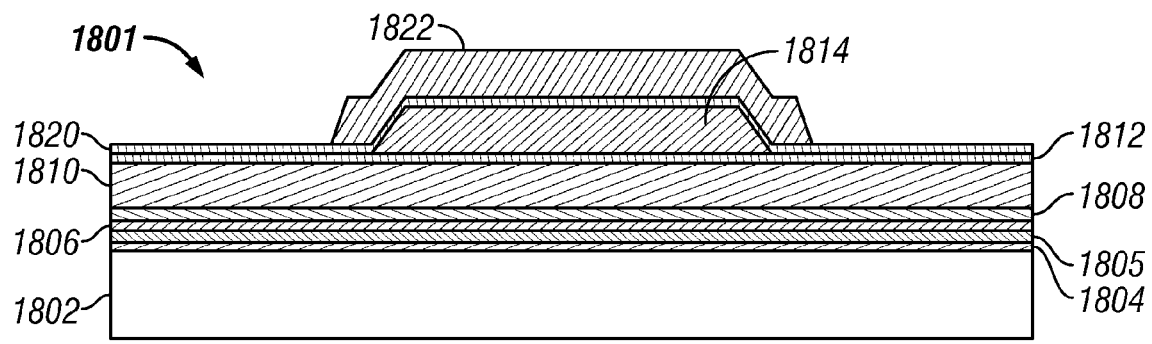
Figure 20D:
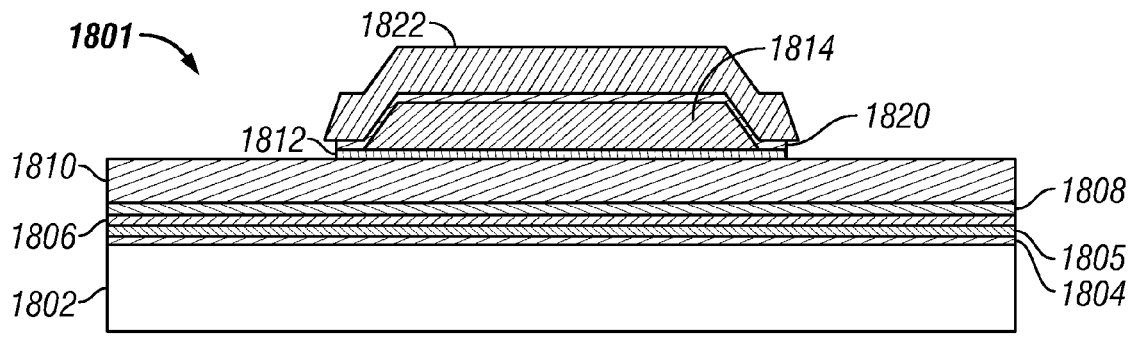
Figure 20E:
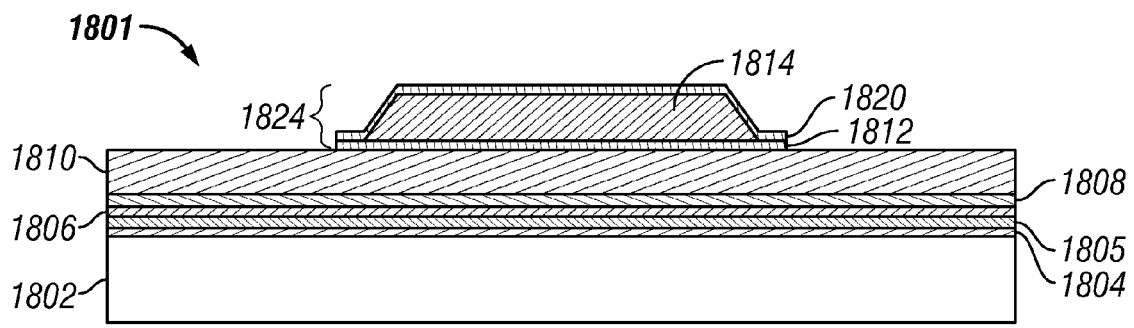
Figure 20F:
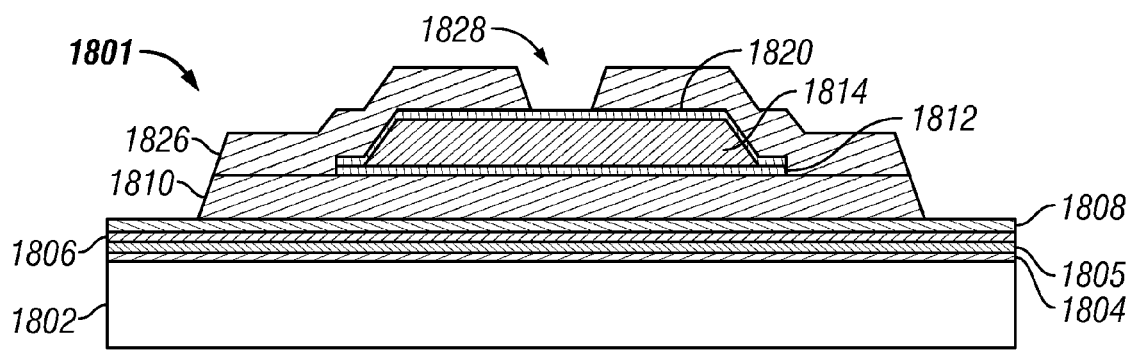
Figure 20G:
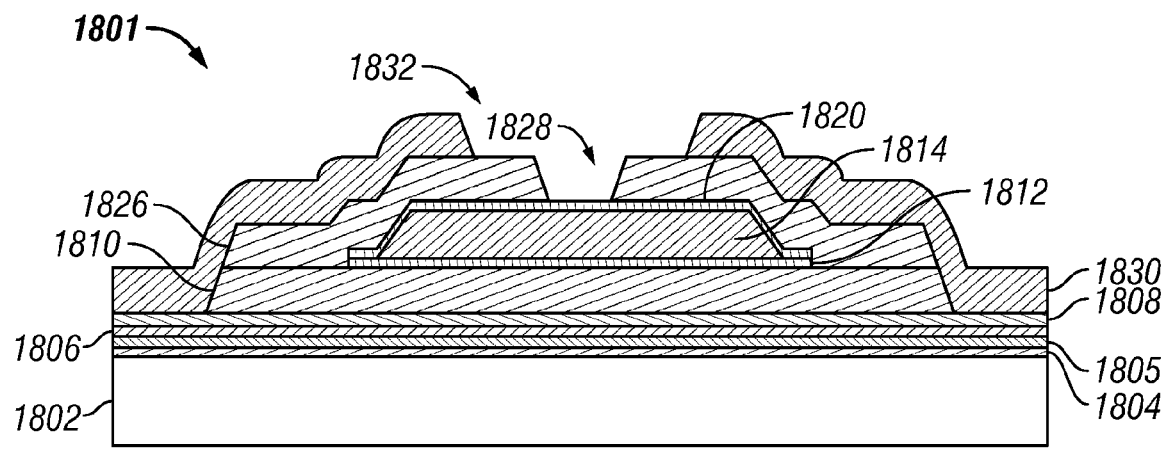
Figure 20H:
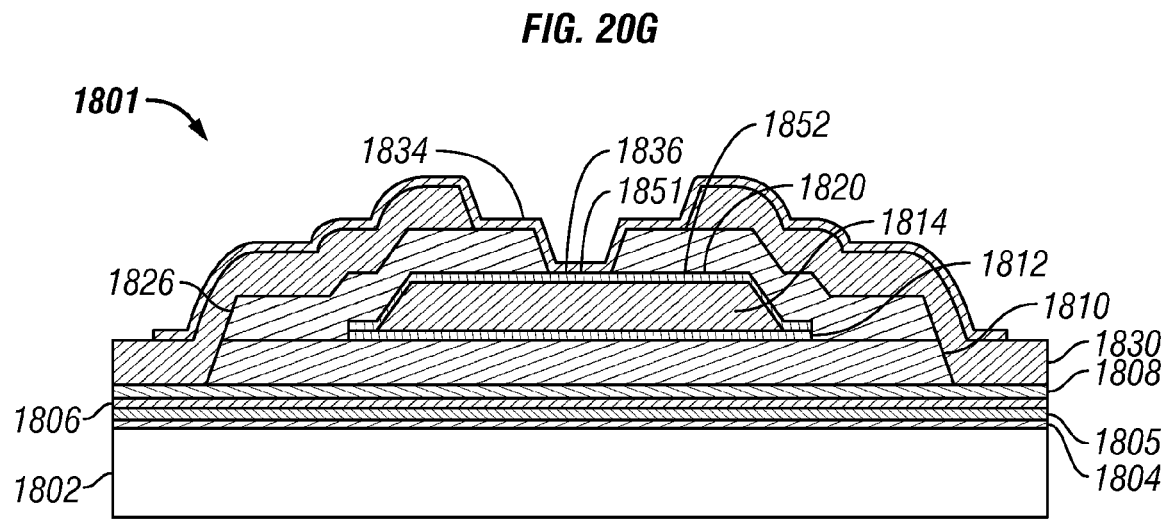
Figure 20I:
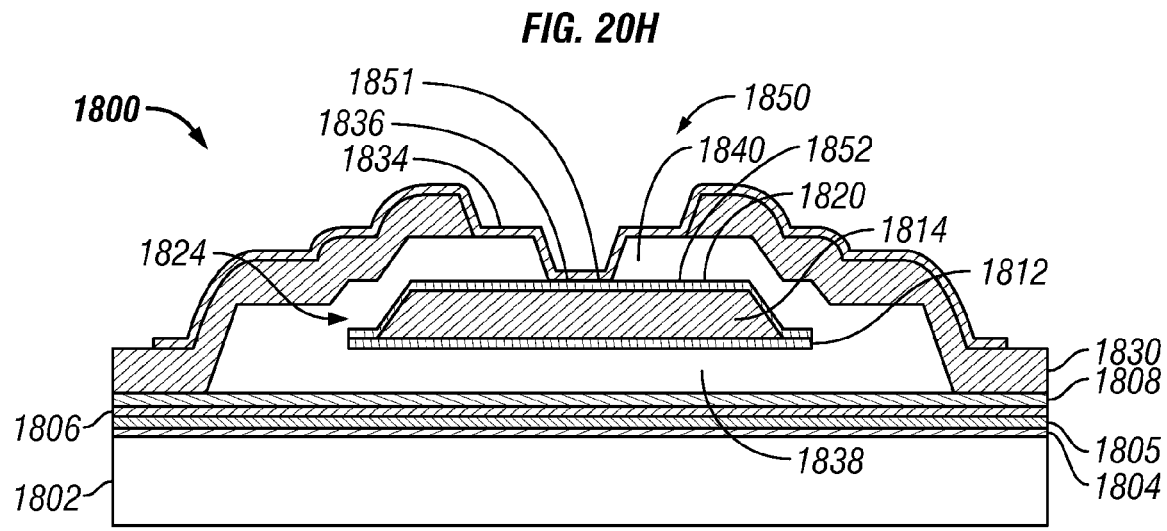
Figure 21A:
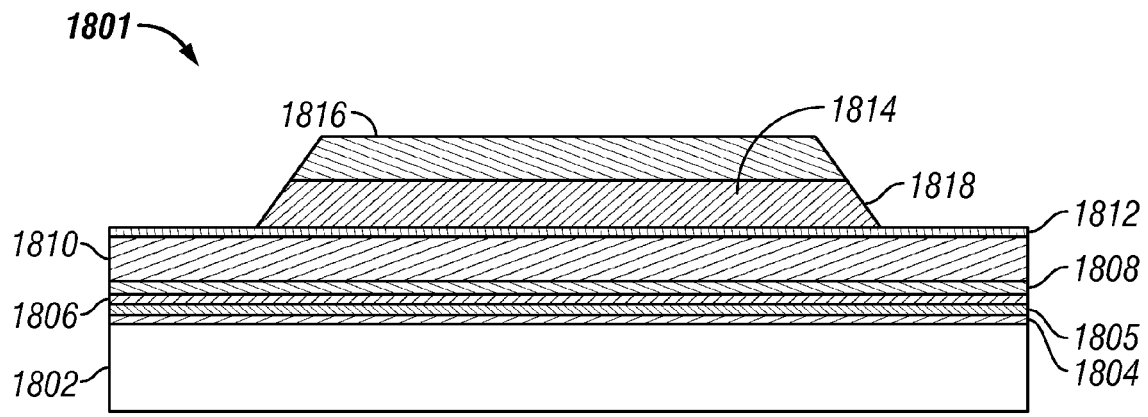
FIGS. 21A-21I are cross sections of an example embodiment of an interferometric modulator comprising the reflective element of FIG. 19 taken along line 190-190.
Figure 21B:
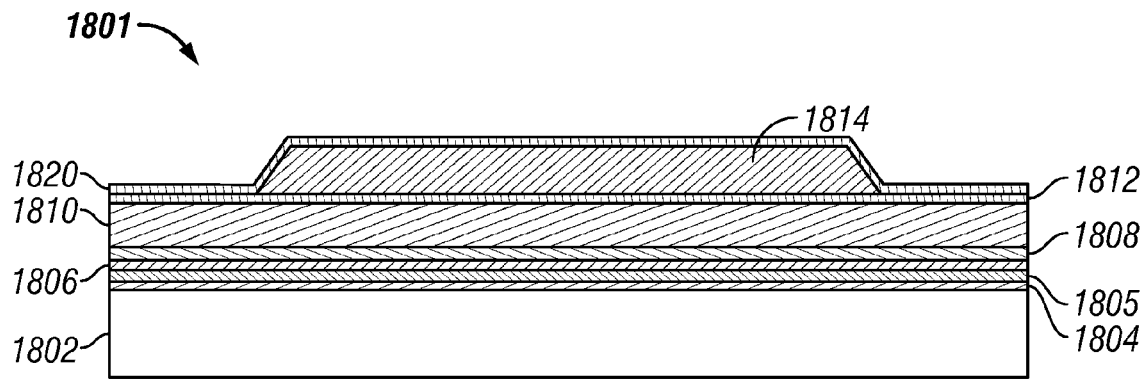
Figure 21C:
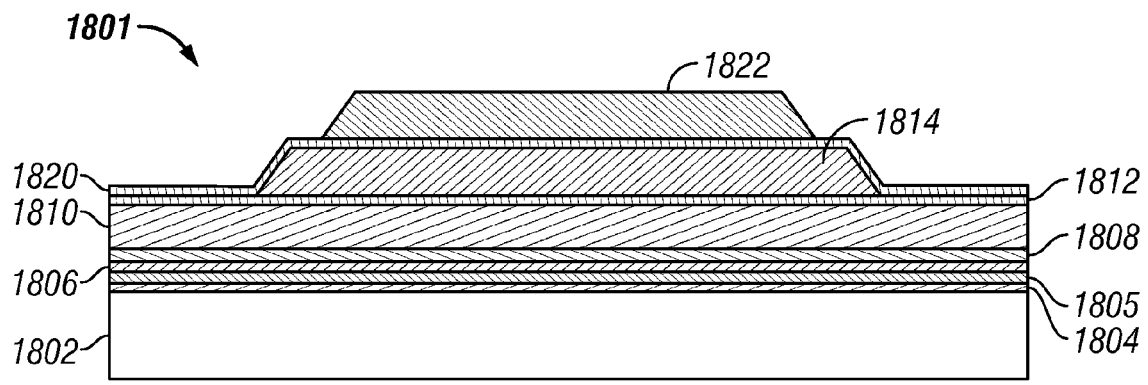
Figure 21D:
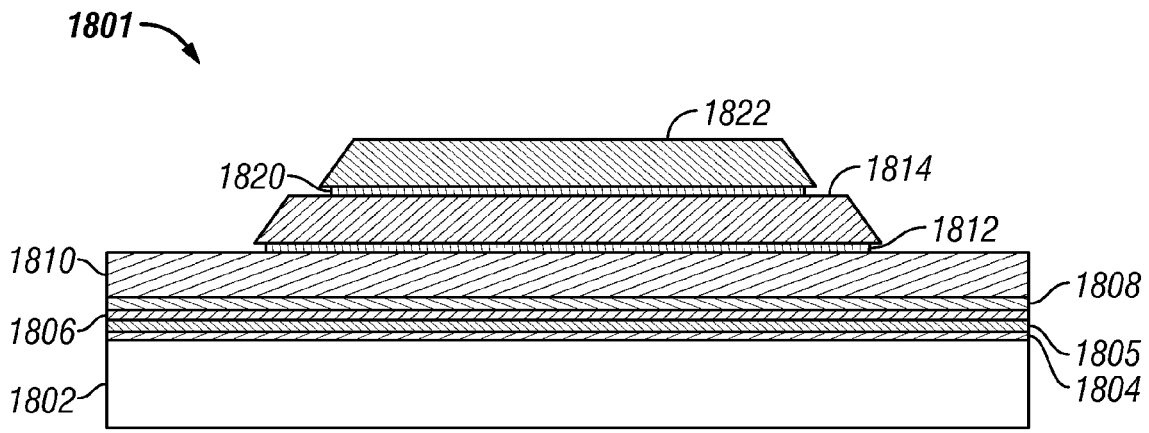
Figure 21E:
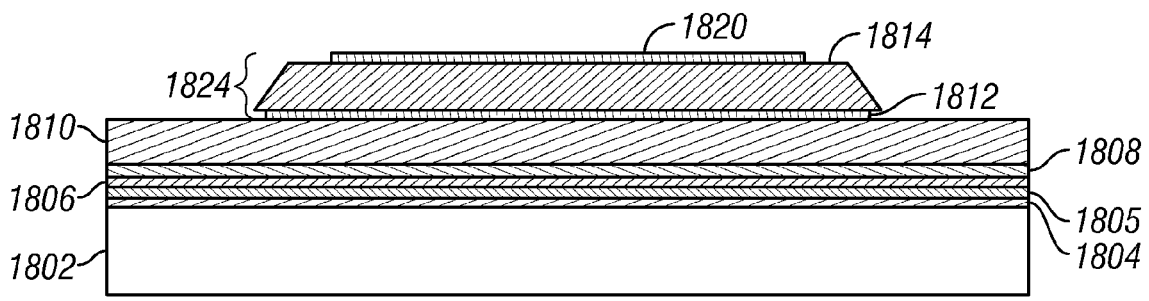
Figure 21F:
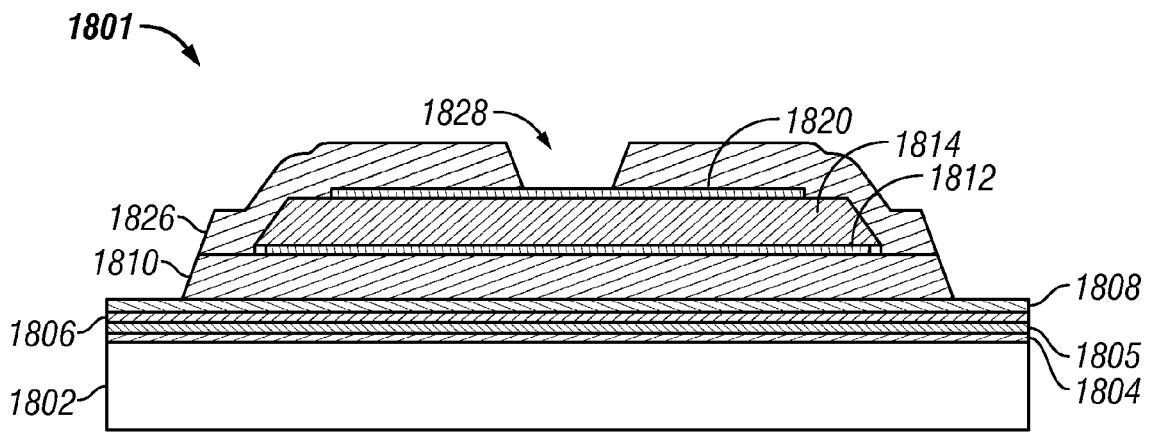
Figure 21G:
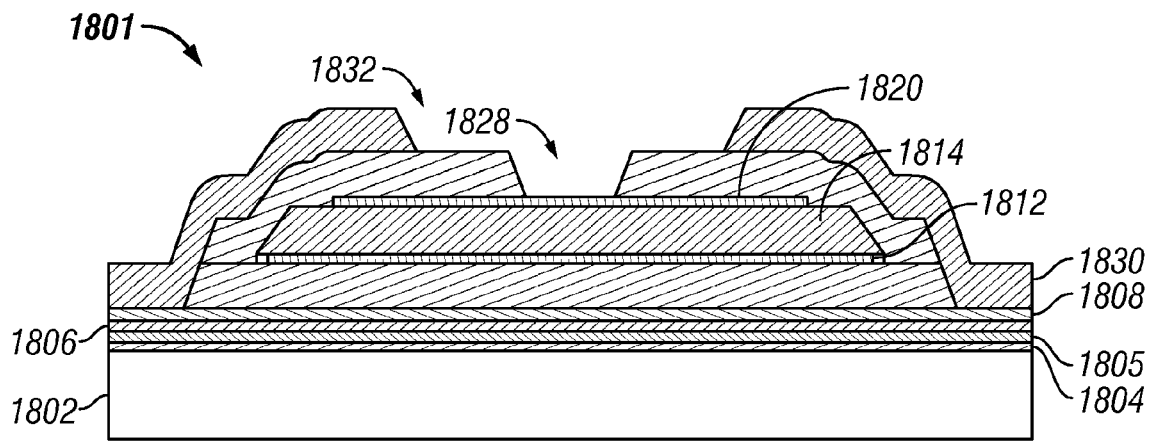
Figure 21H:
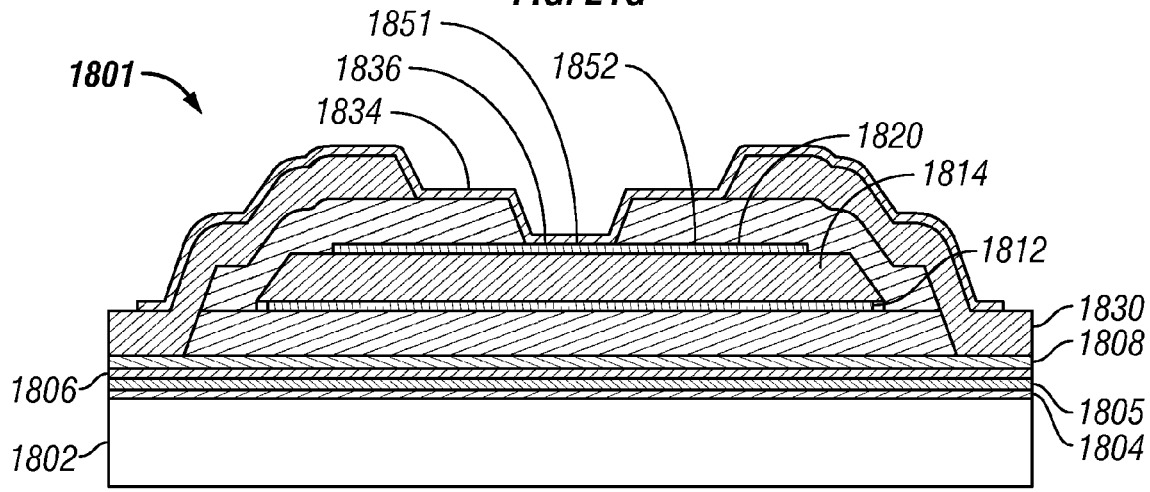
Figure 21I:
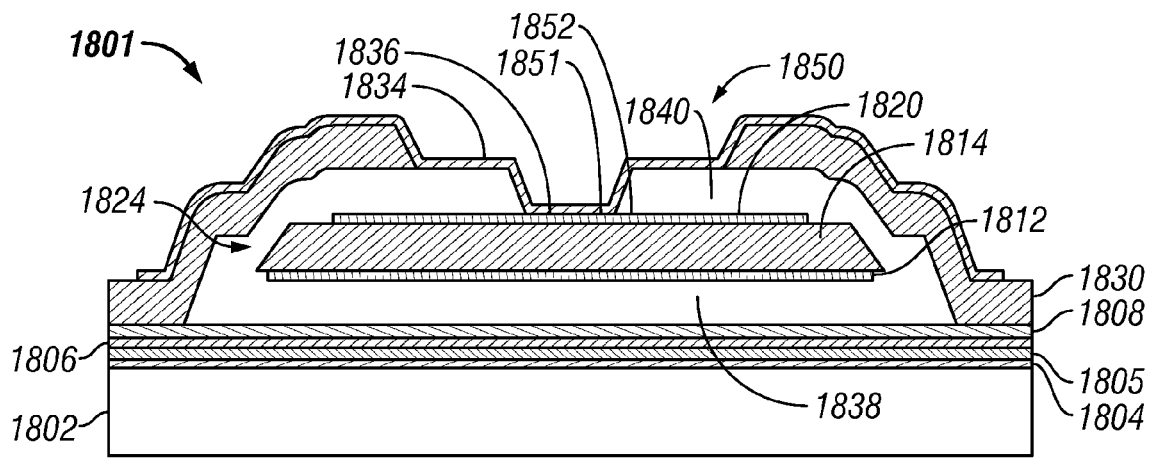

Interferometric modulators comprising deformable layers that do not comprise a flexible dielectric layer may also comprise a reflective element 1824, for example as illustrated in FIGS. 20I and 21I. FIGS. 20A-20I illustrate structures formed during an example fabrication method for a MEMS device 1800 comprising the reflective element 1824 of FIG. 19 taken along the line 180-180, and FIGS. 21A-21I illustrate structures formed during the example method of the MEMS device 1800 taken along the line 190-190. As depicted in FIGS. 20I and 21I, the resultant MEMS device 1800 comprises at least one electrode 1804, a first reflective layer 1805, and a movable functional element 1850 comprising a deformable layer 1834 and a reflective element 1824. The at least one electrode 1804 may comprise a transparent conductive material (e.g., ITO, IZO). The first reflective layer 1805 may comprise a partially reflective material (e.g., chromium). The deformable layer 1834 may comprise a deformable material (e.g., aluminum, nickel).

The reflective element 1824 comprises a second reflective layer 1812 (e.g., comprising aluminum), a dielectric body portion 1814 (e.g., comprising $SiO_2$), and a conductive layer 1820 (e.g., comprising aluminum). When the reflective element 1824 comprises a dielectric body portion 1814, it may be less likely to have curvature and/or tilt than a reflective element such as the reflective element 1812 described above when mechanically coupled to a deformable layer 1834 that comprises a different material than the bulk of the reflective element. For example, when a reflective element with the bulk being aluminum is mechanically coupled to a deformable layer comprising nickel, the nickel may exert stresses that cause curvature and/or tilt of the reflective element. However, when a reflective element 1824 comprising a dielectric body portion 1814 is mechanically coupled to a deformable layer 1834 comprising nickel, the effects of the stresses exerted by the nickel may cause less curvature and/or tilt of the reflective element 1824 due to the rigidity of the dielectric body portion 1814. This can be especially advantageous for large reflective elements, which may be more likely to have curvature and/or tilt. Additionally, the grain structure of dielectric materials such as $SiO_2$ is generally more stable than the grain structure of certain conductive materials such that the planarity of the reflective element 1824 may advantageously remain stable over long durations of operation. Furthermore, the second reflective layer 1812 and the conductive layer 1820 may be adjusted to compensate for stresses caused by mismatch in coefficients of thermal expansion.

The reflective element 1824 has a first portion 1851 mechanically coupled to the deformable layer 1834 and a second portion 1852 spaced from the deformable layer 1834 and defining a gap 1840 therebetween. The first portion 1851 of the reflective element 1824 that is mechanically coupled to the deformable layer 1834 is illustrated in FIG. 20I as a single central portion of the reflective element 1824, but the first portion 1851 may comprise a plurality of portions, portions along the edges of the reflective element 1824, etc. The deformable layer 1834 flexes in response to voltages applied to the at least one electrode 1804 to move the movable functional element 1850 in a direction generally perpendicular to the first reflective layer 1805.

The deformable layer 1834 comprises a layer of conductive material (e.g., nickel) and is supported by posts 1830 (e.g., comprising $SiO_2$). In certain embodiments, the posts 1830 are shaped differently, for example as shown in FIGS. 7C-7E, or comprise support structures disposed on top of the conductive layer 1834, as described above with respect to FIGS. 11A-11D and 12D. Other configurations are also possible.

FIGS. 20A and 21A illustrates a structure 1801 comprising a substrate 1802 (e.g., comprising glass, plastic), an electrode 1804 (e.g., comprising ITO), a first reflective layer 1805 (e.g., comprising chromium), an insulating layer 1806 (e.g., comprising $SiO_2$), an oxide layer 1808 (e.g., comprising $Al_2O_3$), a first sacrificial layer 1810 (e.g., comprising molybdenum), a second reflective layer 1812 (e.g., comprising between about 250 and 1,000 Å of aluminum), and a patterned dielectric body portion 1814 (e.g., comprising between about 2,000 Å and 2 µm of $SiO_2$, or between about 5,000 Å and 1 µm of $SiO_2$).

In certain other embodiments, the second reflective layer 1812 comprises any suitably reflective material, for example, but not limited to, metals including aluminum alloy, silver, silver alloy, and gold. There is a trade-off between maintaining the optical properties, such as reflection of the second reflective layer 1812, and minimizing the thickness of the second reflective layer 1812 in order to decrease effects of a mismatched coefficient of thermal expansion with respect to the dielectric body portion 1814. For example, when the reflective layer 1812 comprises aluminum, the optical properties of the reflective layer 1812 may begin to degrade at thicknesses under about 300 Å. About 100 Å of nickel between the second reflective layer 1812 and the dielectric body portion 1814 may be used to act as an etch stop layer (not shown). A mask 1816 (e.g., comprising photoresist) for patterning the dielectric body portion 1814 is formed over the dielectric body portion 1814.

In some embodiments, certain steps in the formation of the MEMS device 1800 are substantially similar to the steps described above in the formation of the MEMS device 1500, for example having similar attention to etch profiles, materials, thicknesses, etc. For example, FIGS. 20B-20F and 21B-21F depict formation of the reflective element 1824 and patterning of the first and second sacrificial layers 1810, 1826, which are similar to the formation of the reflective element 1524 and patterning of the first and second sacrificial layers 1510, 1526 depicted in FIGS. 16B-16G and 15B-15G, respectively, and described above, although the method illustrated in FIGS. 20A-20I and 21A-21I does not depict steps for the formation of signal routing structures. For example, although FIGS. 20F and 21F illustrates that an aperture 1828 is formed during patterning of the second sacrificial layer 1826, a step for formation of a routing structure (e.g., similar to the routing structure 1541) may be inserted between FIGS. 20E and 20F and between FIGS. 21E and 21F.

Referring now to FIGS. 20G and 21G, posts 1830 (e.g., comprising $SiO_2$) to support the deformable layer 1834 are formed over the second sacrificial layer 1826. In some embodiments, the posts 1830 are formed using processes similar to the processes used to form the flexible dielectric layer 1530 (e.g., $SiO_2$ deposition and dry etch using $CF_4$ plus $O_2$ or $CHE_3$ plus $O_2$), except resulting in a structure that is rigid rather than flexible. For example, the flexible dielectric layer 1530 may comprise between about 500 Å and 2 µm of $SiO_2$ such that it can be flexible, while the posts 1830 may comprise between about 3,500 Å and 2 µm of $SiO_2$, or greater than about 7,500 Å of $SiO_2$, such that the posts 1830 are substantially rigid. Other materials (e.g., $AlO_x$, $Sin_x$, $SiO_xN_y$, composites) and thicknesses are also possible for the flexible dielectric layer 1530. Thickness is one parameter that determines the rigidity of a particular dielectric layer, as are the lateral dimensions of the dielectric layer. The aperture 1832 between the posts 1830 illustrated in FIGS. 20G and 21G may be wide enough that the reflective element 1824 is exposed (e.g., through the aperture 1828 in the second sacrificial layer 1826) and may be wide enough that a subsequently deposited deformable layer 1834 has a portion that is not mechanically coupled to the posts 1830 or to the reflective element 1824.

FIGS. 20H and 21H illustrate the structure 1801 after a deformable layer 1834 has been formed over the posts 1830 and the second sacrificial layer 1826. The deformable layer 1834 may comprise between about 1,000 and 5,000 Å of nickel or about 3,300 Å of nickel. In embodiments in which the deformable layer 1834 comprises nickel, it can be patterned with a wet etch comprising $HNO_3$. The deformable layer 1834 is mechanically coupled to the reflective element 1824 at the interface 1836. Electrical communication may be provided between the deformable layer 1834 and the second reflective layer 1812 via the communication path disposed within the edge notches 1602, as described above, or via other communication paths such as those described below.

FIGS. 20I and 21I illustrate the MEMS device 1800 after the first sacrificial layer 1810 and the second sacrificial layer 1826 have been removed (e.g., by etching with $XeF_2$ in embodiments in which the first and second sacrificial layers 1810, 1826 comprise molybdenum). The reflective element 1824 is spaced from the oxide layer 1808 by a cavity 1838 where the first sacrificial layer 1810 used to reside, and the second portion 1852 of the reflective element 1824 is spaced from the flexible dielectric layer 1830 by a gap 1840 where the second sacrificial layer 1826 used to reside.

Figure 22A:
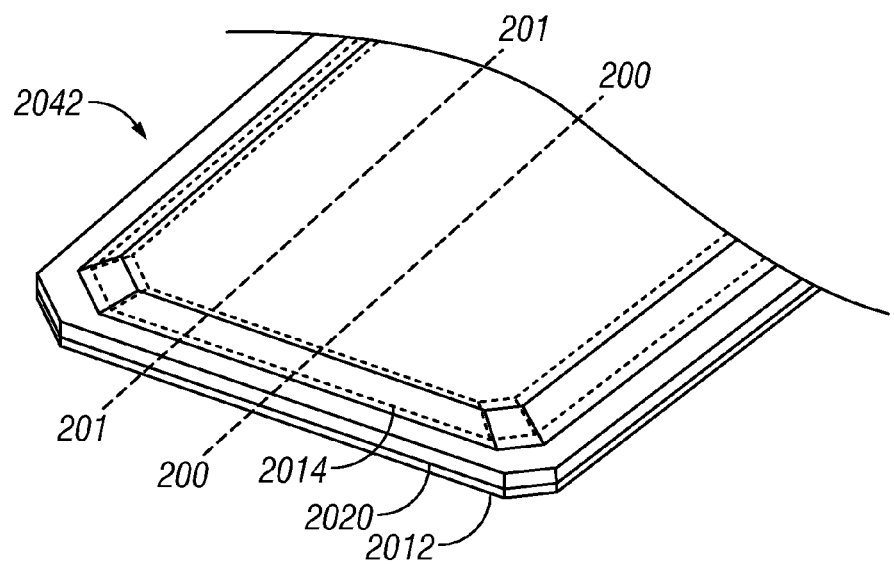
FIG. 22A is a perspective view of a portion of another example embodiment of a reflective element of an interferometric modulator.

FIG. 22A illustrates a perspective view of a portion of an example embodiment of a reflective element 2042 in which the dielectric body portion 2014 does not comprise edge notches. Instead, the conductive layer 2020 overlaps the entire lateral edge of the dielectric body portion 2014. In certain alternative embodiments, the conductive layer 2020 overlaps one or a plurality of lateral edges of the dielectric body portion 2014 rather than, for example, the entire lateral edge of the dielectric body portion 2014.

Figure 22B:
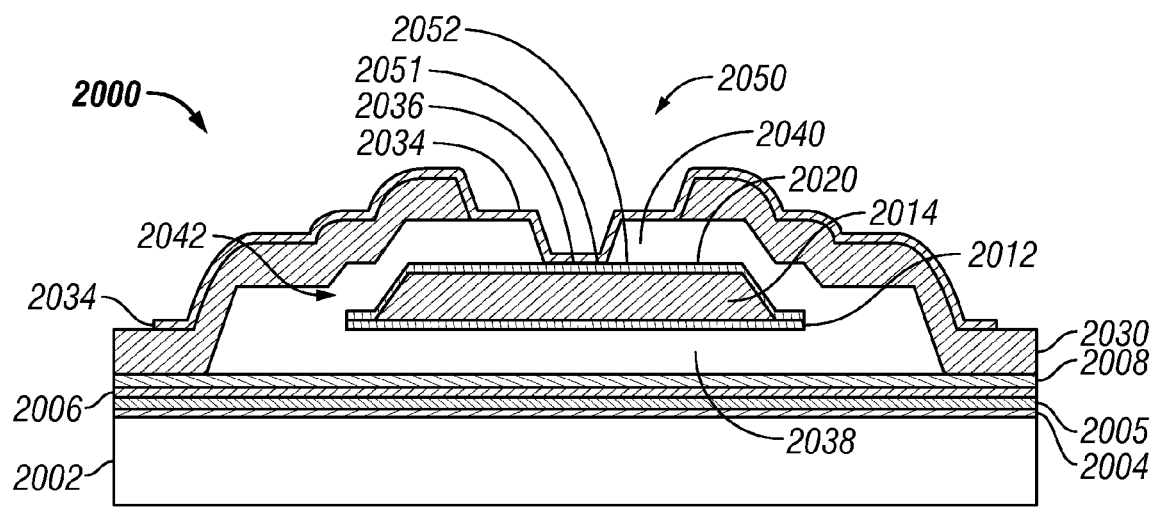
FIG. 22B is a cross sectional view of an interferometric modulator comprising the reflective element of FIG. 22A taken along line 200-200.

FIG. 22B is a cross section of an example embodiment of an interferometric modulator 2000 comprising the reflective element 2042 of FIG. 22A illustrated along the line 200-200 of FIG. 22A. The reflective element 2042 has a first portion 2051 mechanically coupled to the deformable layer 2034 and a second portion 2052 spaced from the deformable layer 2034 and defining a gap 2040 therebetween. Although the reflective element 2042 appears to be substantially similar to the reflective element 1824 of FIG. 20I, a cross section of the reflective element 2042 along the line 201-201 of FIG. 22A is substantially similar to a cross section of the reflective element 2042 along the line 200-200 of FIG. 22A (i.e., as opposed to looking substantially similar to the reflective element 1824 of FIG. 21I). Such an embodiment advantageously decreases the chance that a lack of overlap of the mask layer over the conductive layer 2020 would result in a lack of electrical connection between the second reflective layer 2012 and the conductive layer 2020 (e.g., because at least one edge is likely to have sufficient overlap). Disadvantages to such an embodiment are that the edge fraying concerns are present across the entire surface of the reflective element 2042 and that the reflective element 2042 is typically small to allow enough room for the edge contact, thereby reducing fill factor. The reflective element 2042 of FIG. 22A may also be used in interferometric modulators comprising a flexible dielectric layer.

Figure 23A:
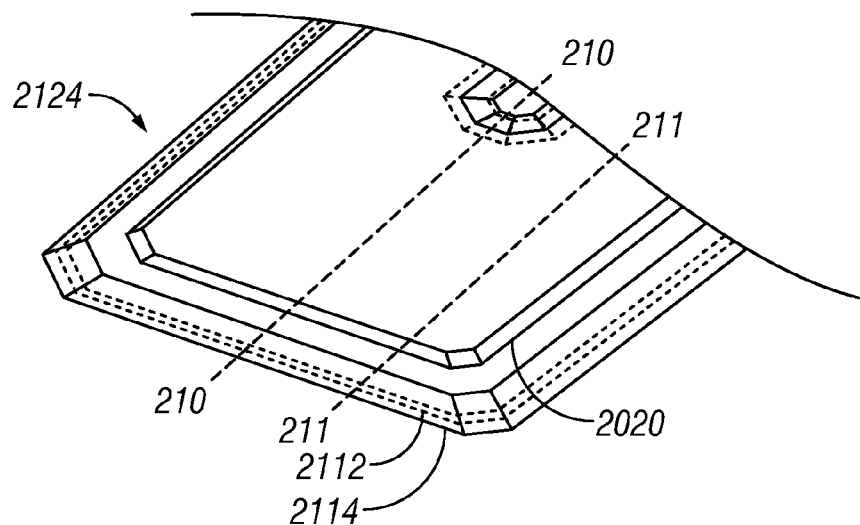
FIG. 23A is a perspective view of a portion of yet another example embodiment of a reflective element of an interferometric modulator.

FIG. 23A illustrates a perspective view of a portion of another example embodiment of a reflective element 2124 in which the dielectric body portion 2114 does not comprise edge notches. Instead, the communication path to electrically connect the second reflective layer 2112 to a conductive layer 2134 over the flexible dielectric layer 2130 is in a middle portion of the reflective element 2124 spaced away from the lateral edges of the reflective element 2124. In certain alternative embodiments, the conductive layer 2134 is connected to the second reflective layer 2112 through a plurality of portions of the reflective element 2124.

Figure 23B:
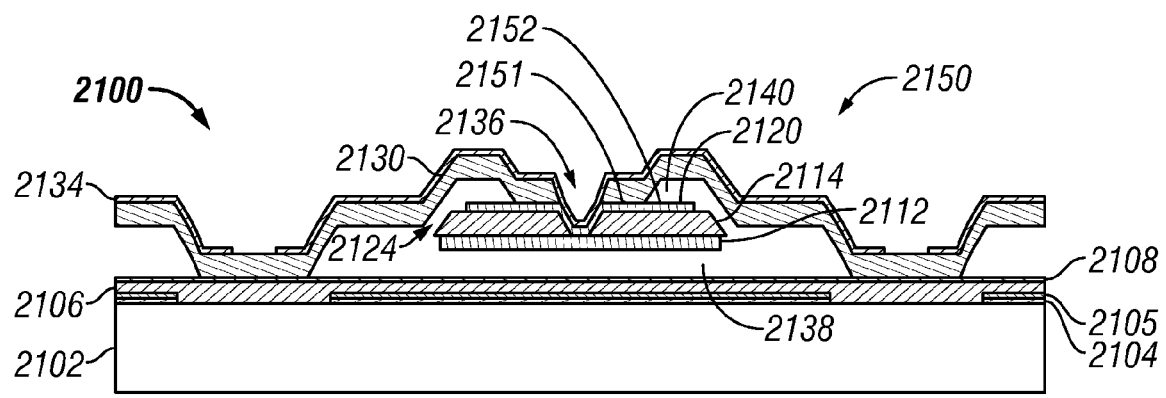
FIG. 23B is a cross sectional view of an interferometric modulator comprising the reflective element of FIG. 23A taken along line 210-210.

FIG. 23B is a cross section of an example embodiment of an interferometric modulator 2100 comprising the reflective element 2124 of FIG. 23A illustrated along the line 210-210 of FIG. 23A. The reflective element 2124 has a first portion 2151 mechanically coupled to the deformable layer 2134 and a second portion 2152 spaced from the deformable layer 2134 and defining a gap 2140 therebetween. The conductive layer 2134 is electrically connected to the second reflective layer 2112 through a communication path including an aperture in the dielectric body portion 2114 (e.g., via the conductive layer 2020). A cross section of the reflective element 2124 along the line 211-211 of FIG. 23A is substantially similar to a cross section of the reflective element 1524 illustrated in FIG. 15H. Such an embodiment advantageously decreases the chances of edge discoloration due to fraying. A disadvantage to such an embodiment is that the considerations of taper angle described above with respect to the dielectric body portion 1514 also apply to the aperture of the reflective element 2124.

In certain alternative embodiments, the reflective element 2124 does not comprise the conductive layer 2120, but the conductive layer 2130 is directly electrically connected to the second reflective layer 2112 through a communication path including an aperture in the dielectric body portion 2114. In certain such embodiments, a flexible dielectric layer 2130 may be connected (e.g., fused) to the dielectric body portion 2114, and the aperture through the dielectric body portion 2114 may be patterned at the same time as the flexible dielectric layer 2134.

The reflective element 2124 may also be used in interferometric modulators comprising a conductive deformable layer (e.g., by connecting the deformable layer to the second reflective layer 2112 through an aperture in the dielectric body portion 2114).

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by the claims that follow.

What is claimed is:

1. An electromechanical device comprising:
   at least one electrode;
   a first reflective layer; and
   a movable reflective element comprising:
     a flexible dielectric layer that flexes in response to voltages applied to the at least one electrode to move the reflective element in a direction generally perpendicular to the first reflective layer; and
     a second reflective layer mechanically coupled to the flexible dielectric layer, wherein the flexible dielectric layer comprises one or more apertures configured to allow routing of electrical signals to the second reflective layer through the flexible dielectric layer.

2. The device of claim 1, wherein the second reflective layer is not spaced from the flexible dielectric layer.

3. The device of claim 1, wherein the flexible dielectric layer comprises $SiO_2$.

4. The device of claim 1, further comprising an insulating layer between the first reflective layer and the second reflective layer.

5. The device of claim 4, wherein the second reflective layer contacts the insulating layer when the reflective element is in a first position relative to the first reflective layer and wherein the second reflective layer does not contact the insulating layer when the reflective element is in a second position relative to the first reflective layer.

6. The device of claim 4, wherein a first portion and a second portion of the second reflective layer contact the insulating layer when the reflective element is in a first position relative to the first reflective layer, wherein the first portion does not contact the insulating layer when the reflective element is in a second position relative to the first reflective layer, and wherein the second portion contacts the insulating layer when the reflective element is in the second position.

7. The device of claim 1, further comprising a plurality of supports mechanically coupling the first reflective layer and the reflective element.

8. The device of claim 7, further comprising a plurality of support structures on a side of the plurality of supports opposite the first reflective layer.

9. The device of claim 8, wherein the plurality of support structures comprises a conductive material.

10. The device of claim 8, wherein the plurality of support structures comprises a conductive material on the plurality of supports and a rigid dielectric material on the conductive material.

11. The device of claim 1, further comprising:
a display;
a processor that is configured to communicate with said display, said processor being configured to process image data; and
a memory device that is configured to communicate with said processor.

12. The device of claim 11, further comprising a driver circuit configured to send at least one signal to the display.

13. The device of claim 12, further comprising a controller configured to send at least a portion of the image data to the driver circuit.

14. The device of claim 11, further comprising an image source module configured to send said image data to said processor.

15. The device of claim 14, wherein the image source module comprises at least one of a receiver, transceiver, and transmitter.

16. The device of claim 11, further comprising an input device configured to receive input data and to communicate said input data to said processor.

17. An electromechanical device comprising:
first means for reflecting;
means for moving a portion of the device, the moving means comprising:
second means for reflecting; and
means for supporting the second reflecting means, the supporting means mechanically coupled to the second reflecting means, the supporting means having a flexible dielectric portion; and
means for actuating the moving means to move the second reflecting means in a direction generally perpendicular to the first reflecting means, wherein the supporting means comprises one or more apertures configured to allow routing of electrical signals to the second reflecting means through the supporting means.

18. The device of claim 17, wherein the first reflecting means comprises a first reflective layer.

19. The device of claim 17, wherein the moving means comprises a movable reflective element.

20. The device of claim 17, wherein the second reflecting means comprises a second reflective layer.

21. The device of claim 17, wherein the supporting means comprises a flexible dielectric layer.

22. The device of claim 17, wherein the actuating means comprises at least one electrode.

23. An electromechanical device comprising:
a substrate;
at least one electrode disposed on the substrate;
a first reflective layer disposed on the at least one electrode;
a movable reflective element comprising:
a dielectric layer having a coefficient of thermal expansion, a portion of the dielectric layer configured to flex in response to voltages applied to the at least one electrode to move the reflective element in a direction generally perpendicular to the first reflective layer; and
a second reflective layer mechanically coupled to the dielectric layer;
a plurality of support posts mechanically coupling the first reflective layer and the reflective element, wherein each of the plurality of support posts comprises a portion of the dielectric layer, and wherein the plurality of support posts and the dielectric layer have substantially similar coefficients of thermal expansion; and
an insulating layer disposed between the first reflective layer and the second reflective layer, the insulating layer between adjacent support posts of the plurality of support posts, wherein a first portion of the second reflective layer contacts the insulating layer when the reflective element is in a first position relative to the first reflective layer and contacts the insulating layer when the reflective element is in a second position relative to the first reflective layer, and wherein a second portion of the second reflective layer contacts the insulating layer when the reflective element is in a first position relative to the first reflective layer and does not contact the insulating layer when the reflective element is in a second position relative to the first reflective layer.

24. The device of claim 23, wherein the second reflective layer is coupled to the flexible dielectric layer such that there is no space therebetween.

25. The device of claim 23, wherein the flexible dielectric layer comprises $SiO_2$.

26. The device of claim 23, further comprising a plurality of support structures on a side of the plurality of supports opposite the first reflective layer.

27. The device of claim 26, wherein the plurality of support structures further comprises a conductive material.

28. The device of claim 26, wherein the plurality of support structures comprises a conductive material on the plurality of supports and a rigid dielectric material on the conductive material.

* * * * *

UNITED STATES PATENT AND TRADEMARK OFFICE
CERTIFICATE OF CORRECTION

PATENT NO.       : 7,715,085 B2                                         Page 1 of 1
APPLICATION NO.  : 11/746513
DATED            : May 11, 2010
INVENTOR(S)      : Teruo Sasagawa It is certified that error appears in the above-identified patent and that said Letters Patent is hereby corrected as shown below:

On the Title Page at Item (56), Page 1, Column 2, Line 17, under Other Publications, change "Liquivista" to --Liquavista--.

On the Title Page at Item (56), Page 2, Column 2, Line 44, under U.S. Patent Documents, change "Pichi et al." to --Pichl et al.--.

At Column 3, Line 26, change "160- 160" to --160-160--.

At Column 7, Line 60, change "thereof" to --thereof.--.

At Column 12, Line 41, change "$SiO_xN$)." to --$SiON$).--.

At Column 23, Line 37, change "triflouride" to --trifluoride--.

At Column 23, Line 37, change "($CHE_3$)" to --($CHF_3$)--.

At Column 25, Line 21, change "1SE)." to --15E).--.

At Column 32, Line 38, change "$CHE_3$" to --$CHF_3$--.

At Column 32, Line 44, change "$Sin_x$," to --$SiN_x$,--.

At Column 34, Line 28, change "thereof" to --thereof.--.

At Column 36, Line 40, in Claim 23, change "clement" to --element--.

Signed and Sealed this

Twenty-sixth Day of October, 2010

David J. Kappos
*Director of the United States Patent and Trademark Office*